US011275710B2

(12) United States Patent
Brewer

(10) Patent No.: US 11,275,710 B2
(45) Date of Patent: *Mar. 15, 2022

(54) LOOP THREAD ORDER EXECUTION CONTROL OF A MULTI-THREADED, SELF-SCHEDULING RECONFIGURABLE COMPUTING FABRIC

(71) Applicant: Micron Technology, Inc., Boise, ID (US)

(72) Inventor: Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 19 days.

This patent is subject to a terminal disclaimer.

(21) Appl. No.: 16/371,056

(22) Filed: Mar. 31, 2019

(65) Prior Publication Data

US 2019/0303346 A1 Oct. 3, 2019

Related U.S. Application Data

(60) Provisional application No. 62/651,137, filed on Mar. 31, 2018.

(51) Int. Cl.
*G06F 15/00* (2006.01)
*G06F 15/78* (2006.01)
(Continued)

(52) U.S. Cl.
CPC ........ *G06F 15/7867* (2013.01); *G06F 9/4806* (2013.01); *H03K 19/20* (2013.01)

(58) Field of Classification Search
None
See application file for complete search history.

(56) References Cited

U.S. PATENT DOCUMENTS 4,943,908 A * 7/1990 Emma .................. G06F 9/3806
712/207
5,442,797 A 8/1995 Casavant et al.
(Continued)

FOREIGN PATENT DOCUMENTS

EP 2441013 B1 8/2014
GB WO2010142987 A1 12/2010

OTHER PUBLICATIONS

Xuejun, Yang et al., Processor self-scheduling for parallel loops in preemptive environments, Future Generation Computer Systems 6 (1990) pp. 97-103.

(Continued)

*Primary Examiner* — Corey S Faherty
(74) *Attorney, Agent, or Firm* — Nancy R. Gamburd; Gamburd Law Group LLC

(57) ABSTRACT

Representative apparatus, method, and system embodiments are disclosed for configurable computing. A representative system includes an interconnection network; a processor; and a plurality of configurable circuit clusters. Each configurable circuit cluster includes a plurality of configurable circuits arranged in an array; a synchronous network coupled to each configurable circuit of the array; and an asynchronous packet network coupled to each configurable circuit of the array. A representative configurable circuit includes a configurable computation circuit and a configuration memory having a first, instruction memory storing a plurality of data path configuration instructions to configure a data path of the configurable computation circuit; and a second, instruction and instruction index memory storing a plurality of spoke instructions and data path configuration instruction indices for selection of a master synchronous input, a current data path configuration instruction, and a (Continued)

next data path configuration instruction for a next configurable computation circuit.

18 Claims, 28 Drawing Sheets

(51) Int. Cl.
    *G06F 9/48*     (2006.01)
    *H03K 19/20*     (2006.01)

(56) References Cited

U.S. PATENT DOCUMENTS

| | | | |
|---|---|---|---|
| 5,892,962 A | 4/1999 | Cloutier | |
| 6,108,346 A * | 8/2000 | Doucette | H04L 12/433 370/353 |
| 6,918,010 B1 * | 7/2005 | Yeager | G06F 9/325 711/137 |
| 7,171,544 B2 * | 1/2007 | Bera | G06F 8/452 712/216 |
| 7,263,602 B2 | 8/2007 | Schmit | |
| 7,635,987 B1 | 12/2009 | Agarwal | |
| 7,987,338 B2 | 7/2011 | Doerr et al. | |
| 8,291,197 B2 * | 10/2012 | Wu | G06F 9/30043 712/216 |
| 8,390,325 B2 | 3/2013 | Box et al. | |
| 8,726,251 B2 * | 5/2014 | Kalogeropulos | G06F 8/452 717/140 |
| 2002/0156998 A1 | 10/2002 | Casselman | |
| 2006/0136930 A1 | 6/2006 | Kaler et al. | |
| 2007/0169061 A1 * | 7/2007 | Bera | G06F 8/452 717/160 |
| 2009/0138661 A1 * | 5/2009 | Lauterbach | G06F 9/3891 711/137 |
| 2009/0193239 A1 | 7/2009 | Hanai et al. | |
| 2010/0268862 A1 | 10/2010 | Park et al. | |
| 2013/0138913 A1 | 5/2013 | Box et al. | |
| 2015/0317190 A1 | 11/2015 | Ebcioglu et al. | |
| 2017/0123795 A1 | 5/2017 | Chen et al. | |
| 2017/0161214 A1 | 6/2017 | Dobbs et al. | |
| 2018/0089140 A1 | 3/2018 | Metzgen | |

OTHER PUBLICATIONS

Notification Concerning Informal Communications with the Applicant, from the International Preliminary Examining Authority for International Application No. PCT/US2019/025076, dated Jul. 7, 2020, pp. 1-4.
Notification Concerning Informal Communications with the Applicant, from the International Preliminary Examining Authority for International Application No. PCT/US2019/025077, dated Jul. 7, 2020, pp. 1-4.
Notification Concerning Informal Communications with the Applicant, from the International Preliminary Examining Authority for International Application No. PCT/US2019/025078, dated Jul. 7, 2020, pp. 1-4.
Notification Concerning Informal Communications with the Applicant, from the International Preliminary Examining Authority for International Application No. PCT/US2019/025081, dated Jul. 7, 2020, pp. 1-4.
Notification of Transmittal of the International Preliminary Report on Patentability from the International Preliminary Examining Authority for International Application No. PCT/US2019/025074, dated Aug. 4, 2020, pp. 1-19.
Written Opinion of the International Preliminary Examining Authority, for International Application No. PCT/US2019/025074, dated Feb. 19, 2020, pp. 1-15.
Notification of Transmittal of the International Search Report and Written Opinion of the International Searching Authority, or the Declaration for International Application No. PCT/US2019/025074, dated Jul. 1, 2019, pp. 1-21.
Notification of Transmittal of the International Preliminary Report on Patentability from the International Preliminary Examining Authority for International Application No. PCT/US2019/025075, dated Aug. 4, 2020, pp. 1-20.
Written Opinion of the International Preliminary Examining Authority, for International Application No. PCT/US2019/025075, dated Feb. 19, 2020, pp. 1-13.
Notification of Transmittal of the International Search Report and Written Opinion of the International Searching Authority, or the Declaration for International Application No. PCT/US2019/025075, dated Jul. 1, 2019, pp. 1-18.
Notification of Transmittal of the International Preliminary Report on Patentability from the International Preliminary Examining Authority for International Application No. PCT/US2019/025076, dated Jul. 15, 2020, pp. 1-14.
Written Opinion of the International Preliminary Examining Authority, for International Application No. PCT/US2019/025076, dated Mar. 4, 2020, pp. 1-21.
Notification of Transmittal of the International Search Report and Written Opinion of the International Searching Authority, or the Declaration for International Application No. PCT/US2019/025076, dated Jul. 3, 2019, pp. 1-19.
Notification of Transmittal of the International Preliminary Report on Patentability from the International Preliminary Examining Authority for International Application No. PCT/US2019/025077, dated Jul. 15, 2020, pp. 1-21.
Written Opinion of the International Preliminary Examining Authority, for International Application No. PCT/US2019/025077, dated Mar. 4, 2020, pp. 1-22.
Notification of Transmittal of the International Search Report and Written Opinion of the International Searching Authority, or the Declaration for International Application No. PCT/US2019/025077, dated Jul. 3, 2019, pp. 1-22.
Notification of Transmittal of the International Preliminary Report on Patentability from the International Preliminary Examining Authority for International Application No. PCT/US2019/025078, dated Jul. 15, 2020, pp. 1-21.
Written Opinion of the International Preliminary Examining Authority, for International Application No. PCT/US2019/025078, dated Mar. 4, 2020, pp. 1-18.
Notification of Transmittal of the International Search Report and Written Opinion of the International Searching Authority, or the Declaration for International Application No. PCT/US2019/025078, dated Jul. 3, 2019, pp. 1-22.
Notification of Transmittal of the International Preliminary Report on Patentability from the International Preliminary Examining Authority for International Application No. PCT/US2019/025079, dated Jul. 10, 2020, pp. 1-8.
Written Opinion of the International Preliminary Examining Authority, for International Application No. PCT/US2019/025079, dated Mar. 16, 2020, pp. 1-5.
Notification of Transmittal of the International Search Report and Written Opinion of the International Searching Authority, or the Declaration for International Application No. PCT/US2019/025079, dated Jul. 24, 2019, pp. 1-14.
Notification of Transmittal of the International Preliminary Report on Patentability from the International Preliminary Examining Authority for International Application No. PCT/US2019/025080, dated Aug. 4, 2020, pp. 1-16.
Written Opinion of the International Preliminary Examining Authority, for International Application No. PCT/US2019/025080, dated Feb. 19, 2020, pp. 1-13.
Notification of Transmittal of the International Search Report and Written Opinion of the International Searching Authority, or the Declaration for International Application No. PCT/US2019/025080, dated Jul. 1, 2019, pp. 1-18.
Notification of Transmittal of the International Preliminary Report on Patentability from the International Preliminary Examining Authority for International Application No. PCT/US2019/025081, dated Jul. 15, 2020, pp. 1-14.
Written Opinion of the International Preliminary Examining Authority, for International Application No. PCT/US2019/025081, dated Mar. 4, 2020, pp. 1-14.

(56) References Cited

OTHER PUBLICATIONS

Notification of Transmittal of the International Search Report and Written Opinion of the International Searching Authority, or the Declaration for International Application No. PCT/US2019/025081, dated Jul. 3, 2019, pp. 1-17.
Francis, R.S. et al., Self Scheduling and Execution Threads, Parallel and Distributed Processing, 1990; Proceedings of the Second IEEE Symposium, Dallas, TX, USA, Dec. 9-13, 1990, IEEE Computer Society Dec. 9, 1990, pp. 586-590.
Theobald, K.B. et al. Superconducting Processors for HTMT: issues and challenges, Frontiers of Massively Parallel Computation 1999, The Seventh Symposium, Annapolis, MD, USA, Feb. 21-25, IEEE Computer Society Feb. 21, 1999, pp. 260-267.
Baumgarte, V. et al., PACT XPP—A Self-Reconfigurable Data Processing Architecture, Journal of Supercomputing, vol. 26, Jan. 1, 2003, pp. 167-184.
Anonymous, Network Topology, Wikipedia, https://en.wikipedia.org/wiki/Network_topology, Jun. 20, 2020, retrieved on Sep. 16, 2020.
Anonymous, Thread Pool, Wikipedia, https://en.wikipedia.org/wiki/Thread_pool, Feb. 22, 2018, retrieved on Jun. 18, 2019.

\* cited by examiner

| FIG. 9A | FIG. 9B |

LOOP THREAD ORDER EXECUTION CONTROL OF A MULTI-THREADED, SELF-SCHEDULING RECONFIGURABLE COMPUTING FABRIC

CROSS-REFERENCE TO RELATED APPLICATIONS

This application is a nonprovisional of and claims the benefit of and priority to U.S. Provisional Patent Application No. 62/651,137, filed Mar. 31, 2018, inventor Tony M. Brewer, titled "Loop Thread Order Execution Control of a Multi-Threaded, Self-Scheduling Reconfigurable Computing Fabric", which is commonly assigned herewith, and all of which is hereby incorporated herein by reference in its entirety with the same full force and effect as if set forth in its entirety herein (hereinafter referred to as the "related applications").

FIELD OF THE INVENTION

The present invention, in general, relates to configurable computing circuitry, and more particularly, relates to a heterogeneous computing system which includes configurable computing circuitry with an embedded interconnection network, dynamic reconfiguration, and dynamic control over energy or power consumption.

BACKGROUND OF THE INVENTION

Many existing computing systems have reached significant limits for computation processing capabilities, both in terms of speed of computation, energy (or power) consumption, and associated heat dissipation. For example, existing computing solutions have become increasingly inadequate as the need for advanced computing technologies grows, such as to accommodate artificial intelligence and other significant computing applications.

Accordingly, there is an ongoing need for a computing architecture capable of providing high performance and energy efficient solutions for compute-intensive kernels, such as for computation of Fast Fourier Transforms (FFTs) and finite impulse response (FIR) filters used in sensing, communication, and analytic applications, such as synthetic aperture radar, 5G base stations, and graph analytic applications such as graph clustering using spectral techniques, machine learning, 5G networking algorithms, and large stencil codes, for example and without limitation.

There is also an ongoing need for a configurable computing architecture capable of being configured for any of these various applications, but most importantly, also capable of dynamic self-configuration and self-reconfiguration.

SUMMARY OF THE INVENTION

As discussed in greater detail below, the representative apparatus, system and method provide for a computing architecture capable of providing high performance and energy efficient solutions for compute-intensive kernels, such as for computation of Fast Fourier Transforms (FFTs) and finite impulse response (FIR) filters used in sensing, communication, and analytic applications, such as synthetic aperture radar, 5G base stations, and graph analytic applications such as graph clustering using spectral techniques, machine learning, 5G networking algorithms, and large stencil codes, for example and without limitation.

Significantly, the various representative embodiments provide a multi-threaded, coarse-grained configurable computing architecture capable of being configured for any of these various applications, but most importantly, also capable of self-scheduling, dynamic self-configuration and self-reconfiguration, conditional branching, backpressure control for asynchronous signaling, ordered thread execution and loop thread execution (including with data dependencies), automatically starting thread execution upon completion of data dependencies and/or ordering, providing loop access to private variables, providing rapid execution of loop threads using a reenter queue, and using various thread identifiers for advanced loop execution, including nested loops.

In a representative embodiment, a configurable circuit may comprise: a configurable computation circuit; a plurality of synchronous network inputs coupled to the configurable computation circuit; a plurality of synchronous network outputs coupled to the configurable computation circuit; and a configuration memory coupled to the configurable computation circuit, to the control circuitry, to the synchronous network inputs, and to the synchronous network outputs, with the configuration memory comprising: a first, instruction memory storing a plurality of data path configuration instructions to configure a data path of the configurable computation circuit; and a second, instruction and instruction index memory storing a plurality of spoke instructions and data path configuration instruction indices for selection of a master synchronous input of the synchronous network inputs.

In another representative embodiment, a configurable circuit may comprise: a configurable computation circuit; and a configuration memory coupled to the configurable computation circuit, to the control circuitry, to the synchronous network inputs, and to the synchronous network outputs, the configuration memory comprising: a first, instruction memory storing a plurality of data path configuration instructions to configure a data path of the configurable computation circuit; and a second, instruction and instruction index memory storing a plurality of spoke instructions and data path configuration instruction indices for selection of a current data path configuration instruction for the configurable computation circuit.

In another representative embodiment, a configurable circuit may comprise: a configurable computation circuit; and a configuration memory coupled to the configurable computation circuit, to the control circuitry, to the synchronous network inputs, and to the synchronous network outputs, the configuration memory comprising: a first, instruction memory storing a plurality of data path configuration instructions to configure a data path of the configurable computation circuit; and a second, instruction and instruction index memory storing a plurality of spoke instructions and data path configuration instruction indices for selection of a next data path configuration instruction for a next configurable computation circuit.

In another representative embodiment, a configurable circuit may comprise: a configurable computation circuit; a control circuit coupled to the configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs, the configuration memory circuit comprising: a first, instruction memory storing a plurality of data path configuration instructions to configure a data path of the configurable computation circuit; and a second, instruction and instruction index memory storing a plurality of spoke instructions and data path configuration instruction indices for selection of a master synchronous input of the synchronous network inputs.

In yet another representative embodiment, a configurable circuit may comprise: a configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs; and a control circuit coupled to the configurable computation circuit, the control circuit comprising: a memory control circuit; a thread control circuit; and a plurality of control registers.

In another representative embodiment, a configurable circuit may comprise: a configurable computation circuit; a configuration memory coupled to the configurable computation circuit, to the control circuitry, to the synchronous network inputs, and to the synchronous network outputs, the configuration memory comprising: a first, instruction memory storing a plurality of data path configuration instructions to configure a data path of the configurable computation circuit; and a second, instruction and instruction index memory storing a plurality of spoke instructions and data path configuration instruction indices for selection of a next data path instruction or next data path instruction index for a next configurable computation circuit; and a conditional logic circuit coupled to the configurable computing circuit, wherein depending upon an output from the configurable computing circuit, the conditional logic circuit is adapted to provide conditional branching by modifying the next data path instruction or next data path instruction index provided on a selected output of the plurality of synchronous network outputs.

In another representative embodiment, a configurable circuit may comprise: a configurable computation circuit; a control circuit coupled to the configurable computation circuit; a first memory circuit coupled to the configurable computation circuit; a plurality of synchronous network inputs coupled to the configurable computation circuit; a plurality of synchronous network outputs coupled to the configurable computation circuit; an asynchronous network input queue coupled to an asynchronous packet network and to the first memory circuit; an asynchronous network output queue; and a flow control circuit coupled to the asynchronous network output queue, the flow control circuit adapted to generate a stop signal when a predetermined threshold has been reached in the asynchronous network output queue.

In another representative embodiment, a configurable circuit may comprise: a configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs; and a control circuit coupled to the configurable computation circuit, the control circuit comprising: a memory control circuit; a thread control circuit; and a plurality of control registers, wherein the plurality of control registers store a loop table having a plurality of thread identifiers and, for each thread identifier, a next thread identifier for execution following execution of a current thread to provide ordered thread execution.

In another representative embodiment, a configurable circuit may comprise: a configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs; and a control circuit coupled to the configurable computation circuit, the control circuit comprising: a memory control circuit; a plurality of control registers, wherein the plurality of control registers store a completion table having a first, data completion count; and a thread control circuit adapted to queue a thread for execution when, for its thread identifier, its completion count has decremented to zero.

In another representative embodiment, a configurable circuit may comprise: a configurable computation circuit; a first memory circuit coupled to the configurable computation circuit; a plurality of synchronous network inputs and outputs coupled to the configurable computation circuit; an asynchronous network input queue and an asynchronous network output queue; a second, configuration memory circuit coupled to the configurable computation circuit, to the control circuitry, to the synchronous network inputs, and to the synchronous network outputs, the second, configuration memory comprising: a first, instruction memory storing a plurality of data path configuration instructions to configure a data path of the configurable computation circuit; and a second, instruction and instruction index memory storing: a plurality of spoke instructions and data path configuration instruction indices for selection of a master synchronous input of the synchronous network inputs, for selection of a current data path configuration instruction for the configurable computation circuit, and for selection of a next data path instruction or next data path instruction index for a next configurable computation circuit; and the configurable circuit further comprising a control circuit coupled to the configurable computation circuit, the control circuit comprising: a memory control circuit; a plurality of control registers, wherein the plurality of control registers store a completion table having a first, data completion count; and a thread control circuit adapted to queue a thread for execution when, for its thread identifier, its completion count has decremented to zero.

In another representative embodiment, a configurable circuit may comprise: a configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs; and a control circuit coupled to the configurable computation circuit, the control circuit comprising: a memory control circuit; a plurality of control registers, wherein the plurality of control registers store a completion table having a first, data completion count; and a thread control circuit adapted to queue a thread for execution when, for its thread identifier, its completion count has decremented to zero and its thread identifier is the next thread.

In yet another representative embodiment, a configurable circuit may comprise: a configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs; and the configurable circuit further comprising a control circuit coupled to the configurable computation circuit, the control circuit comprising: a memory control circuit; a thread control circuit; and a plurality of control registers storing a completion table having a plurality of types of thread identifiers, with each type of thread identifier indicating a loop level for loop and nested loop execution, and wherein the plurality of control registers further store a top of thread identifiers stack to allow each type of thread identifier access to private variables for a selected loop.

In another representative embodiment, a configurable circuit may comprise: a configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs; and a control circuit coupled to the configurable computation circuit, the control circuit comprising: a memory control circuit; a plurality of control registers; and a thread control circuit comprising: a continuation queue storing one or more thread identifiers for computation threads having completion counts allowing execution but do not yet have an assigned thread identifier; and a reenter queue storing one or more thread identifiers for computation threads having completion counts allowing execution and having an assigned thread identifier to provide for execution of the threads in the reenter queue upon a designated spoke count.

In another representative embodiment, a configurable circuit may comprise: a configurable computation circuit; a first memory circuit coupled to the configurable computation circuit; a plurality of synchronous network inputs coupled to the configurable computation circuit; a plurality of synchronous network outputs coupled to the configurable computation circuit; and a second, configuration memory circuit coupled to the configurable computation circuit, to the control circuitry, to the synchronous network inputs, and to the synchronous network outputs; and a control circuit coupled to the configurable computation circuit, the control circuit comprising: a memory control circuit; a plurality of control registers storing a thread identifier pool and a completion table having a loop count of an active number of loop threads; and a thread control circuit, wherein in response to receipt of an asynchronous fabric message returning a thread identifier to the thread identifier pool, the control circuit decrements the loop count and, when the loop count reaches zero, transmits an asynchronous fabric completion message.

In a representative embodiment, a system is disclosed, which may comprise: an asynchronous packet network; a synchronous network; and a plurality of configurable circuits arranged in an array, each configurable circuit of the plurality of configurable circuits coupled to both the synchronous network and to the asynchronous packet network, the plurality of configurable circuits adapted to perform a plurality of computations using the synchronous network to form a plurality of synchronous domains, and the plurality of configurable circuits further adapted to generate and transmit a plurality of control messages over the asynchronous packet network, the plurality of control messages comprising one or more completion messages and continue messages.

In another representative embodiment, a system may comprise: a plurality of configurable circuits arranged in an array; a synchronous network coupled to each configurable circuit of the plurality of configurable circuits of the array; and an asynchronous packet network coupled to each configurable circuit of the plurality of configurable circuits of the array.

In another representative embodiment, a system may comprise: an interconnection network; a processor coupled to the interconnection network; and a plurality of configurable circuit clusters coupled to the interconnection network.

In a representative embodiment, a system may comprise: an interconnection network; a processor coupled to the interconnection network; a host interface coupled to the interconnection network; and a plurality of configurable circuit clusters coupled to the interconnection network, each configurable circuit cluster of the plurality of configurable circuit clusters comprising: a plurality of configurable circuits arranged in an array; a synchronous network coupled to each configurable circuit of the plurality of configurable circuits of the array; an asynchronous packet network coupled to each configurable circuit of the plurality of configurable circuits of the array; a memory interface coupled to the asynchronous packet network and to the interconnection network; and a dispatch interface coupled to the asynchronous packet network and to the interconnection network.

In another representative embodiment, a system may comprise: a hierarchical interconnection network comprising a first plurality of crossbar switches having a Folded Clos configuration and a plurality of direct, mesh connections at interfaces with endpoints; a processor coupled to the interconnection network; a host interface coupled to the interconnection network; and a plurality of configurable circuit clusters coupled to the interconnection network, each configurable circuit cluster of the plurality of configurable circuit clusters comprising: a plurality of configurable circuits arranged in an array; a synchronous network coupled to each configurable circuit of the plurality of configurable circuits of the array and providing a plurality of direct connections between adjacent configurable circuits of the array; an asynchronous packet network comprising a second plurality of crossbar switches, each crossbar switch coupled to at least one configurable circuit of the plurality of configurable circuits of the array and to another crossbar switch of the second plurality of crossbar switches; a memory interface coupled to the asynchronous packet network and to the interconnection network; and a dispatch interface coupled to the asynchronous packet network and to the interconnection network.

In another representative embodiment, a system may comprise: an interconnection network; a processor coupled to the interconnection network; a host interface coupled to the interconnection network; and a plurality of configurable circuit clusters coupled to the interconnection network, each configurable circuit cluster of the plurality of configurable circuit clusters comprising: a synchronous network; an asynchronous packet network; a memory interface coupled to the asynchronous packet network and to the interconnection network; a dispatch interface coupled to the asynchronous packet network and to the interconnection network; and a plurality of configurable circuits arranged in an array, each configurable circuit comprising: a configurable computation circuit; a control circuit coupled to the configurable computation circuit, the control circuit comprising: a memory control circuit; a thread control circuit; and a plurality of control registers; a first memory circuit coupled to the configurable computation circuit; a plurality of synchronous network inputs and outputs coupled to the configurable computation circuit and to the synchronous network; an asynchronous network input queue and an asynchronous network output queue coupled to the asynchronous packet network; a second, configuration memory circuit coupled to the configurable computation circuit, to the control circuitry, to the synchronous network inputs, and to the synchronous network outputs, the configuration memory circuit comprising: a first, instruction memory storing a plurality of data path configuration instructions to configure a data path of the configurable computation circuit; and a second, instruction and instruction index memory storing a plurality of spoke instructions and data path configuration instruction indices for selection of a master synchronous input of the synchronous network inputs.

In any of the various representative embodiments, the second, instruction and instruction index memory may further store a plurality of spoke instructions and data path configuration instruction indices for selection of a current data path configuration instruction for the configurable computation circuit.

In any of the various representative embodiments, the second, instruction and instruction index memory may further store a plurality of spoke instructions and data path configuration instruction indices for selection of a next data path configuration instruction for a next configurable computation circuit.

In any of the various representative embodiments, the second, instruction and instruction index memory may further store a plurality of spoke instructions and data path configuration instruction indices for selection of a synchronous network output of the plurality of synchronous network outputs.

In any of the various representative embodiments, the configurable circuit or system may further comprise: a configuration memory multiplexer coupled to the first, instruction memory and to the second, instruction and instruction index memory.

In any of the various representative embodiments, when a selection input of the configuration memory multiplexer has a first setting, the current data path configuration instruction may be selected using an instruction index from the second, instruction and instruction index memory.

In any of the various representative embodiments, when the selection input of the configuration memory multiplexer has a second setting different from the first setting, the current data path configuration instruction may be selected using an instruction index from the master synchronous input.

In any of the various representative embodiments, the second, instruction and instruction index memory may further store a plurality of spoke instructions and data path configuration instruction indices for configuration of portions of the configurable circuit independently from the current data path instruction.

In any of the various representative embodiments, a selected spoke instruction and data path configuration instruction index of the plurality of spoke instructions and data path configuration instruction indices may be selected according to a modulo spoke count.

In any of the various representative embodiments, the configurable circuit or system may further comprise: a conditional logic circuit coupled to the configurable computing circuit.

In any of the various representative embodiments, depending upon an output from the configurable computing circuit, the conditional logic circuit may be adapted to modify the next data path instruction index provided on a selected output of the plurality of synchronous network outputs.

In any of the various representative embodiments, depending upon an output from the configurable computing circuit, the conditional logic circuit may be adapted to provide conditional branching by modifying the next data path instruction or next data path instruction index provided on a selected output of the plurality of synchronous network outputs.

In any of the various representative embodiments, the conditional logic circuit, when enabled, may be adapted to provide conditional branching by ORing the least significant bit of the next data path instruction with the output from the configurable computing circuit to designate the next data path instruction or data path instruction index.

In any of the various representative embodiments, the conditional logic circuit, when enabled, may be adapted to provide conditional branching by ORing the least significant bit of the next data path instruction index with the output from the configurable computing circuit to designate the next data path instruction index.

In any of the various representative embodiments, the plurality of synchronous network inputs may comprise: a plurality of input registers coupled to a plurality of communication lines of a synchronous network; and an input multiplexer coupled to the plurality of input registers and to the second, instruction and instruction index memory for selection of the master synchronous input.

In any of the various representative embodiments, the plurality of synchronous network outputs may comprise: a plurality of output registers coupled to a plurality of communication lines of the synchronous network; and an output multiplexer coupled to the configurable computing circuit for selection of an output from the configurable computing circuit.

In any of the various representative embodiments, the configurable circuit or system may further comprise: an asynchronous network input queue coupled to an asynchronous packet network and to the memory circuit; and an asynchronous network output queue coupled to the output multiplexer.

In any of the various representative embodiments, the configurable circuit or system may further comprise: an asynchronous fabric state machine coupled to the asynchronous network input queue and to the asynchronous network output queue, the asynchronous fabric state machine adapted to decode an input data packet received from the asynchronous packet network and to assemble an output data packet for transmission on the asynchronous packet network.

In any of the various representative embodiments, the asynchronous packet network may comprise a plurality of crossbar switches, each crossbar switch coupled to a plurality of configurable circuits and to at least one other crossbar switch.

In any of the various representative embodiments, the configurable circuit or system may further comprise: an array of a plurality of configurable circuits, wherein: each configurable circuit is coupled through the plurality of synchronous network inputs and the plurality of synchronous network outputs to the synchronous network; and each configurable circuit is coupled through the asynchronous network input and the asynchronous network output to the asynchronous packet network.

In any of the various representative embodiments, the synchronous network may comprise a plurality of direct point-to-point connections coupling adjacent configurable circuits of the array of the plurality of configurable circuits.

In any of the various representative embodiments, each configurable circuit may comprise: a direct, pass through connection between the plurality of input registers and the plurality of output registers. In any of the various representative embodiments, the direct, pass through connection may provide a direct, point-to-point connection for data transmission from a second configurable circuit received on the synchronous network to a third configurable circuit transmitted on the synchronous network.

In any of the various representative embodiments, the configurable computation circuit may comprise an arithmetic, logical and bit operation circuit adapted to perform at least one integer operation selected from the group consisting of: signed and unsigned addition, absolute value, negate, logical NOT, add and negate, subtraction A−B, reverse subtraction B−A, signed and unsigned greater than, signed and unsigned greater than or equal to, signed and unsigned less than, signed and unsigned less than or equal to, comparison of equal or not equal to, logical AND operation, logical OR operation, logical XOR operation, logical NAND operation, logical NOR operation, logical NOT XOR operation, logical AND NOT operation, logical OR NOT operation, and an interconversion between integer and floating point.

In any of the various representative embodiments, the configurable computation circuit may comprise an arithmetic, logical and bit operation circuit adapted to perform at least one floating point operation selected from the group consisting of: signed and unsigned addition, absolute value, negate, logical NOT, add and negate, subtraction A−B, reverse subtraction B−A, signed and unsigned greater than, signed and unsigned greater than or equal to, signed and unsigned less than, signed and unsigned less than or equal to, comparison of equal or not equal to, logical AND operation, logical OR operation, logical XOR operation, logical NAND operation, logical NOR operation, logical NOT XOR operation, logical AND NOT operation, logical OR NOT operation, an interconversion between integer and floating point, and combinations thereof.

In any of the various representative embodiments, the configurable computation circuit may comprise a multiply and shift operation circuit adapted to perform at least one integer operation selected from the group consisting of: multiply, shift, pass an input, signed and unsigned multiply, signed and unsigned shift right, signed and unsigned shift left, bit order reversal, a permutation, an interconversion between integer and floating point, and combinations thereof.

In any of the various representative embodiments, the configurable computation circuit may comprise a multiply and shift operation circuit adapted to perform at least floating point operation selected from the group consisting of: multiply, shift, pass an input, signed and unsigned multiply, signed and unsigned shift right, signed and unsigned shift left, bit order reversal, a permutation, an interconversion between integer and floating point, and combinations thereof.

In any of the various representative embodiments, the array of the plurality of configurable circuits may be further coupled to a first interconnection network.

In any of the various representative embodiments, the array of the plurality of configurable circuits may further comprise: a third, system memory interface circuit; and a dispatch interface circuit. In any of the various representative embodiments, the dispatch interface circuit may be adapted to receive a work descriptor packet over the first interconnection network, and in response to the work descriptor packet, to generate one or more data and control packets to the plurality of configurable circuits to configure the plurality of configurable circuits for execution of a selected computation.

In any of the various representative embodiments, the configurable circuit or system may further comprise: a flow control circuit coupled to the asynchronous network output queue, the flow control circuit adapted to generate a stop signal when a predetermined threshold has been reached in the asynchronous network output queue. In any of the various representative embodiments, in response to the stop signal, each asynchronous network output queue stops outputting data packets on the asynchronous packet network. In any of the various representative embodiments, in response to the stop signal, each configurable computation circuit stops executing upon completion of its current instruction.

In any of the various representative embodiments, a first plurality of configurable circuits of the array of a plurality of configurable circuits may be coupled in a first predetermined sequence through the synchronous network to form a first synchronous domain; and wherein a second plurality of configurable circuits of the array of a plurality of configurable circuits are coupled in a second predetermined sequence through the synchronous network to form a second synchronous domain. In any of the various representative embodiments, the first synchronous domain may be adapted to generate a continuation message to the second synchronous domain transmitted through the asynchronous packet network. In any of the various representative embodiments, the second synchronous domain may be adapted to generate a completion message to the first synchronous domain transmitted through the asynchronous packet network.

In any of the various representative embodiments, the plurality of control registers may store a completion table having a first, data completion count. In any of the various representative embodiments, the plurality of control registers further store the completion table having a second, iteration count. In any of the various representative embodiments, the plurality of control registers may further store a loop table having a plurality of thread identifiers and, for each thread identifier, a next thread identifier for execution following execution of a current thread. In any of the various representative embodiments, the plurality of control registers may further store, in the loop table, an identification of a first iteration and an identification of a last iteration.

In any of the various representative embodiments, the control circuit may be adapted to queue a thread for execution when, for its thread identifier, its completion count has decremented to zero and its thread identifier is the next thread.

In any of the various representative embodiments, the control circuit may be adapted to queue a thread for execution when, for its thread identifier, its completion count indicates completion of any data dependencies. In any of the various representative embodiments, the completion count may indicate a predetermined number of completion messages to be received, per selected thread of a plurality of threads, prior to execution of the selected thread.

In any of the various representative embodiments, the plurality of control registers may further store a completion table having a plurality of types of thread identifiers, with each type of thread identifier indicating a loop level for loop and nested loop execution.

In any of the various representative embodiments, the plurality of control registers may further store a completion table having a loop count of an active number of loop threads, and wherein in response to receipt of an asynchronous fabric message returning a thread identifier to a thread identifier pool, the control circuit decrements the loop count and, when the loop count reaches zero, transmits an asynchronous fabric completion message. In any of the various representative embodiments, the plurality of control registers may further store a top of thread identifiers stack to allow each type of thread identifier access to private variables for a selected loop.

In any of the various representative embodiments, the control circuit may further comprise: a continuation queue; and a reenter queue. In any of the various representative embodiments, the continuation queue stores one or more thread identifiers for computation threads having completion counts allowing execution but do not yet have an assigned thread identifier. In any of the various representative embodiments, the reenter queue may store one or more thread identifiers for computation threads having completion counts allowing execution and having an assigned thread identifier. In any of the various representative embodiments, any thread having a thread identifier in the reenter queue may be executed prior to execution of any thread having a thread identifier in the continuation queue.

In any of the various representative embodiments, the control circuit may further comprise: a priority queue, wherein any thread having a thread identifier in the priority queue may be executed prior to execution of any thread having a thread identifier in the continuation queue or in the reenter queue.

In any of the various representative embodiments, the control circuit may further comprise: a run queue, wherein any thread having a thread identifier in the run queue may be executed upon an occurrence of a spoke count for the thread identifier.

In any of the various representative embodiments, the second, configuration memory circuit may comprise: a first, instruction memory storing a plurality of data path configuration instructions to configure a data path of the configurable computation circuit; and a second, instruction and instruction index memory storing a plurality of spoke instructions and data path configuration instruction indices for selection of a master synchronous input of the synchronous network inputs.

In any of the various representative embodiments, the control circuit may be adapted to self-schedule a computation thread for execution.

In any of the various representative embodiments, the conditional logic circuit may be adapted to branch to a different, second next instruction for execution by a next configurable circuit.

In any of the various representative embodiments, the control circuit may be adapted to order computation threads for execution. In any of the various representative embodiments, the control circuit may be adapted to order loop computation threads for execution.

In any of the various representative embodiments, the control circuit may be adapted to commence execution of computation threads in response to one or more completion signals from data dependencies.

Various method embodiments of configuring a configurable circuit are also disclosed. A representative method embodiment may comprise: using a first, instruction memory, providing a plurality of data path configuration instructions to configure a data path of the configurable computation circuit; and using a second, instruction and instruction index memory, providing a plurality of spoke instructions and data path configuration instruction indices for selection of a master synchronous input of a plurality of synchronous network inputs.

In any of the various representative embodiments, a method of configuring a configurable circuit may comprise: using a first, instruction memory, providing a plurality of data path configuration instructions to configure a data path of the configurable computation circuit; and using a second, instruction and instruction index memory, providing a plurality of spoke instructions and data path configuration instruction indices for selection of a current data path configuration instruction for the configurable computation circuit.

In any of the various representative embodiments, a method of configuring a configurable circuit may comprise: using a first, instruction memory, providing a plurality of data path configuration instructions to configure a data path of the configurable computation circuit; and using a second, instruction and instruction index memory, providing a plurality of spoke instructions and data path configuration instruction indices for selection of a next data path configuration instruction for a next configurable computation circuit.

A method of controlling thread execution of a multi-threaded configurable circuit is also disclosed, with the configurable circuit having a configurable computation circuit. A representative method embodiment may comprise: using a conditional logic circuit, depending upon an output from the configurable computing circuit, providing conditional branching by modifying the next data path instruction or next data path instruction index provided to a next configurable circuit.

Another representative method embodiment of controlling thread execution of a multi-threaded configurable circuit may comprise: using a flow control circuit, generating a stop signal when a predetermined threshold has been reached in an asynchronous network output queue.

Another representative method embodiment of controlling thread execution of a multi-threaded configurable circuit may comprise: using a plurality of control registers, storing a loop table having a plurality of thread identifiers and, for each thread identifier, a next thread identifier for execution following execution of a current thread to provide ordered thread execution.

Another representative method embodiment of controlling thread execution of a multi-threaded configurable circuit may comprise: using a plurality of control registers, storing a completion table having a first, data completion count; and using a thread control circuit, queueing a thread for execution when, for its thread identifier, its completion count has decremented to zero.

A method of configuring and controlling thread execution of a multi-threaded configurable circuit having a configurable computation circuit is disclosed, with a representative method embodiment comprising: using a first, instruction memory, providing a plurality of data path using configuration instructions to configure a data path of the configurable computation circuit; using a second, instruction and instruction index memory, providing a plurality of spoke instructions and data path configuration instruction indices for selection of a master synchronous input of a plurality of synchronous network inputs, for selection of a current data path configuration instruction for the configurable computation circuit, and for selection of a next data path instruction or next data path instruction index for a next configurable computation circuit; using a plurality of control registers, providing a completion table having a first, data completion count; and using a thread control circuit, queueing a thread for execution when, for its thread identifier, its completion count has decremented to zero.

Another method of configuring and controlling thread execution of a multi-threaded configurable circuit may comprise: using a first, instruction memory, providing a plurality of data path using configuration instructions to configure a data path of the configurable computation circuit; using a second, instruction and instruction index memory, providing a plurality of spoke instructions and data path configuration instruction indices for selection of a master synchronous input of a plurality of synchronous network inputs, for selection of a current data path configuration instruction for the configurable computation circuit, and for selection of a next data path instruction or next data path instruction index for a next configurable computation circuit; using a plurality of control registers, providing a completion table having a first, data completion count; and using a thread control circuit, queueing a thread for execution when, for its thread identifier, its completion count has decremented to zero and its thread identifier is the next thread.

Another method of controlling thread execution of a multi-threaded configurable circuit may comprise: using a plurality of control registers, storing a completion table having a plurality of types of thread identifiers, with each type of thread identifier indicating a loop level for loop and nested loop execution, and wherein the plurality of control registers further store a top of thread identifiers stack; and allowing each type of thread identifier access to private variables for a selected loop.

Another method of controlling thread execution of a multi-threaded configurable circuit may comprise: using a plurality of control registers, storing a completion table having a data completion count; using a thread control circuit, providing a continuation queue storing one or more thread identifiers for computation threads having completion counts allowing execution but do not yet have an assigned thread identifier; and using a thread control circuit, providing a reenter queue storing one or more thread identifiers for computation threads having completion counts allowing execution and having an assigned thread identifier to provide for execution of the threads in the reenter queue upon a designated spoke count.

Another method of controlling thread execution of a multi-threaded configurable circuit may comprise: using a plurality of control registers, storing a thread identifier pool and a completion table having a loop count of an active number of loop threads; and using a thread control circuit, in response to receipt of an asynchronous fabric message returning a thread identifier to the thread identifier pool, decrementing the loop count and, when the loop count reaches zero, transmitting an asynchronous fabric completion message.

In any of the various representative embodiments, the method may further comprise: using the second, instruction and instruction index memory, providing a plurality of spoke instructions and data path configuration instruction indices for selection of a current data path configuration instruction for the configurable computation circuit.

In any of the various representative embodiments, the method may further comprise: using the second, instruction and instruction index memory, providing a plurality of spoke instructions and data path configuration instruction indices for selection of a next data path configuration instruction for a next configurable computation circuit.

In any of the various representative embodiments, the method may further comprise: using the second, instruction and instruction index memory, providing a plurality of spoke instructions and data path configuration instruction indices for selection of a synchronous network output of the plurality of synchronous network outputs.

In any of the various representative embodiments, the method may further comprise: using a configuration memory multiplexer, providing a first selection setting to select the current data path configuration instruction using an instruction index from the second, instruction and instruction index memory.

In any of the various representative embodiments, the method may further comprise: using a configuration memory multiplexer, providing a second selection setting, the second setting different from the first setting, to select the current data path configuration instruction using an instruction index from a master synchronous input.

In any of the various representative embodiments, the method may further comprise: using the second, instruction and instruction index memory, providing a plurality of spoke instructions and data path configuration instruction indices for configuration of portions of the configurable circuit independently from the current data path instruction.

In any of the various representative embodiments, the method may further comprise: using a configuration memory multiplexer, selecting a spoke instruction and data path configuration instruction index of the plurality of spoke instructions and data path configuration instruction indices according to a modulo spoke count.

In any of the various representative embodiments, the method may further comprise: using a conditional logic circuit and depending upon an output from the configurable computing circuit, modifying the next data path instruction or next data path instruction index.

In any of the various representative embodiments, the method may further comprise: using a conditional logic circuit and depending upon an output from the configurable computing circuit, providing conditional branching by modifying the next data path instruction or next data path instruction index.

In any of the various representative embodiments, the method may further comprise: enabling a conditional logic circuit; and using the conditional logic circuit and depending upon an output from the configurable computing circuit, providing conditional branching by ORing the least significant bit of the next data path instruction with the output from the configurable computing circuit to designate the next data path instruction or data path instruction index.

In any of the various representative embodiments, the method may further comprise: using an input multiplexer, selecting the master synchronous input. In any of the various representative embodiments, the method may further comprise: using an output multiplexer, selecting an output from the configurable computing circuit.

In any of the various representative embodiments, the method may further comprise: using an asynchronous fabric state machine coupled to an asynchronous network input queue and to an asynchronous network output queue, decoding an input data packet received from the asynchronous packet network and assembling an output data packet for transmission on the asynchronous packet network.

In any of the various representative embodiments, the method may further comprise: using the synchronous network, providing a plurality of direct point-to-point connections coupling adjacent configurable circuits of the array of the plurality of configurable circuits.

In any of the various representative embodiments, the method may further comprise: using the configurable circuit, providing a direct, pass through connection between a plurality of input registers and a plurality of output registers. In any of the various representative embodiments, the direct, pass through connection provides a direct, point-to-point connection for data transmission from a second configurable circuit received on the synchronous network to a third configurable circuit transmitted on the synchronous network.

In any of the various representative embodiments, the method may further comprise: using the configurable computation circuit, performing at least one integer or floating point operation selected from the group consisting of: signed and unsigned addition, absolute value, negate, logical NOT, add and negate, subtraction A–B, reverse subtraction B–A, signed and unsigned greater than, signed and unsigned greater than or equal to, signed and unsigned less than, signed and unsigned less than or equal to, comparison of equal or not equal to, logical AND operation, logical OR operation, logical XOR operation, logical NAND operation, logical NOR operation, logical NOT XOR operation, logical AND NOT operation, logical OR NOT operation, and an interconversion between integer and floating point.

In any of the various representative embodiments, the method may further comprise: using the configurable computation circuit, performing at least one integer or floating point operation selected from the group consisting of: multiply, shift, pass an input, signed and unsigned multiply, signed and unsigned shift right, signed and unsigned shift left, bit order reversal, a permutation, an interconversion between integer and floating point, and combinations thereof.

In any of the various representative embodiments, the method may further comprise: using a dispatch interface circuit, receiving a work descriptor packet over the first interconnection network, and in response to the work descriptor packet, to generate one or more data and control packets to the plurality of configurable circuits to configure the plurality of configurable circuits for execution of a selected computation.

In any of the various representative embodiments, the method may further comprise: using a flow control circuit, generating a stop signal when a predetermined threshold has been reached in the asynchronous network output queue. In any of the various representative embodiments, in response to the stop signal, each asynchronous network output queue stops outputting data packets on the asynchronous packet network. In any of the various representative embodiments, in response to the stop signal, each configurable computation circuit stops executing upon completion of its current instruction.

In any of the various representative embodiments, the method may further comprise: coupling a first plurality of configurable circuits of the array of a plurality of configurable circuits in a first predetermined sequence through the synchronous network to form a first synchronous domain; and coupling a second plurality of configurable circuits of the array of a plurality of configurable circuits are coupled in a second predetermined sequence through the synchronous network to form a second synchronous domain.

In any of the various representative embodiments, the method may further comprise: generating a continuation message from the first synchronous domain to the second synchronous domain for transmission through the asynchronous packet network.

In any of the various representative embodiments, the method may further comprise: generating a completion message from the second synchronous domain to the first synchronous domain for transmission through the asynchronous packet network.

In any of the various representative embodiments, the method may further comprise storing a completion table having a first, data completion count in the plurality of control registers.

In any of the various representative embodiments, the method may further comprise: storing the completion table having a second, iteration count in the plurality of control registers.

In any of the various representative embodiments, the method may further comprise: storing a loop table having a plurality of thread identifiers in the plurality of control registers and, for each thread identifier, storing a next thread identifier for execution following execution of a current thread.

In any of the various representative embodiments, the method may further comprise: storing in the loop table in the plurality of control registers, an identification of a first iteration and an identification of a last iteration.

In any of the various representative embodiments, the method may further comprise: using the control circuit, queueing a thread for execution when, for its thread identifier, its completion count has decremented to zero.

In any of the various representative embodiments, the method may further comprise: using the control circuit, queueing a thread for execution when, for its thread identifier, its completion count has decremented to zero and its thread identifier is the next thread.

In any of the various representative embodiments, the method may further comprise: using the control circuit, queueing a thread for execution when, for its thread identifier, its completion count indicates completion of any data dependencies. In any of the various representative embodiments, the completion count may indicate a predetermined number of completion messages to be received, per selected thread of a plurality of threads, prior to execution of the selected thread.

In any of the various representative embodiments, the method may further comprise: storing a completion table, in the plurality of control registers, having a plurality of types of thread identifiers, with each type of thread identifier indicating a loop level for loop and nested loop execution.

In any of the various representative embodiments, the method may further comprise: storing, in the plurality of control registers, a completion table having a loop count of an active number of loop threads, and wherein in response to receipt of an asynchronous fabric message returning a thread identifier to a thread identifier pool, using the control circuit, decrementing the loop count and, when the loop count reaches zero, transmittting an asynchronous fabric completion message.

In any of the various representative embodiments, the method may further comprise: storing a top of thread identifiers stack in the plurality of control registers to allow each type of thread identifier access to private variables for a selected loop.

In any of the various representative embodiments, the method may further comprise: using a continuation queue, storing one or more thread identifiers for computation threads having completion counts allowing execution but do not yet have an assigned thread identifier.

In any of the various representative embodiments, the method may further comprise: using a reenter queue, storing one or more thread identifiers for computation threads having completion counts allowing execution and having an assigned thread identifier.

In any of the various representative embodiments, the method may further comprise: executing any thread having a thread identifier in the reenter queue prior to execution of any thread having a thread identifier in the continuation queue.

In any of the various representative embodiments, the method may further comprise: executing any thread having a thread identifier in a priority queue prior to execution of any thread having a thread identifier in the continuation queue or in the reenter queue.

In any of the various representative embodiments, the method may further comprise: executing any thread in a run queue upon an occurrence of a spoke count for the thread identifier.

In any of the various representative embodiments, the method may further comprise: using a control circuit, self-scheduling a computation thread for execution.

In any of the various representative embodiments, the method may further comprise: using the conditional logic circuit, branching to a different, second next instruction for execution by a next configurable circuit.

In any of the various representative embodiments, the method may further comprise: using the control circuit, ordering computation threads for execution.

In any of the various representative embodiments, the method may further comprise: using the control circuit, ordering loop computation threads for execution.

In any of the various representative embodiments, the method may further comprise: using the control circuit, commencing execution of computation threads in response to one or more completion signals from data dependencies.

Numerous other advantages and features of the present invention will become readily apparent from the following detailed description of the invention and the embodiments thereof, from the claims and from the accompanying drawings.

BRIEF DESCRIPTION OF THE DRAWINGS

The objects, features and advantages of the present invention will be more readily appreciated upon reference to the following disclosure when considered in conjunction with the accompanying drawings, wherein like reference numerals are used to identify identical components in the various views, and wherein reference numerals with alphabetic characters are utilized to identify additional types, instantiations or variations of a selected component embodiment in the various views, in which:

FIGS. 9, 9A and 9B, in which FIG. 9 is divided into FIGS. 9A and 9B (and collectively referred to as FIG. 9) are collectively a detailed block diagram of a representative embodiment of a hybrid threading fabric configurable computing circuit (tile).

DETAILED DESCRIPTION OF REPRESENTATIVE EMBODIMENTS

Figure 1:
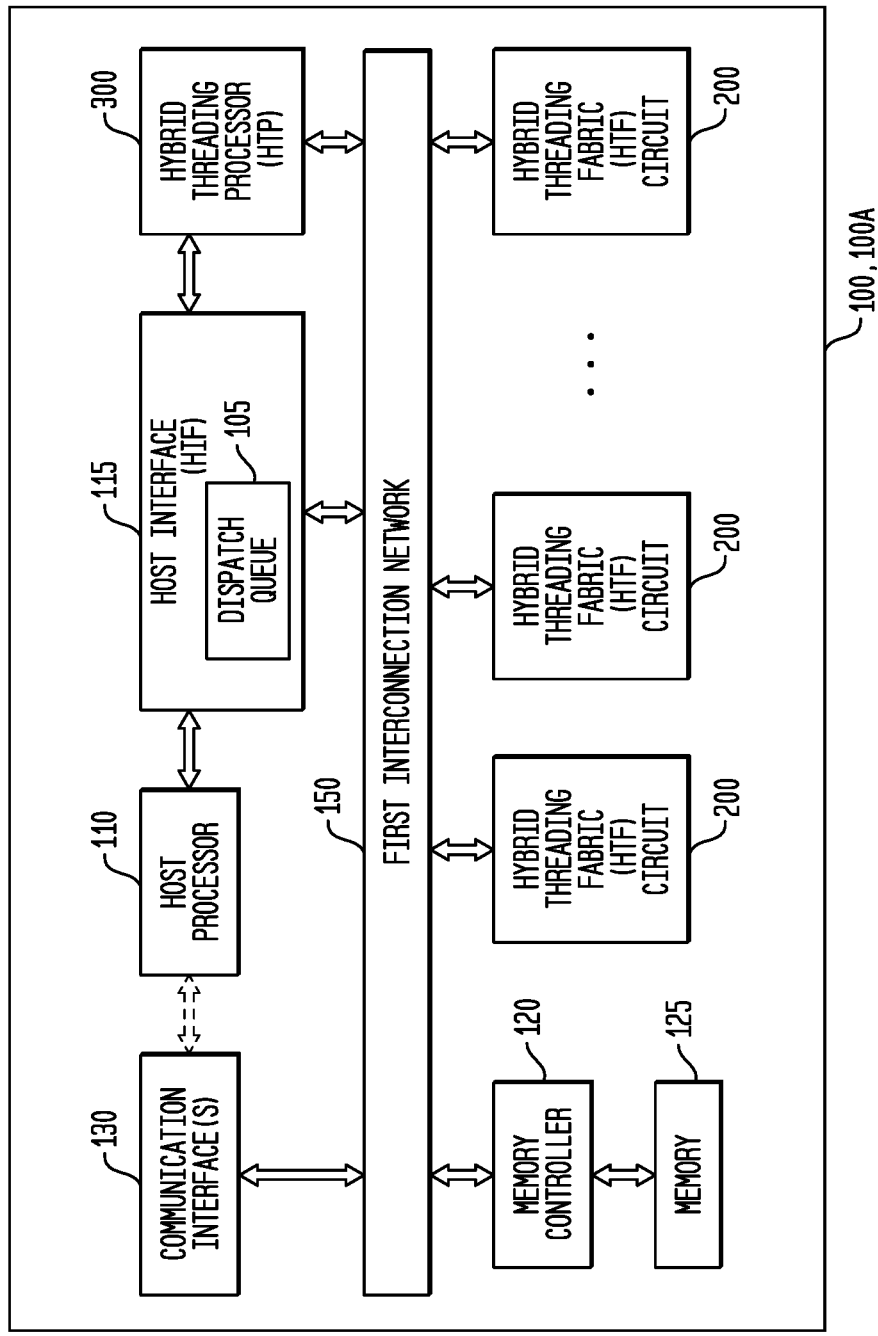
FIG. 1 is a block diagram of a representative first embodiment of a hybrid computing system.

While the present invention is susceptible of embodiment in many different forms, there are shown in the drawings and will be described herein in detail specific exemplary embodiments thereof, with the understanding that the present disclosure is to be considered as an exemplification of the principles of the invention and is not intended to limit the invention to the specific embodiments illustrated. In this respect, before explaining at least one embodiment consistent with the present invention in detail, it is to be understood that the invention is not limited in its application to the details of construction and to the arrangements of components set forth above and below, illustrated in the drawings, or as described in the examples. Methods and apparatuses consistent with the present invention are capable of other embodiments and of being practiced and carried out in various ways. Also, it is to be understood that the phraseology and terminology employed herein, as well as the abstract included below, are for the purposes of description and should not be regarded as limiting.

Figure 2:
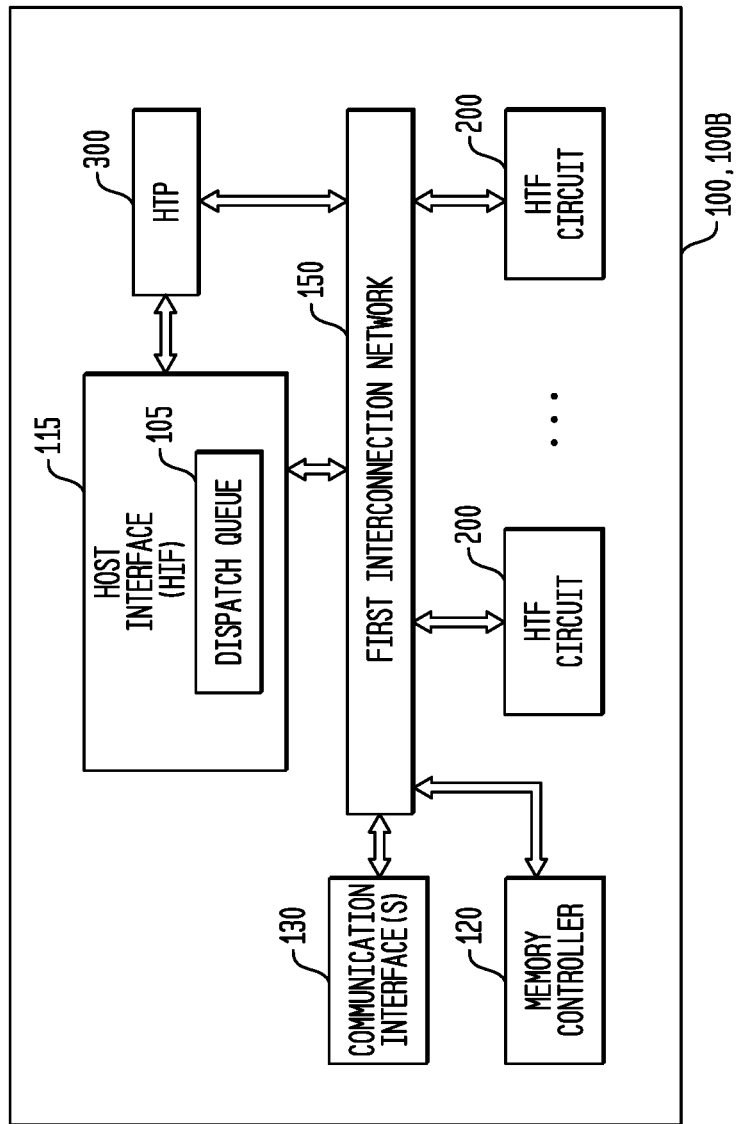
FIG. 2 is a block diagram of a representative second embodiment of a hybrid computing system.
Figure 3:
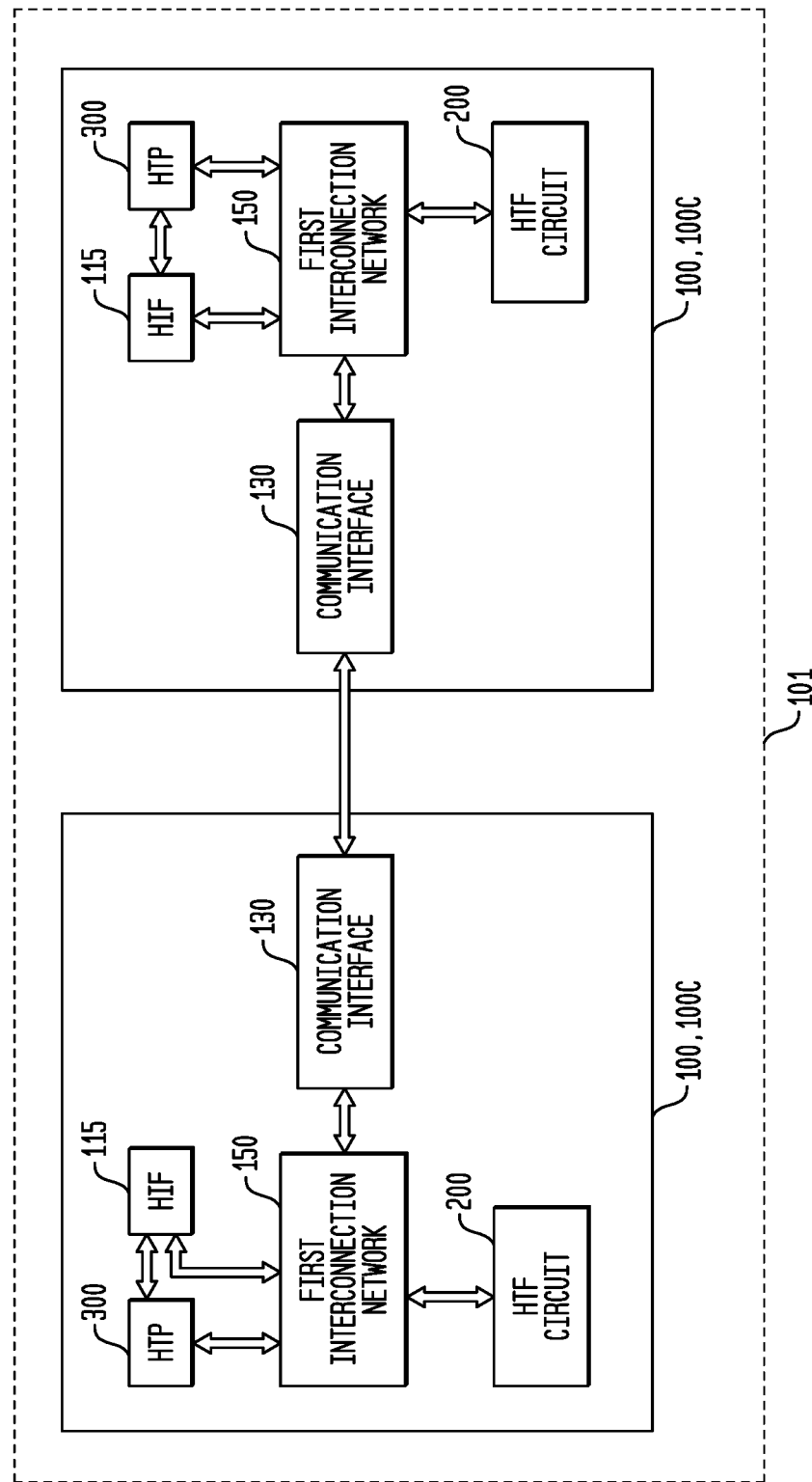
FIG. 3 is a block diagram of a representative third embodiment of a hybrid computing system.
Figure 4:
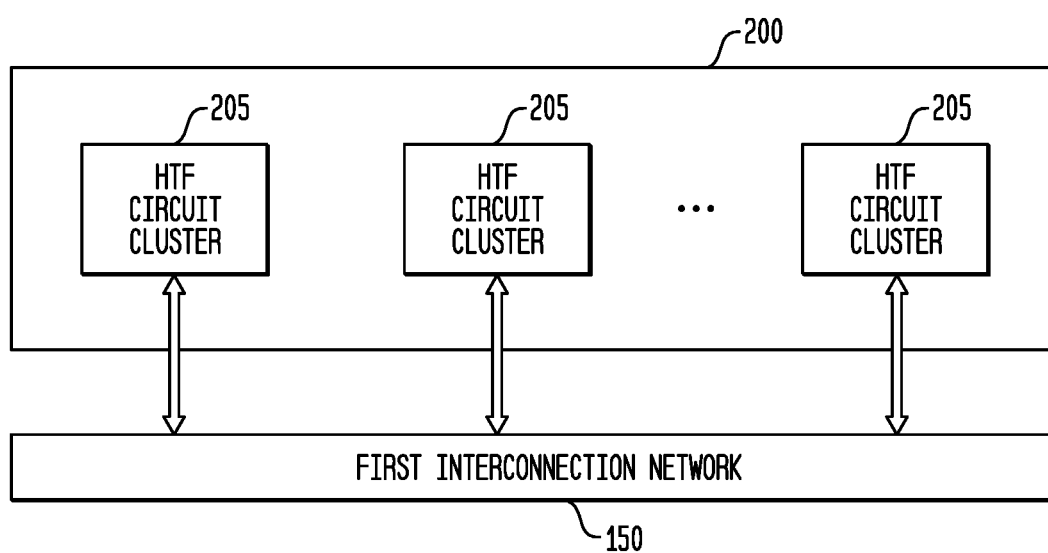
FIG. 4 is a block diagram of a representative embodiment of a hybrid threading fabric having configurable computing circuitry coupled to a first interconnection network.
Figure 5:
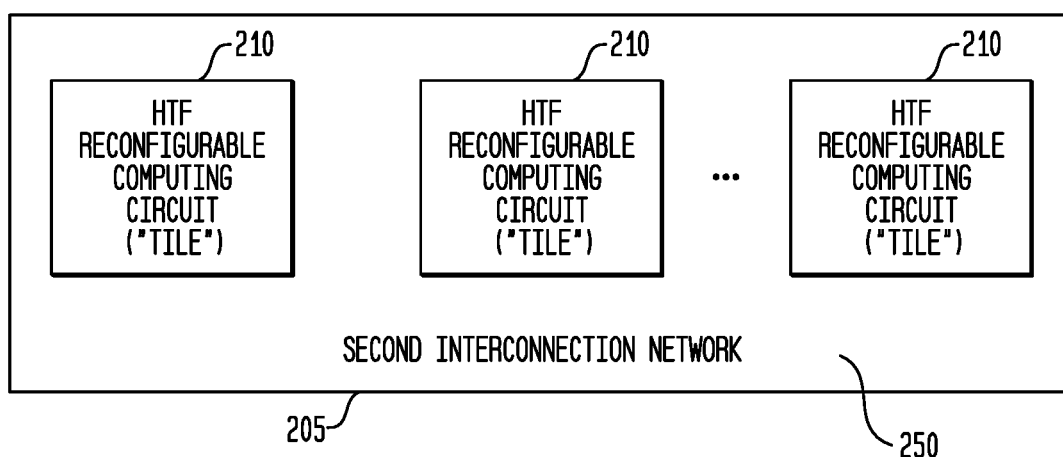
FIG. 5 is a high-level block diagram of a portion of a representative embodiment of a hybrid threading fabric circuit cluster.
Figure 6:
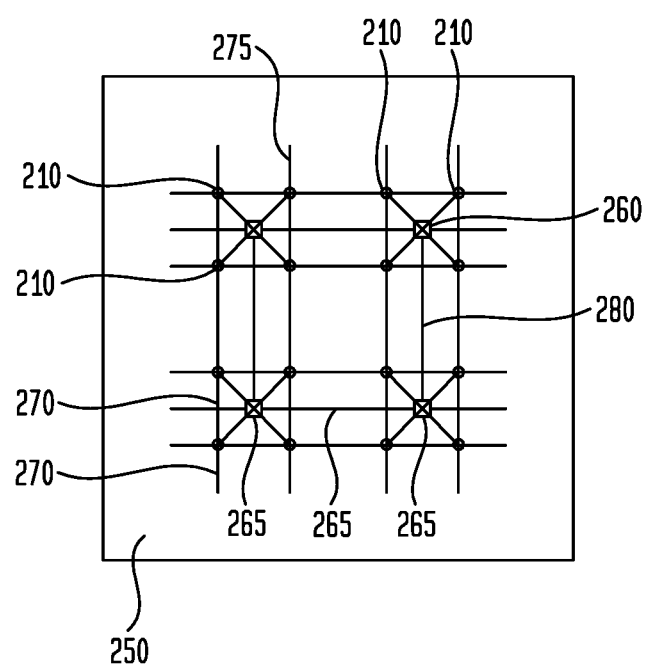
FIG. 6 is a high-level block diagram of a second interconnection network within a hybrid threading fabric circuit cluster.
Figure 7:
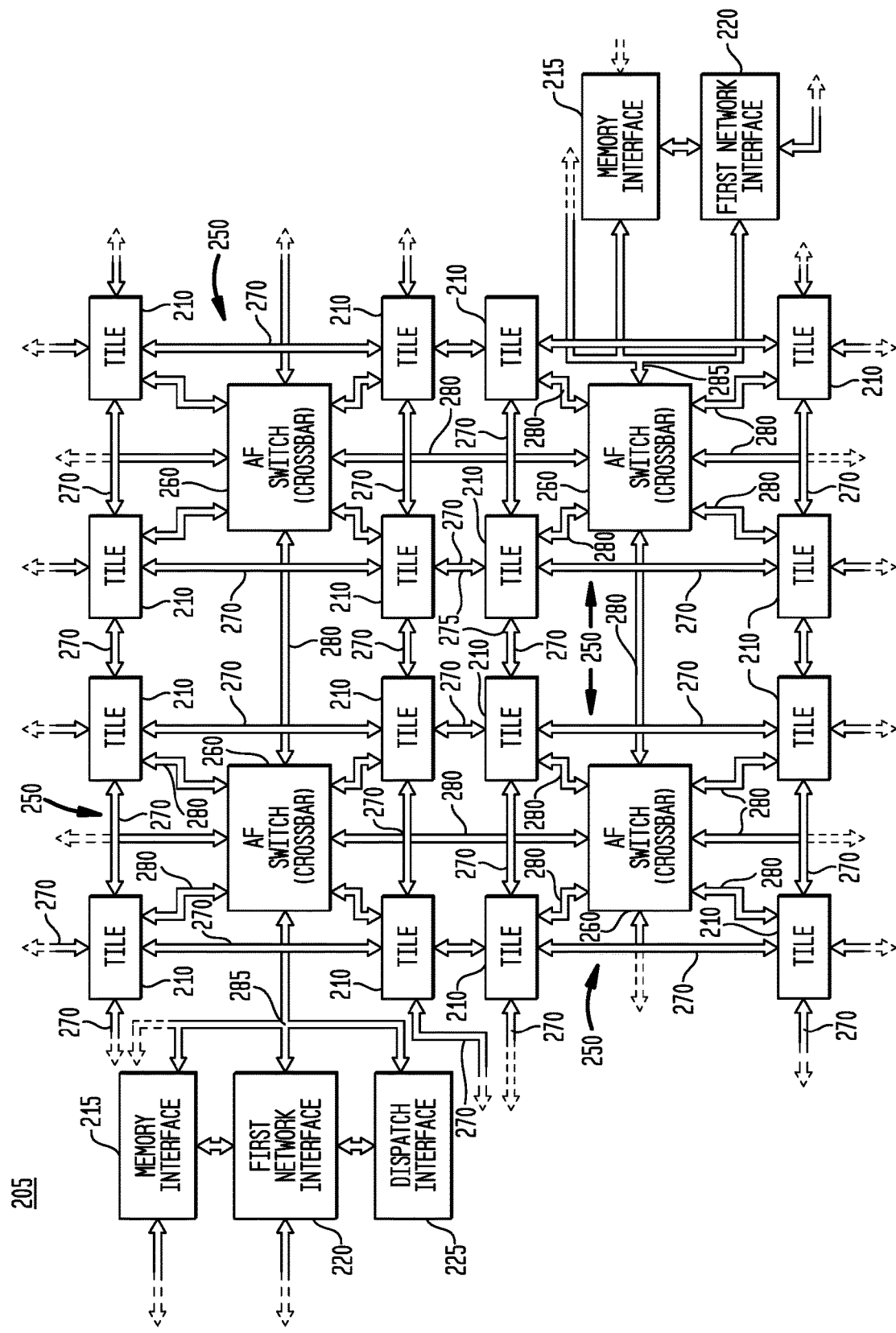
FIG. 7 is a detailed block diagram of a representative embodiment of a hybrid threading fabric circuit cluster.

FIGS. 1, 2 and 3 are block diagrams of representative first, second, and third embodiments of a hybrid computing system 100A, 100B, 100C (collectively referred to as a system 100). FIG. 4 is a block diagram of a representative embodiment of a hybrid threading fabric ("HTF") 200 having configurable computing circuitry coupled to a first interconnection network 150. FIG. 5 is a high-level block diagram of a portion of a representative embodiment of a hybrid threading fabric cluster 205. FIG. 6 is a high-level block diagram of a second interconnection network within a hybrid threading fabric cluster 205. FIG. 7 is a detailed block diagram of a representative embodiment of a hybrid threading fabric (HTF) cluster 205.

Figure 8:
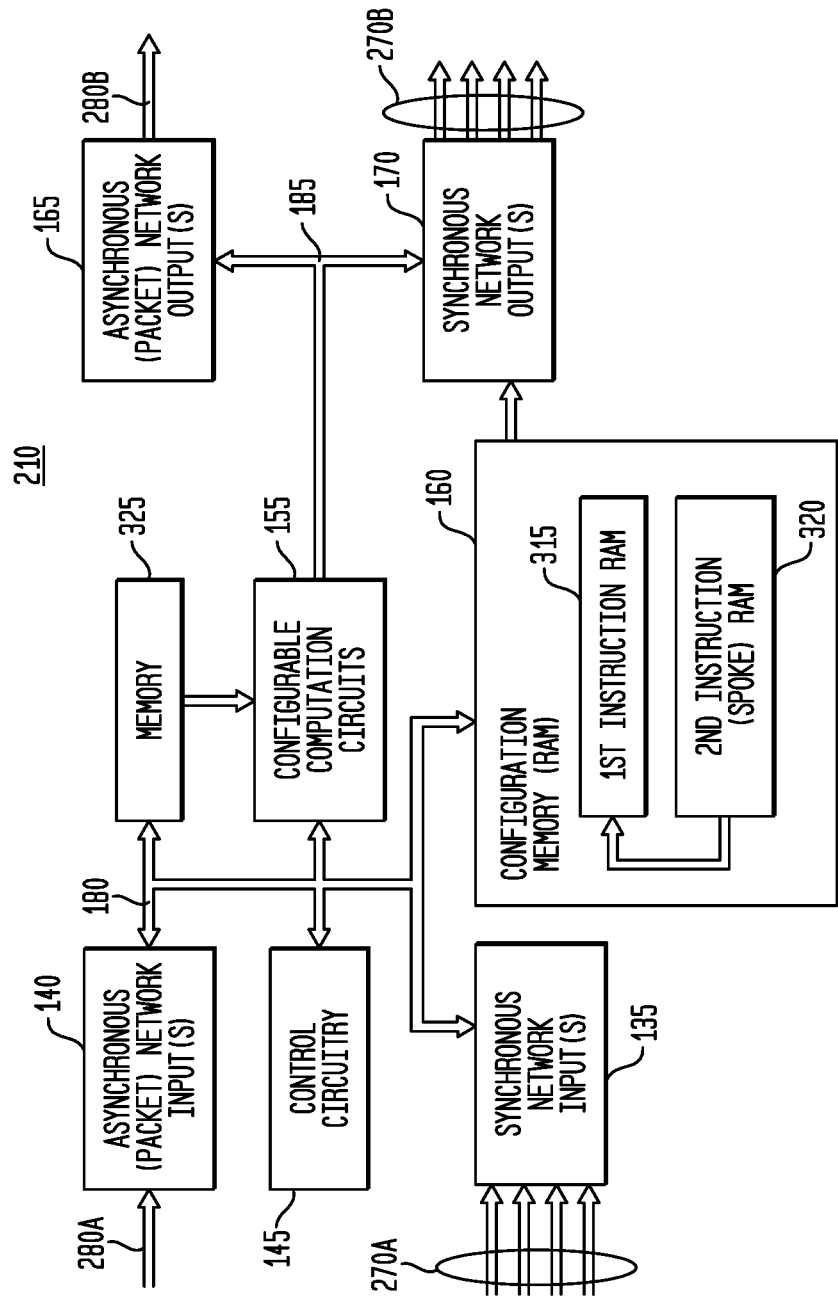
FIG. 8 is a detailed block diagram of a representative embodiment of a hybrid threading fabric configurable computing circuit (tile).
Figures 9, 9A:
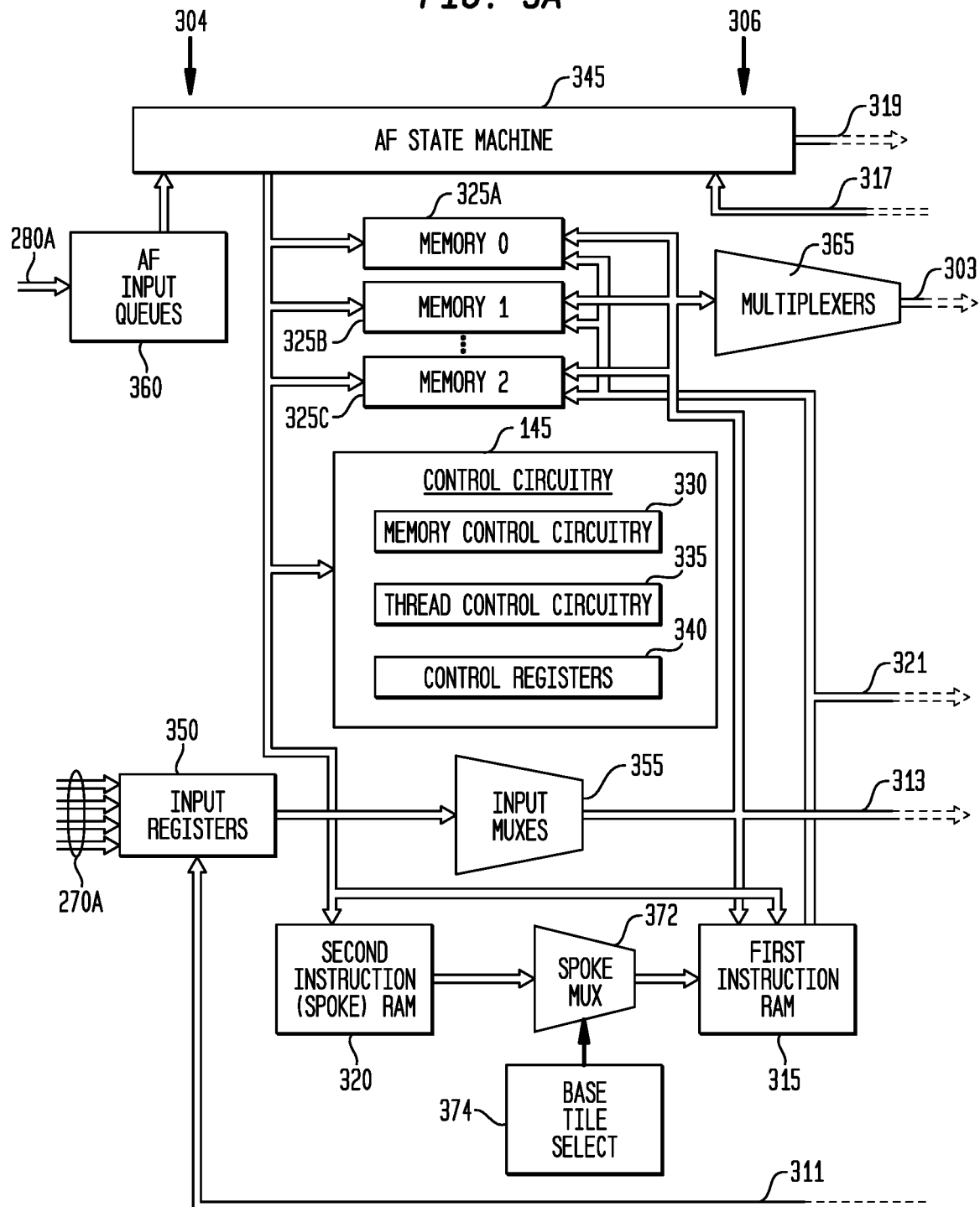
Figure 9B:
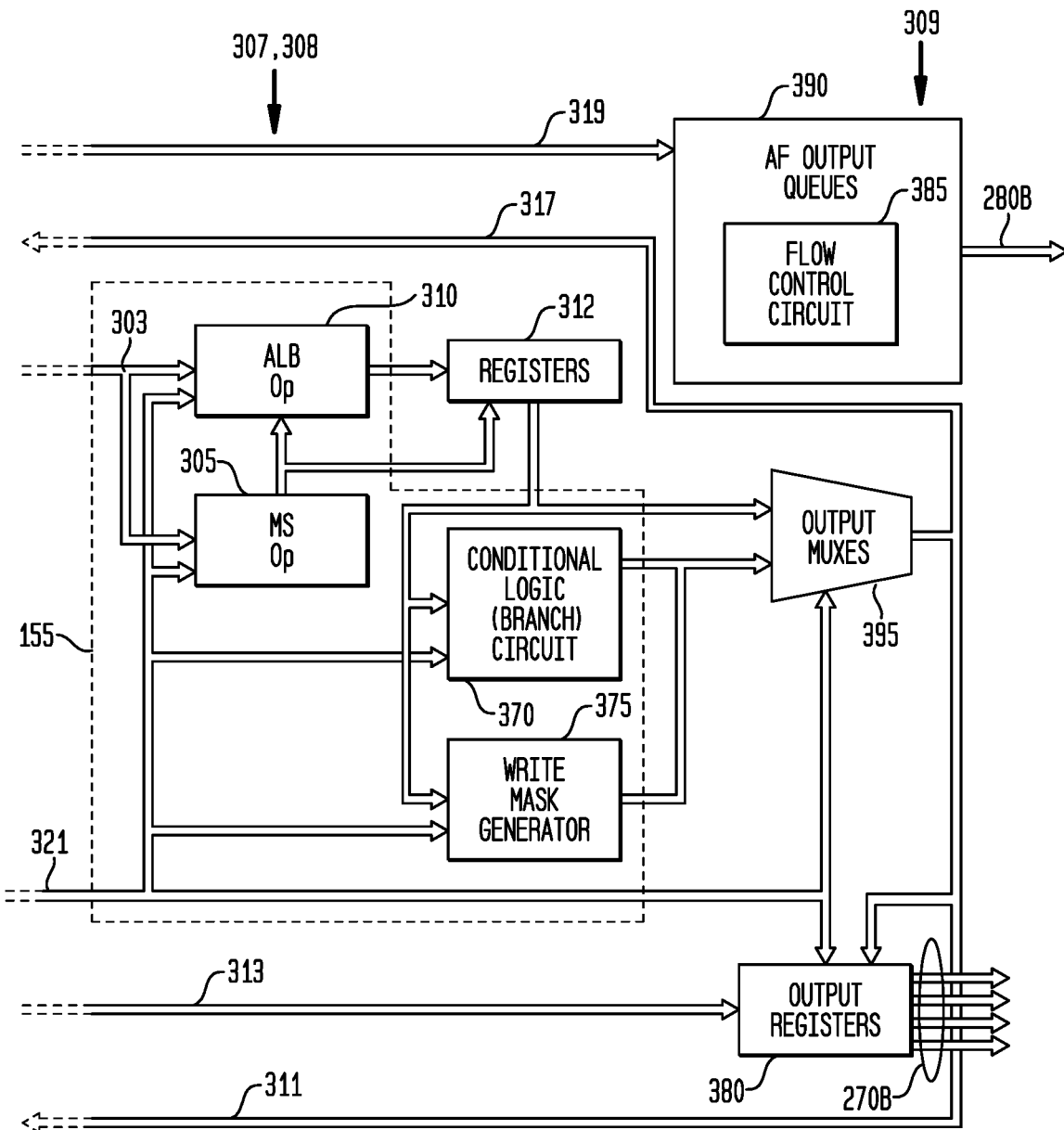

FIG. 8 is a high-level block diagram of a representative embodiment of a hybrid threading fabric configurable computing circuit 210, referred to as a "tile" 210. FIGS. 9, 9A and 9B, in which FIG. 9 is divided into FIGS. 9A and 9B (and collectively referred to as FIG. 9) are collectively detailed block diagram of a representative embodiment of a hybrid threading fabric configurable computing circuit 210A, referred to as a "tile" 210A, as a particular representative instantiation of a tile 210. Unless specifically referred to as a tile 210A, reference to a tile 210 shall mean and refer, individually and collectively, to a tile 210 and tile 210A. The hybrid threading fabric configurable computing circuit 210 is referred to as a "tile" 210 because all such hybrid threading fabric configurable computing circuits 210, in a representative embodiment, are identical to each other and can be arrayed and connected in any order, i.e., each hybrid threading fabric configurable computing circuit 210 can be "tiled" to form a hybrid threading fabric cluster 205.

Referring to FIGS. 1-9, a hybrid computing system 100 includes a hybrid threading processor ("HTP") 300, which is coupled through a first interconnection network 150 to one or more hybrid threading fabric ("HTF") circuits 200. It should be understood that term "fabric", as used herein, means and includes an array of computing circuits, which in this case are reconfigurable computing circuits. FIGS. 1, 2, and 3 show different system 100A, 100B, and 100C arrangements which include additional components forming comparatively larger and smaller systems 100, any and all of which are within the scope of the disclosure. As shown in FIGS. 1 and 2, which may each be an arrangement suitable for a system-on-a-chip ("SOC"), for example and without limitation, a hybrid computing system 100A, 100B, in various combinations as illustrated, may also include, optionally, a memory controller 120 which may be coupled to a memory 125 (which also may be a separate integrated circuit), any of various communication interfaces 130 (such as a PCIe communication interface), one or more host processor(s) 110, and a host interface ("HIF") 115. As shown in FIG. 3, which may each be an arrangement suitable for a "chiplet" configuration on a common substrate 101, for example and without limitation, a hybrid computing system 100C may also include, optionally, a communication interface 130, with or without these other components. Any and all of these arrangements are within the scope of the disclosure, and collectivey are referred to herein as a system 100. Any of these hybrid computing systems 100 also may be considered a "node", operating under a single operating system ("OS"), and may be coupled to other such local and remote nodes as well.

Hybrid threading, as used herein, refers to the capability to spawn multiple fibers and threads of computation across different, heterogeneous types of processing circuits (hardware), such as across HTF circuits 200 (as a reconfigurable computing fabric) and across a processor, such as a RISC-V processor. Hybrid threading also refers to a programming language/style in which a thread of work transitions from one compute element to the next to move the compute to where the data is located, which is also implemented in representative embodiments. Also in a representative embodiment, the HTP 300 is a RISC-V ISA based multi-threaded processor. The HTP 300 provides barrel-style, round-robin instantaneous thread switching to maintain a high instruction-per-clock rate. A host processor 110 is typically a multi-core processor, which may be embedded within the hybrid computing system 100, or which may be an external host processor coupled into the hybrid computing system 100 via a communication interface 130, such as a PCIe-based interface. These processors, such as the HTP 300 and the one or more host processor(s) 110, are described in greater detail below.

The memory controller 120 may be implemented as known or becomes known in the electronic arts. Alternatively, in a representative embodiment, the memory controller 120 may be implemented as described in the related applications. The memory 125 also may be implemented as known or becomes known in the electronic arts, and as described in greater detail below.

The HIF 115, for the purposes herein, provides for a host processor 110 to send work to the HTP 300 and the HTF circuits 200, and for the HTP 300 to send work to the HTF circuits 200, both as work descriptor packets transmitted over the first interconnection network 150. The HIF 115 includes a dispatch circuit and queue (abbreviated "dispatch queue" 105), which also provides management functionality for monitoring the load provided to and resource availability of the HTF circuits 200 and/or HTP 300. When resources are available on the HTF circuits 200 and/or HTP 300, the dispatch queue 105 determines the HTF circuit 200 and/or HTP 300 resource that is least loaded. In the case of multiple HTF circuit clusters 205 with the same or similar work loading, it chooses an HTF circuit cluster 205 that is currently executing the same kernel if possible (to avoid having to load or reload a kernel configuration). Similar functionality of the HIF 115 may also be included in an HTP 300, for example, particularly for system 100 arrangements which may not include a separate HIF 115. Other HIF 115 functions are described in greater detail below. An HIF 115 may be implemented as known or becomes known in the electronic arts, e.g., as one or more state machines with registers (forming FIFOs, queues, etc.).

The first interconnection network 150 is a packet-based communication network providing data packet routing between and among the HTF circuits 200, the hybrid threading processor 300, and the other optional components such as the memory controller 120, a communication interface 130, and a host processor 110. The first interconnection network 150 is typically embodied as a plurality of crossbar switches having a folded clos configuration, and typically a mesh network for additional connections, depending upon the system 100 embodiment. For purposes of the present disclosure, the first interconnection network 150 forms part of an asynchronous switching fabric ("AF"), meaning that a data packet may be routed along any of various paths, such that the arrival of any selected data packet at an addressed destination may occur at any of a plurality of different times, depending upon the routing. This is in contrast with the synchronous mesh communication network 275 of the second interconnection network 250 discussed in greater detail below.

A HTF circuit 200, in turn, typically comprises a plurality of HTF circuit clusters 205, with each HTF circuit cluster 205 coupled to the first interconnection network 150 for data packet communication. Each HTF circuit cluster 205 may operate independently from each of the other HTF circuit clusters 205. Each HTF circuit cluster 205, in turn, comprises an array of a plurality of HTF reconfigurable computing circuits 210, which are referred to equivalently herein as "tiles" 210, and a second interconnection network 250. The tiles 210 are embedded in or otherwise coupled to the second interconnection network 250, which comprises two different types of networks, discussed in greater detail below. In a representative embodiment, each HTF circuit cluster 205 also comprises a memory interface 215, an optional first network interface 220 (which provides an interface for coupling to the first interconnection network 150), and a dispatch interface 225. The various memory interfaces 215, the dispatch interface 225, and the optional first network interface 220 may be implemented using any appropriate circuitry, such as one or more state machine circuits, to perform the functionality specified in greater detail below.

As an overview, the HTF circuit 200 is a course grained reconfigurable compute fabric comprised of interconnected compute tiles 210. The tiles 210 are interconnected with a synchronous fabric referred to as the synchronous mesh communication network 275, allowing data to traverse from one tile 210 to another tile 210 without queuing. This synchronous mesh communication network 275 allows many tiles 210 to be pipelined together to produce a continuous data flow through arithmetic operations, and each such pipeline of tiles 210 connected through the synchronous mesh communication network 275 for performance of one or more threads of computation is referred to herein as a "synchronous domain", which may have series connections, parallel connections, and potentially branching connections as well. The first tile 210 of a synchronous domain is referred to herein as a "base" tile 210.

Figure 16:
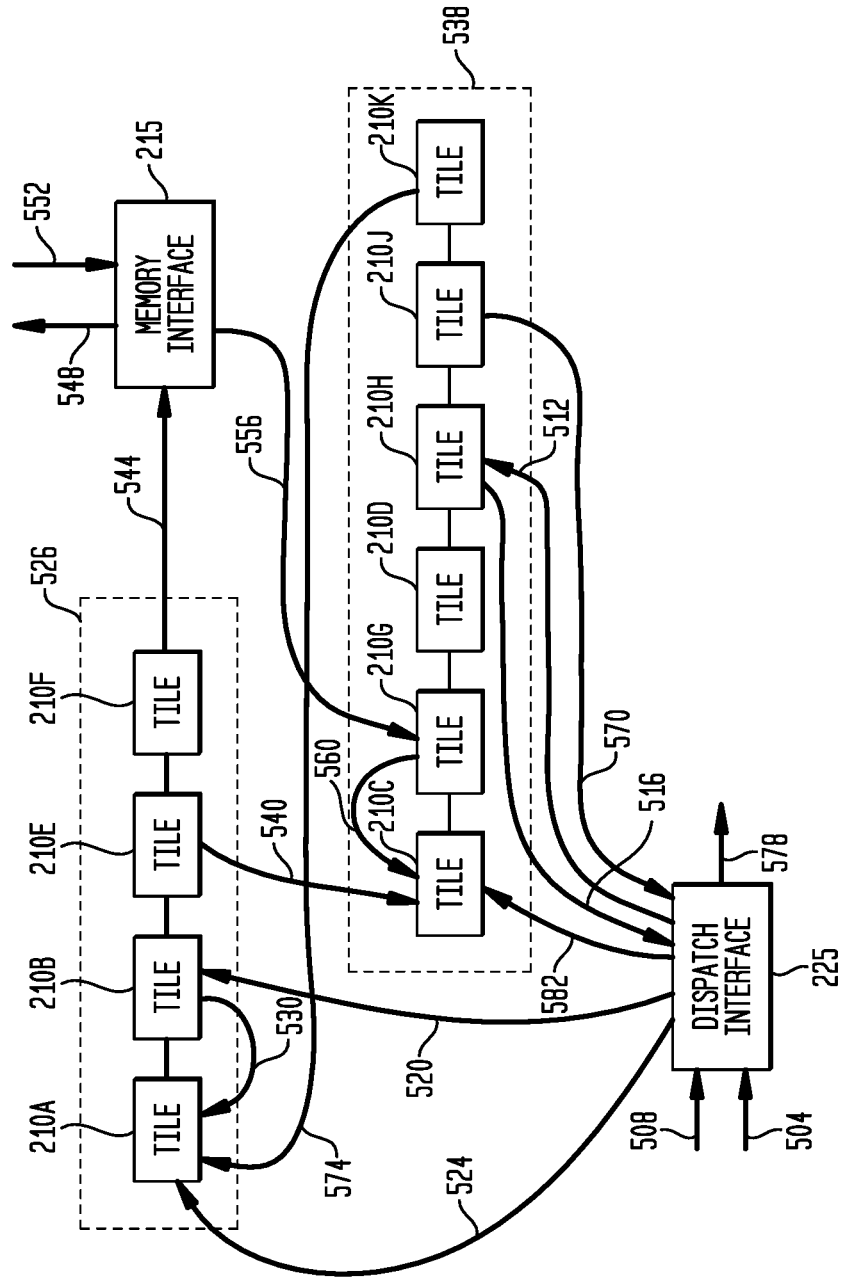
FIG. 16 is a diagram of representative hybrid threading fabric configurable computing circuits (tiles) forming synchronous domains and representative asynchronous packet network messaging for performance of a computation by a hybrid threading fabric circuit cluster.
Figure 18:
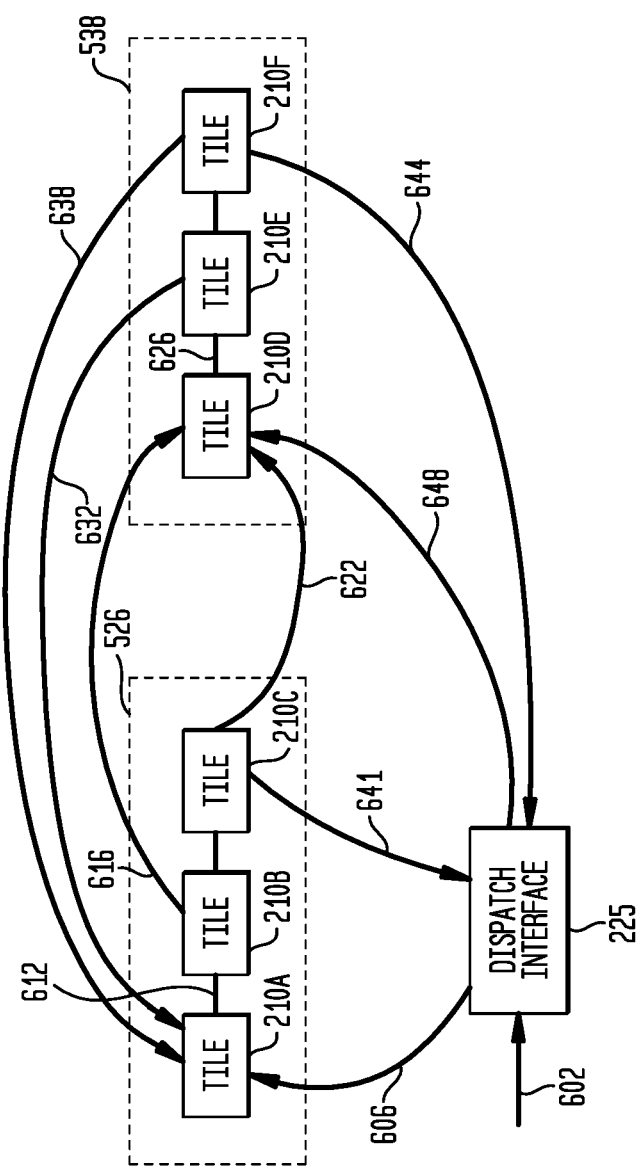
FIG. 18 is a diagram of representative hybrid threading fabric configurable computing circuits (tiles) forming synchronous domains and representative asynchronous packet network messaging for performance of a computation by a hybrid threading fabric circuit cluster.
Figure 20:
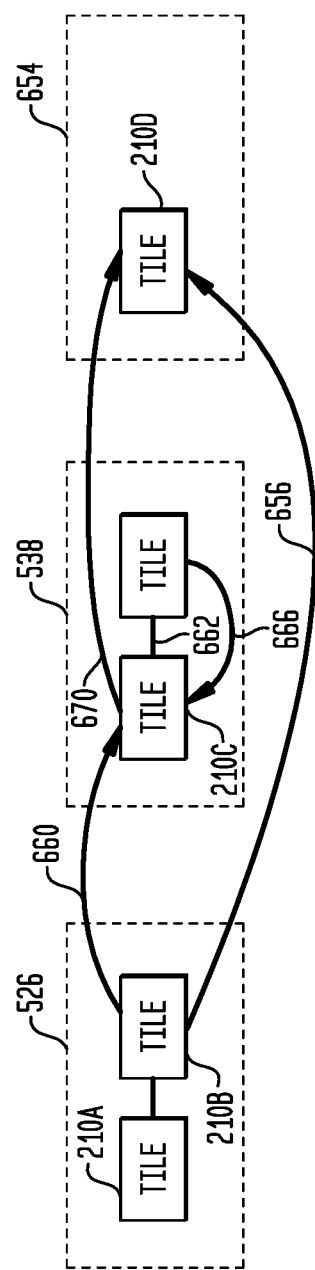
FIG. 20 is a diagram of representative hybrid threading fabric configurable computing circuits (tiles) forming synchronous domains and representative asynchronous packet network messaging for performance of a loop in a computation by a hybrid threading fabric circuit cluster.

The tiles 210 are also interconnected with an asynchronous fabric referred to as an asynchronous packet network 265 that allows synchronous domains of compute to be bridged by asynchronous operations, with all packets on the asynchronous packet network 265 capable of being communicated in a single clock cycle in representative embodiments. These asynchronous operations include initiating synchronous domain operations, transferring data from one synchronous domain to another, accessing system memory 125 (read and write), and performing branching and looping constructs. Together, the synchronous and asynchronous fabrics allow the tiles 210 to efficiently execute high level language constructs. The asynchronous packet network 265 differs from the first interconnection network 150 in many ways, including requiring less addressing, being a single channel, being queued with a depth-based backpressure, and utilizing packed data operands, such as with a data path of 128 bits, for example and without limitation. It should be noted that the internal data paths of the various tiles 210 are also 128 bits, also for example and without limitation. Examples of synchronous domains, and examples of synchronous domains communicating with each other over the asynchronous packet network 265, are illustrated in FIGS. 16, 18, 20, for example and without limitation.

In a representative embodiment, under most circumstances, thread (e.g., kernel) execution and control signaling are separated between these two different networks, with thread execution occurring using the synchronous mesh communication network 275 to form a plurality of synchronous domains of the various tiles 210, and control signaling occurring using messaging packets transmitted over the asynchronous packet network 265 between and among the various tiles 210. For example, the plurality of configurable circuits are adapted to perform a plurality of computations using the synchronous mesh communication network 275 to form a plurality of synchronous domains, and the plurality of configurable circuits are further adapted to generate and transmit a plurality of control messages over the asynchronous packet network 265, with the plurality of control messages comprising one or more completion messages and continue messages, for example and without limitation.

In a representative embodiment, the second interconnection network 250 typically comprises two different types of networks, each providing data communication between and among the tiles 210, a first, asynchronous packet network 265 overlaid or combined with a second, synchronous mesh communication network 275, as illustrated in FIGS. 6 and 7. The asynchronous packet network 265 is comprised of a plurality of AF switches 260, which are typically implemented as crossbar switches (which may or may not additionally or optionally have a Clos or Folded Clos configuration, for example and without limitation), and a plurality of communication lines (or wires) 280, 285, connecting the AF switches 260 to the tiles 210, providing data packet communication between and among the tiles 210 and the other illustrated components discussed below. The synchronous mesh communication network 275 provides a plurality of direct (i.e., unswitched, point-to-point) connections over communication lines (or wires) 270 between and among the tiles 210, which may be register-staged at the inputs and outputs of the tile 210, but otherwise without queuing between tiles 210, and without requiring formation of a data packet. (In FIG. 6, to better illustrate the overlaying of the two networks with tiles 210 embedded in the second interconnection network 250, the tiles 210 are represented as the vertices of the synchronous mesh communication network 275, and the AF switches 260 are illustrated as "Xs", as indicated.)

Referring to FIG. 8, a tile 210 comprises one or more configurable computation circuits 155, control circuitry 145, one or more memories 325, a configuration memory (e.g., RAM) 160, synchronous network input(s) 135 (coupled to the synchronous mesh communication network 275), synchronous network output(s) 170 (also coupled to the synchronous mesh communication network 275), asynchronous (packet) network input(s) 140 (coupled to the asynchronous packet network 265), and asynchronous (packet) network output(s) 165 (also coupled to the asynchronous packet network 265). Each of these various components are shown coupled to each other, in various combinations as illustrated, over busses 180, 185. Those having skill in the electronic arts will recognize that fewer or more components may be included in a tile 210, along with any of various combinations of couplings, any and all of which are considered equivalent and within the scope of the disclosure.

Representative examples of each of these various components are illustrated and discussed below with reference to FIG. 9. For example, in a representative embodiment, the one or more configurable computation circuits 155 are embodied as a multiply and shift operation circuit ("MS Op") 305 and an Arithmetic, Logical and Bit Operation circuit ("ALB Op") 310, with associated configuration capabilities, such as through intermediate multiplexers 365, and associated registers, such as registers 312, for example and without limitation. Also in a representative embodiment, the one or more configurable computation circuits 155 may include a write mask generator 375 and conditional (branch) logic circuitry 370, also for example and without limitation. Also in a representative embodiment, control circuitry 145 may include memory control circuitry 330, thread control circuitry 335, and control registers 340, such as those illustrated for a tile 210A, for example and without limitation. Continuing with the examples, synchronous network input(s) 135 may be comprised of input registers 350 and input multiplexers 355, synchronous network output(s) 170 may be comprised of output registers 380 and output multiplexers 395, asynchronous (packet) network input(s) 140 may be comprised of AF input queues 360 and asynchronous (packet) network output(s) 165 may be comprised of AF output queues 390, and may also include or share an AF message state machine 345.

Significantly, and as discussed in greater detail below, the configuration memory (e.g., RAM) 160 is comprised of configuration circuitry (such as configuration memory multiplexer 372) and two different configuration stores which perform different configuration functions, a first instruction RAM 315 (which is used to configure the internal data path of a tile 210) and a second instruction (and index) RAM 320, referred to herein as a "spoke" RAM 320 (which is used for multiple purposes, including to configure portions of a tile 210 which are independent from a current instruction, to select a current instruction and an instruction of a next tile 210, and to select a master synchronous input, among other things, all as discussed in greater detail below).

As illustrated in FIG. 8 and FIG. 9, the communication lines (or wires) 270 are illustrated as communication lines (or wires) 270A and 270B, such that communication lines (or wires) 270A are the "inputs" (input communication lines (or wires)) feeding data into the input registers 350, and the communication lines (or wires) 270B are the "outputs" (output communication lines (or wires)) moving data from the output registers 380. In a representative embodiment, there are a plurality of sets or busses of communication lines (or wires) 270 into and out of each tile 210, from and to each adjacent tile (e.g., synchronous mesh communication network 275 up link, down link, left link, and right link), and from and to other components for distribution of various signals, such as data write masks, stop signals, and instructions or instruction indices provided from one tile 210 to another tile 210, as discussed in greater detail below. Alternatively, and not separately illustrated, there may also be various dedicated communication lines, such as for asserting a stop signal, such that a stop signal generated from any tile 210 in a HTF circuit cluster 205 can be received promptly, in a limited number of clock cycles, by all other tiles 210 in the HTF circuit cluster 205.

It should be noted that there are various fields in the various sets or busses of communication lines forming the synchronous mesh communication network 275. For example, FIG. 8 and FIG. 9 illustrate four busses of incoming and outgoing communication lines (or wires) 270A and 270B, respectively. Each one of these sets of communication lines (or wires) 270A and 270B may carry different information, such as data, an instruction index, control information, and thread information (such as TID, XID, loop dependency information, write mask bits for selection of valid bits, etc.). One of the inputs 270A may also be designated as a master synchronous input, including input internal to a tile 210 (from feedback of an output), which can vary for each time slice of a tile 210, which may have the data for an instruction index for that tile 210 of a synchronous domain, for example and without limitation, discussed in greater detail below.

In addition, as discussed in greater detail below, for any input received on the synchronous mesh communication network 275 and held in one or more input registers 350 (of the synchronous network input(s) 135), each tile 210 may transfer that input directly to one or more output registers 380 (of the synchronous network output(s) 170) for output (typically on a single clock cycle) to another location of the synchronous mesh communication network 275, thereby allowing a first tile 210 to communicate, via one or more intermediate, second tiles 210, with any other third tile 210 within the HTF circuit cluster 205. This synchronous mesh communication network 275 enables configuration (and reconfiguration) of a statically scheduled, synchronous pipeline between and among the tiles 210, such that once a thread is started along a selected data path between and among the tiles 210, as a synchronous domain, completion of the data processing will occur within a fixed period of time. In addition, the synchronous mesh communication network 275 serves to minimize the number of any required accesses to memory 125, as accesses to memory 125 may not be required to complete the computations for that thread be performed along the selected data path between and among the tiles 210.

In the asynchronous packet network 265, each AF switch 260 is typically coupled to a plurality of tiles 210 and to one or more other AF switches 260, over communication lines (or wires) 280. In addition, one or more selected AF switches 260 are also coupled (over communication lines (or wires) 285) to one or more of the memory interface 215, the optional first network interface 220, and the dispatch interface 225. As illustrated, as an example and without limitation, the HTF circuit cluster 205 includes a single dispatch interface 225, two memory interfaces 215, and two optional first network interfaces 220. Also as illustrated, as an example and without limitation, in addition to being coupled to the other AF switches 260, one of the AF switches 260 is further coupled to a memory interface 215, to an optional first network interface 220, and to the dispatch interface 225, while another one of the AF switches 260 is further coupled to a memory interface 215 and to the optional first network interface 220.

Depending upon the selected embodiment, each of the memory interfaces 215 and the dispatch interface 225 may also be directly connected to the first interconnection network 150, with capability for receiving, generating, and transmitting data packets over both the first interconnection network 150 and the asynchronous packet network 265, and a first network interface 220 is not utilized or included in HTF circuit clusters 205. For example, the dispatch interface 225 may be utilized by any of the various tiles 210 for transmission of a data packet to and from the first interconnection network 150. In other embodiments, any of the memory interfaces 215 and the dispatch interface 225 may utilize the first network interface 220 for receiving, generating, and transmitting data packets over the first interconnection network 150, such as to use the first network interface 220 to provide additional addressing needed for the first interconnection network 150.

Those having skill in the electronic arts will recognize that the connections between and among the AF switches 260, the tiles 210, the optional first network interfaces 220, the memory interfaces 215, and the dispatch interface 225 may occur in any selected combination, with any selected number of components, and with any all such component selections and combinations considered equivalent and within the scope of the disclosure. Those having skill in the electronic arts will recognize that the division of the HTF circuit 200 into a plurality of HTF clusters 205 is not required, and merely provides a conceptual division for ease of describing the various components and the connections between and among the various components. For example, while a HTF circuit cluster 205 is illustrated as having sixteen tiles 210, with four AF switches 260, a single dispatch interface 225, two memory interfaces 215, and two first network interfaces 220 (optional), more or fewer of any of these components may be included in either or both a HTF circuit cluster 205 or a HTF circuit 200, and as described in greater detail below, for any selected embodiment, an HTF circuit cluster 205 may be partitioned to vary the number and type of component which may be active (e.g., powered on and functioning) at any selected time.

The synchronous mesh communication network 275 allows multiple tiles 210 to be pipelined without the need for data queuing. All tiles 210 that participate in a synchronous domain act as a single pipelined data path. The first tile of such a sequence of tiles 210 forming a single pipelined data path is referred to herein as a "base" tile 210 of a synchronous domain, and such a base tile 210 initiates a thread of work through the pipelined tiles 210. The base tile 210 is responsible for starting work on a predefined cadence referred to herein as the "spoke count". As an example, if the spoke count is three, then the base tile 210 can initiate work every third clock. It should also be noted that the computations within each tile 210 can also be pipelined, so that parts of different instructions can be performed while other instructions are executing, such as data being input for a next operation while a current operation is executing.

Each of the tiles 210, the memory interfaces 215, and the dispatch interface 225 has a distinct or unique address (e.g., as a 5-bit wide endpoint ID), as a destination or end point, within any selected HTF circuit cluster 205. For example, the tiles 210 may have endpoint IDs of 0-15, memory interfaces 215 (0 and 1) may have endpoint IDs of 20 and 21, and dispatch interface 225 may have endpoint ID of 18 (with no address being provided to the optional first network interface 220, unless it is included in a selected embodiment). The dispatch interface 225 receives a data packet containing work to be performed by one or more of the tiles 210, referred to as a work descriptor packet, which have been configured for various operations, as discussed in greater detail below. The work descriptor packet will have one or more arguments, which the dispatch interface 225 will then provide or distribute to the various tiles, as a packet or message (AF message) transmitted through the AF switches 260, to the selected, addressed tiles 210, and further, will typically include an identification of a region in tile memory 325 to store the data (argument(s)), and a thread identifier ("ID") utilized to track and identify the associated computations and their completion.

Messages are routed from source endpoint to destination endpoint through the asynchronous packet network 265. Messages from different sources to the same destination take different paths and may encounter different levels of congestion. Messages may arrive in a different order than when they are sent out. The messaging mechanisms are constructed to work properly with non-deterministic arrival order.

Figure 13:
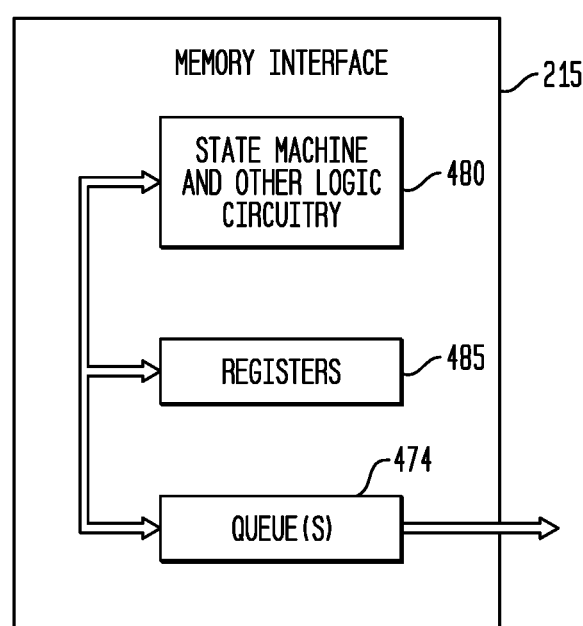
FIG. 13 is a block diagram of a representative embodiment of a memory interface.

FIG. 13 is a block diagram of a representative embodiment of a memory interface 215. Referring to FIG. 13, each memory interface 215 comprises a state machine (and other logic circuitry) 480, one or more registers 485, and optionally one or more queues 474. The state machine 480 receives, generates, and transmits data packets on the asynchronous packet network 265 and the first interconnection network 150. The registers 485 store addressing information, such as virtual addresses of tiles 210, physical addresses within a given node, and various tables to translate virtual addresses to physical addresses. The optional queues 474 store messages awaiting transmission on the first interconnection network 150 and/or the asynchronous packet network 265.

The memory interface 215 allows the tiles 210 within a HTF circuit cluster 205 to make requests to the system memory 125, such as DRAM memory. The memory request types supported by the memory interface 215 are loads, stores and atomics. From the memory interface 215 perspective, a load sends an address to memory 125 and data is returned. A write sends both an address and data to memory 125 and a completion message is returned. An atomic operation sends an address and data to memory 125, and data is returned. It should be noted that an atomic that just receives data from memory (i.e. fetch-and-increment) would be handled as a load request by the memory interface 215. All memory interface 215 operations require a single 64-bit virtual address. The data size for an operation is variable from a single byte to 64 bytes. Larger data payload sizes are more efficient for the device and can be used; however, the data payload size will be governed by the ability of the high level language compiler to detect access to large blocks of data.

Figure 14:
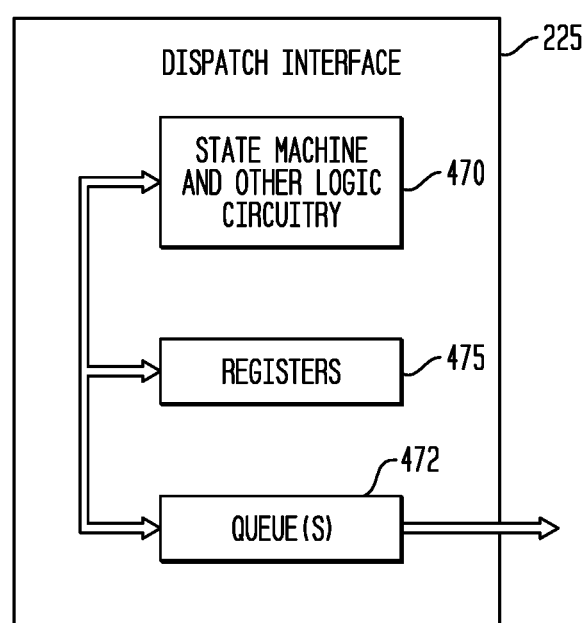
FIG. 14 is a block diagram of a representative embodiment of a dispatch interface.

FIG. 14 is a block diagram of a representative embodiment of a dispatch interface 225. Referring to FIG. 14, a dispatch interface 225 comprises a state machine (and other logic circuitry) 470, one or more registers 475, and one or more dispatch queues 472. The state machine 470 receives, generates, and transmits data packets on the asynchronous packet network 265 and the first interconnection network 150. The registers 475 store addressing information, such as virtual addresses of tiles 210, and a wide variety of tables tracking the configurations and workloads distributed to the various tiles, discussed in greater detail below. The dispatch queues 472 store messages awaiting transmission on the first interconnection network 150 and/or the asynchronous packet network 265.

As mentioned above, the dispatch interface 225 receives work descriptor call packet (messages), such as from the host interface 115, over the first interconnection network 150. The work descriptor call packet will have various information, such as a payload (e.g., a configuration, argument values, etc.), a call identifier (ID), and return information (for the provision of results to that endpoint, for example). The dispatch interface 225 will create various AF data messages for transmission over the asynchronous packet network 265 to the tiles 210, including to write data into memories 325, which tile 210 will be the base tile 210 (a base tile ID, for transmission of an AF completion message), a thread ID (thread identifier or "TID"), and will send a continuation message to the base tile 210 (e.g., with completion and other counts for each TID), so that the base tile 210 can commence execution once it has received sufficient completion messages. The dispatch interface 225 maintains various tables in registers 475 to track what has been transmitted to which tile 210, per thread ID and XID. As results are generated or executions completed, the dispatch interface 225 will receive AF data messages (indicating complete and with data) or AF completion messages (indicating completion but without data). The dispatch interface 225 has also maintained various counts (in registers 475) of the number of completion and data messages it will need to receive to know that kernel execution has completed, and will then assemble and transmit the work descriptor return data packets, with the resulting data, a call ID, the return information (e.g., address of the requestor), via the first interconnection network 150, and frees the TID. Additional features and functionality of the dispatch interface 225 are described in greater detail below.

It should be noted, as mentioned above, that multiple levels (or multiple types) of TIDs may be and typically are utilized. For example, the dispatch interface 225 allocates a first type of TID, from a pool of TIDs, which it transmits to a base tile 210. The base tile 210, in turn, may allocate additional TIDs, such as second and third types of TIDs, such as for tracking the threads utilized in loops and nested loops, for example and without limitation. These different TIDs then can also be utilized to access variables which are private to a given loop. For example, a first type of TID may be used for an outer loop, and second and third types of TIDs may be utilized to track iterations of nested loops.

It should also be noted that a separate transaction ID is utilized for tracking various memory requests over the first interconnection network 150.

Figure 15:
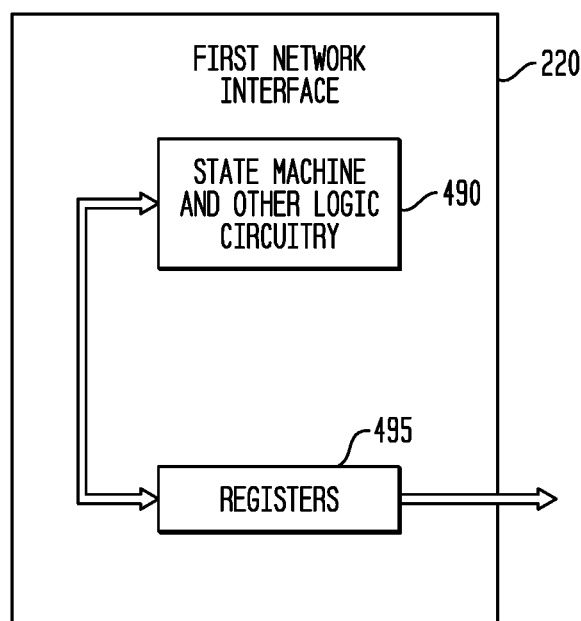
FIG. 15 is a block diagram of a representative embodiment of an optional first network interface.

FIG. 15 is a block diagram of a representative embodiment of an optional first network interface. Referring to FIG. 15, when included each first network interface 220 comprises a state machine (and other logic circuitry) 490 and one or more registers 495. The state machine 490 receives, generates, and transmits data packets on the asynchronous packet network 265 and the first interconnection network 150. The registers 495 store addressing information, such as virtual addresses of tiles 210, physical addresses within a given node, and various tables to translate virtual addresses to physical addresses.

Referring again to FIG. 9, a representative HTF reconfigurable computing circuit (tile) 210A comprises at least one multiply and shift operation circuit ("MS Op") 305, at least one Arithmetic, Logical and Bit Operation circuit ("ALB Op") 310, a first instruction RAM 315, a second, instruction (and index) RAM 320 referred to herein as a "spoke" RAM 320, one or more tile memory circuits (or memory) 325 (illustrated as memory "0" 325A, memory "1" 325B, through memory "N" 325C, and individually and collectively referred to as memory 325 or tile memory 325). In addition, as previously mentioned, a representative tile 210A also typically includes input registers 350 and output registers 380 coupled over communication lines (or wires) 270A, 270B to the synchronous mesh communication network 275, and AF input queues 360 and AF output queues 390 coupled over the communication lines (or wires) 280 of the asynchronous packet network 265 to the AF switches 260. Control circuits 145 are also typically included in a tile 210, such as memory control circuitry 330, thread control circuitry 335, and control registers 340 illustrated for a tile 210A. For decoding and for preparing (assembling) data packets received from or provided to the asynchronous packet network 265, an AF message state machine 345 is also typically included in a tile 210. As part of configurability of the tile 210, one or more multiplexers are typically included, illustrated as input multiplexer 355, output multiplexer 395, and one or more intermediate multiplexer(s) 365 for selection of the inputs to the MS Op 305 and the ALB Op 310. Optionally, other components may also be included in a tile 210, such as conditional (branch) logic circuit 370, write mask generator 375, and flow control circuit 385 (which is illustrated as included as part of the AF output queues 390, and which may be provided as a separate flow control circuit, equivalently). The capabilities of the MS Op 305 and the ALB Op 310 are described in greater detail below.

The synchronous mesh communication network 275 transfers information required for the synchronous domain to function. The synchronous mesh communication network 275 includes the fields specified below. In addition, many of the parameters used in these fields are also stored in the control registers 340, and are assigned to a thread to be executed in the synchronous domain formed by a plurality of tiles 210. The specified fields of the synchronous mesh communication network 275 include:

1. Data, typically having a field width of 64 bits, and comprising computed data being transferred from one tile 210 to the next tile 210 in a synchronous domain.

2. An instruction RAM 315 address, abbreviated "INSTR", typically having a field width of 8 bits, and comprising an instruction RAM 315 address for the next tile 210. The base tile 210 specifies the instruction RAM 315 address for the first tile 210 in the domain. Subsequent tiles 210 can pass the instruction unmodified, or can conditionally change the instruction for the next tile 210 allowing conditional execution (i.e. if-then-else or switch statements), described in greater detail below.

3. A thread identifier, referred to herein as a "TID", typically having a field width of 8 bits, and comprising a unique identifier for threads of a kernel, with a predetermined number of TIDs (a "pool of TIDs") stored in the control registers 340 and potentially available for use by a thread (if not already in use by another thread). The TID is allocated at a base tile 210 of a synchronous domain and can be used as a read index into the tile memory 325. The TID can be passed from one synchronous domain to another through the asynchronous packet network 265. As there are a finite number of TIDs available for use, to perform other functions or computations, eventually the TID should be freed back to the allocating base tile's TID pool for subsequent reuse. The freeing is accomplished using an asynchronous fabric message transmitted over the asynchronous packet network 265.

4. A transfer identifier referred to as an "XID", typically having a field width of 8 bits, and comprising a unique identifier for transferring data from one synchronous domain to another, with a predetermined number of XIDs (a "pool of XIDs") stored in the control registers 340 and potentially available for use by a thread (if not already in use by another thread). The transfer may be a direct write of data from one domain to another, as an "XID_WR", or it may be the result of a memory 125 read (as an "XID_RD") where the source domain sends a virtual address to memory 125 and the destination domain receives memory read data. The XID_WR is allocated at the base tile 210 of the source domain. The XID_WR in the source domain becomes the XID_RD in the destination domain. The XID_WR can be used as a write index for tile memory 325 in the destination domain. XID_RD is used in the destination domain as a tile memory 325 read index. As there are a finite number of XIDs available for use, to perform other functions or computations, eventually the XID should be freed back to the allocating base tile's XID pool for subsequent reuse. The destination domain should free the XID by sending an asynchronous message to the source domain's base tile 210, also over the asynchronous packet network 265.

The synchronous mesh communication network 275 provides both data and control information. The control information (INSTR, XID, TID) is used to setup the data path, and the DATA field can be selected as a source for the configured data path. Note that the control fields are required much earlier (to configure the data path) than the data field. In order to minimize the synchronous domain pipeline delay through a tile 210, the control information arrives at a tile 210 a few clock cycles earlier than the data.

A particularly inventive feature of the architecture of the HTF circuit 200 and its composite HTF circuit clusters 205 and their composite tiles 210 is the use of two different configuration RAMs, the instruction RAM 315 for data path configuration, and the spoke RAM 320 for multiple other functions, including configuration of portions of a tile 210 which are independent from any selected or given data path, selection of data path instructions from the instruction RAM 315, selection of the master synchronous input (among the available inputs 270A) for each clock cycle, and so on. As discussed in greater detail below, this novel use of both an instruction RAM 315 and an independent spoke RAM 320 enables, among other things, dynamic self-configuration and self-reconfiguration of the HTF circuit cluster 205 and of the HTF circuit 200 as a whole.

Each tile has an instruction RAM 315 that contains configuration information to setup the tile 210 data path for a specific operation, i.e., data path instructions that determine, for example, whether a multiplication, a shift, an addition, etc. will be performed in a given time slice of the tile 210, and using which data (e.g., data from a memory 325, or data from an input register 350). The instruction RAM 315 has multiple entries to allow a tile 210 to be time sliced, performing multiple, different operations in a pipelined synchronous domain, with representative pipeline sections 304, 306, 307, 308, and 309 of a tile 210 illustrated in FIG. 9. Any given instruction may also designate which inputs 270A will have the data and/or control information to be utilized by that instruction. Additionally, each time slice could conditionally perform different instructions depending on previous tile 210 time slice data dependent conditional operations, discussed with reference to FIG. 24. The number of entries within the instruction RAM 315 typically will be on the order of 256. The number may change depending on the experience gained from porting kernels to the HTF 200.

The supported instruction set should match the needs of the target applications, such as for applications having data types of 32 and 64-bit integer and floating point values. Additional applications such as machine learning, image analysis, and 5G wireless processing may be performed using the HTF 200. This total set of applications would need 16, 32 and 64-bit floating point, and 8, 16, 32 and 64-bit integer data types. The supported instruction set needs to support these data types for load, store and arithmetic operations. The operations supported need to allow a compiler to efficiently map high level language source to tile 210 instructions. In a representative embodiment, the tiles 210 support the same instruction set as a standard high performance processor, including single instruction multiple data (SIMD) instruction variants.

The spoke RAM 320 has multiple functions, and in representative embodiments, one of those functions is to be utilized to configure parts of (a time slice of) the tile 210 that is or are independent of the current instruction for the data path, i.e., the tile 210 configurations held in the spoke RAM 320 can be used to configure invariant parts of the configuration of the tile 210, e.g., those settings for the tile 210 which remain the same across different data path instructions. For example, the spoke RAM 320 is used to specify which input (e.g., one of several sets of input communication lines 270A or input registers 350) of the tile 210 is the master synchronous input for each clock cycle, as the selection control of input multiplexer(s) 355. This is significant because the instruction index to select an instruction (from the instruction RAM 315) for a given time slice of the tile 210, and a thread ID (TID), is provided on the master synchronous input. As a result, even if the actual instruction index provided on an input 270A to a given tile 210 may be varied (as described with reference to FIG. 24), what set of inputs 270A that will have that selected instruction index is not varied, so that any given tile 210 knows in advance what input it will use to receive a selected instruction index, independently of the instruction specified by that selected instruction index. The configurations held in the spoke RAM 320 also usually designate which outputs 270B will be utilized for the selected instruction (or time slice). The spoke RAM 320 read address input, i.e., the spoke index, comes from a counter that counts (modulo) from zero to the spoke count minus one. All tiles 210 within an HTF circuit cluster 205 generally should have the same spoke RAM input value each clock to have proper synchronous domain operation. The spoke RAM 320 also stores instruction indices and is also utilized to select instructions from the instruction RAM 315, so that a series of instructions may be selected for execution by the tile 210 as the count of the spoke RAM 320 changes, for a base tile 210 of a synchronous domain. For subsequent tiles in the synchronous domain, the instruction index may be provided by a previous tile 210 of the synchronous domain. This aspect of the spoke RAM 320 is also discussed with reference to FIG. 24, as the spoke RAM 320 is highly inventive, enabling dynamic self-configuration and reconfiguration of a HTF circuit cluster 205.

The spoke RAM 320 also specifies when a synchronous input 270A is to be written to tile memory 325. This situation occurs if multiple inputs are required for a tile instruction, and one of the inputs arrives early. The early arriving input can be written to tile memory 325 and then later read from the memory 325 when the other inputs have arrived. The tile memory 325, for this situation, is accessed as a FIFO. The FIFO read and write pointers are stored in the tile memory region ram.

Each tile 210 contains one or more memories 325, and typically each are the width of the data path (64-bits), and the depth will be in the range of 512 to 1024 elements, for example. The tile memories 325 are used to store data required to support data path operations. The stored data can be constants loaded as part of a kernel's cluster 205 configuration, or variables calculated as part of the data flow. The tile memory 325 can be written from the synchronous mesh communication network 275 as either a data transfer from another synchronous domain, or the result of a load operation initiated by another synchronous domain. The tile memory is only read via synchronous data path instruction execution.

Tile memory 325 is typically partitioned into regions. A small tile memory region RAM stores information required for memory region access. Each region represents a different variable in a kernel. A region can store a shared variable (i.e., a variable shared by all executing threads). A scalar shared variable has an index value of zero. An array of shared variables has a variable index value. A region can store a thread private variable indexed by the TID identifier. A variable can be used to transfer data from one synchronous domain to the next. For this case, the variable is written using the XID_WR identifier in the source synchronous domain, and read using the XID_RD identifier in the destination domain. Finally, a region can be used to temporarily store data produced by a tile 210 earlier in the synchronous data path until other tile data inputs are ready. For this case, the read and write indices are FIFO pointers. The FIFO pointers are stored in the tile memory region RAM.

The tile memory region RAM typically contains the following fields:

1. A Region Index Upper, which are the upper bits of a tile memory region index. The lower index bits are obtained from an asynchronous fabric message, the TID, XID_WR or XID_RD identifiers, or from the FIFO read/write index values. The Region Index Upper bits are OR'ed with the lower index bits to produce the tile memory 325 index.

2. A Region SizeW, which is the width of a memory region's lower index. The memory region's size is $2^{SizeW}$ elements.

3. A Region FIFO Read Index, which is the read index for a memory region acting as a FIFO.

4. A Region FIFO Write Index, which is the write index for a memory region acting as a FIFO. The tile performs compute operations for the HTF 200.

The compute operations are performed by configuring the data path within the tile 210. There are two functional blocks that perform all compute for the tile 210: the multiply and shift operation circuit ("MS Op") 305, and the Arithmetic, Logical and Bit Operation circuit ("ALB Op") 310. The MS Op 305 and ALB Op 310 are under the control of the instructions from the instruction RAM 315, and can be configured to perform two pipelined operations such as a Multiply and Add, or Shift and AND, for example and without limitation. (In a representative embodiment, all devices that support the HTF 200 would have the complete supported instruction set. This would provide binary compatibility across all devices. However, it may be necessary to have a base set of functionality and optional instruction set classes to meet die size tradeoffs. This approach is similar to how the RISC-V instruction set has a base and multiple optional instruction subsets.) As illustrated in FIG. 9, the outputs of the MS Op 305 and ALB Op 310 may be provided to registers 312, or directly to other components, such as output multiplexers 395, conditional logic circuitry 370, and/or write mask generator 375.

The various operations performed by the MS Op 305 include, for example and without limitation: integer and floating point multiply, shift, pass either input, signed and unsigned integer multiply, signed and unsigned shift right, signed and unsigned shift left, bit order reversal, permutations, any and all of these operations as floating point operations, and interconversions between integer and floating point, such as double precision floor operations or convert floating point to integer. The various operations performed by the ALB Op 310 include, for example and without limitation: signed and unsigned addition, absolute value, negate, logical NOT, add and negate, subtraction A−B, reverse subtraction B−A, signed and unsigned greater than, signed and unsigned greater than or equal to, signed and unsigned less than, signed and unsigned less than or equal to, comparison (equal or not equal to), logical operations (AND, OR, XOR, NAND, NOR, NOT XOR, AND NOT, OR NOT, any and all of these operations as floating point operations, and interconversions between integer and floating point, such as floor operations or convert floating point to integer.

The inputs to the ALB Op 310 and the MS Op 305 are from either the synchronous tile inputs 270A (held in registers 350), from the internal tile memories 325, or from a small constant value provided within the instruction RAM 315. The following Table 1, showing tile 210 data path input sources, lists the typical inputs for the ALB Op 310 and the MS Op 305.

TABLE 1

| Source Name | Source Description |
| --- | --- |
| SYNC_U | Synchronous mesh communication network 275 up link |
| SYNC_D | Synchronous mesh communication network 275 down link |
| SYNC_L | Synchronous mesh communication network 275 left link |
| SYNC_R | Synchronous mesh communication network 275 right link |
| TILE_OUT | Output of ALB Op 310 within the tile 210. |
| RDMEM0_T | Memory 0 read data. Memory 325 region is indexed using TID from the Master Synchronous Interface. |
| RDMEM0_X | Memory 0 read data. Memory 325 region is indexed using XID from the Master Synchronous Interface. |
| RDMEM0_C | Memory 0 read data. Memory 325 region is indexed using instruction ram constant value. |
| RDMEM0_V | Memory 0 read data. Memory 325 region is indexed using value received from a synchronous input, as variable indexing. |
| RDMEM0_F | Memory 0 read data. Memory 325 region is read using FIFO ordering. |
| RDMEM0_Z | Memory 0 read data. Memory 325 region is indexed using the value zero. |

TABLE 1-continued

| Source Name | Source Description |
| --- | --- |
| RDMEM1_T | Memory 1 read data. Memory 325 region is indexed using TID from the Master Synchronous Interface. |
| RDMEM1_X | Memory 1 read data. Memory 325 region is indexed using XID from the Master Synchronous Interface. |
| RDMEM1_C | Memory 1 read data. Memory 325 region is indexed using instruction ram constant value. |
| RDMEM1_V | Memory 1 read data. Memory 325 region is indexed using value received from a synchronous input, as variable indexing. |
| RDMEM1_F | Memory 1 read data. Memory 325 region is read using FIFO ordering. |
| RDMEM1_Z | Memory 1 read data. Memory 325 region is indexed using the value zero. |
| CONST | The data path input is the zero extended constant value within an instruction. |
| ITER_IDX | The data path input is the zero extended loop iteration value, described in greater detail below. |
| ITER_W | The data path input is the zero extended loop iterator width value. See the loop section for more information. |

Each of the outputs 270B of a tile 210, as part of the communication lines 270 of the synchronous mesh communication network 275, are individually enabled allowing clock gating of the disabled outputs. The output of the ALB Op 310 can be sent to multiple destinations, shown in Table 2.

TABLE 2

| Destination Name | Destination Description |
| --- | --- |
| SYNC_U | Synchronous mesh communication network 275 up link |
| SYNC_D | Synchronous mesh communication network 275 down link |
| SYNC_L | Synchronous mesh communication network 275 left link |
| SYNC_R | Synchronous mesh communication network 275 right link |
| WRMEM0_Z | Write Memory 0. Memory 325 region is written using the value zero as the index. |
| WRMEM0_C | Write Memory 0. Memory 325 region is written using the instruction constant field as the index. |
| WRMEM0_T | Write Memory 0. Memory 325 region is written using the TID value as the index. |

At a high level, and all as representative examples without limitation, the general operation of a tile 210 is as follows. The synchronous mesh communication network 275 and synchronous domains of the various tiles 210 are all scheduled as part of the program compilation and when the configuration is loaded into the system. Unless paused or stopped, a tile 210 can execute its operations when all required inputs are ready, for example, data variables are in input registers 350 or memory 325, and are available to be read or taken from the registers or memory and used, as described in greater detail below. In a representative embodiment, each pipeline stage may operate in a single clock cycle, while in other representative embodiments, additional clock cycles may be utilized per pipeline stage. In a first pipeline stage 304, data is input, such as into the AF input queues 360 and input registers 350, and optionally directly into the memory 325. In a next pipeline stage 306, AF messages are decoded by AF state machine 345 and moved into memory 325; the AF state machine 345 reads data from memory 325 or received from the output multiplexers 395 and generates a data packet for transmission over the asynchronous packet network 265; data in the input registers 350 is moved into memory 325 or selected as operand data (using input multiplexers 355 and intermediate multiplexers 365), or passed directly to output registers 380 for output on the synchronous mesh communication network 275; for example. In one or more of the next pipeline stages 307 and 308, computations are performed by the ALB Op 310 and/or the MS Op 305, write masks may be generated by write mask generator 375, and instructions (or instruction indices) may be selected based on test conditions in conditional (branch) logic circuitry 370. In a next pipeline stage 309, outputs are selected using output multiplexers 395, and output messages (which may have been stored in the AF output queues 390) are transmitted on the asynchronous packet network 265, and output data in any of the output registers 380 are transmitted on the synchronous mesh communication network 275.

Figure 10:
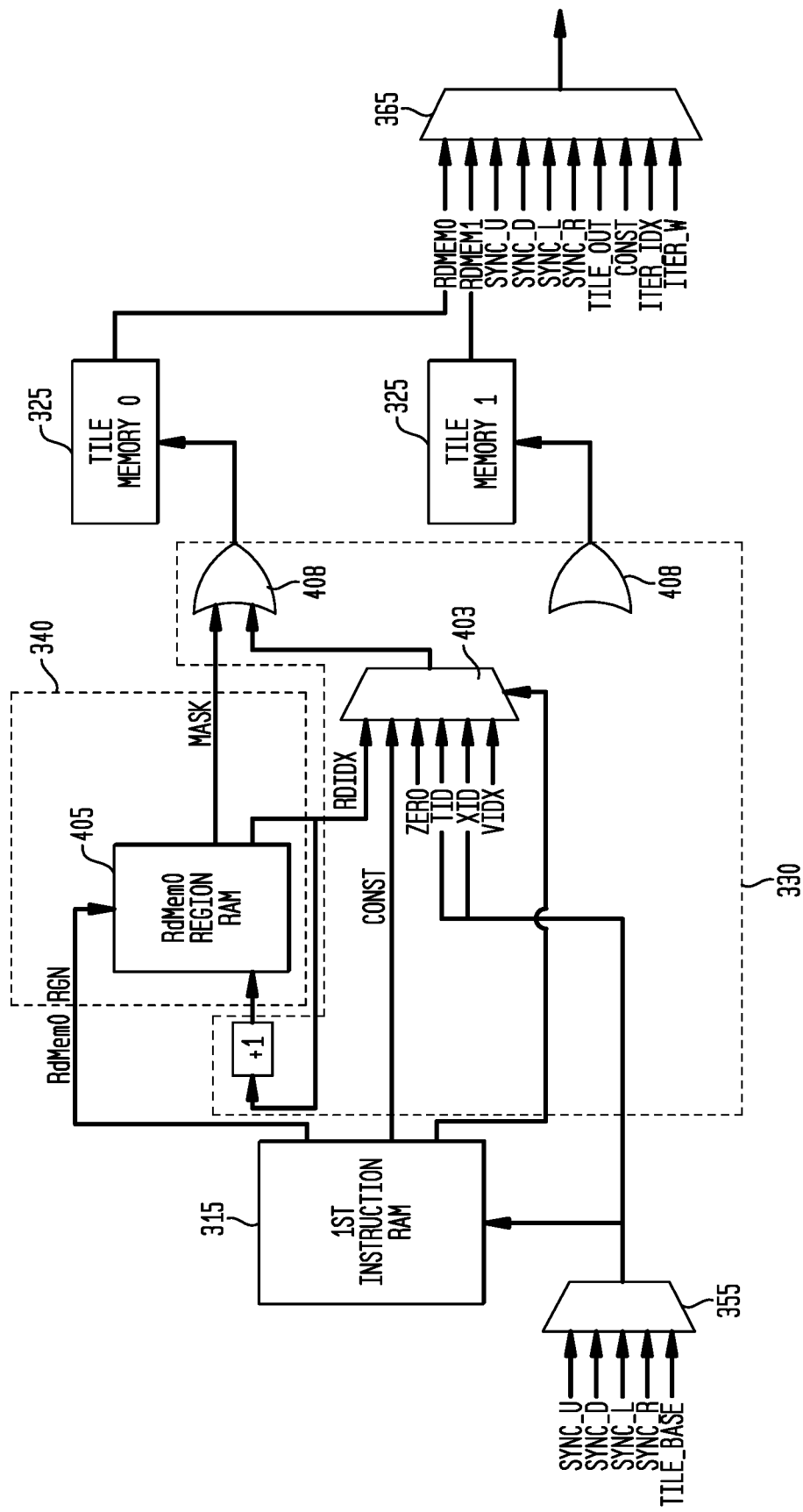
FIG. 10 is a detailed block diagram of a representative embodiment of a memory control circuit of a hybrid threading fabric configurable computing circuit (tile).

FIG. 10 is a detailed block diagram of a representative embodiment of a memory control circuit 330 (with associated control registers 340) of a hybrid threading fabric configurable computing circuit (tile) 210. FIG. 10 shows a diagram of the tile memory 325 read indexing logic of the memory control circuit 330, and is duplicated for each memory 325 (not separately illustrated). The instruction RAM 315 has a field that specifies which region of the tile memory 325 is being accessed, and a field that specifies the access indexing mode. The memory region RAM 405 (part of the control registers 340) specifies a region read mask that provides the upper memory address bits for the specific region. The mask is OR'ed (OR gate 408) in with the lower address bits supplied by the read index selection mux 403. The memory region RAM 405 also contains the read index value when the tile memory 325 is accessed in FIFO mode. The read index value in the RAM 405 is incremented and written back when accessing in FIFO mode. The memory region RAM 405, in various embodiments, may also maintain a top of TID stack through nested loops, described below.

FIG. 10 also shows the control information (INSTR, XID, TID) for the synchronous mesh communication network 275 is required a few clocks earlier than the data input. For this reason, the control information is sent out of the previous tile 210 a few clocks prior to sending the data. This staging of synchronous mesh communication network 275 information reduces the overall pipeline stages per tile 210, but it makes it challenging to use a calculated value as an index to the tile memories 325. Specifically, the synchronous mesh communication network 275 data may arrive too late to be used as an index into the tile memories 325. The architected solution to this problem is to provide the calculated index from a previous tile 210 in a variable index register of the control registers 340. Later, another input 270A causes the variable index register to be used as a tile memory 325 index.

The asynchronous packet network 265 is used to perform operations that occur asynchronous to a synchronous domain. Each tile 210 contains an interface to the asynchronous packet network 265 as shown in FIG. 9. The inbound interface (from communication lines 280A) is the AF input queues 360 (as a FIFO) to provide storage for messages that cannot be immediately processed. Similarly, the outbound interface (to communication lines 280B) is the AF output queues 390 (as a FIFO) to provide storage for messages that cannot be immediately sent out. The messages over the asynchronous packet network 265 can be classified as either data messages or control. Data messages contain a 64-bit data value that is written to one of the tile memories 325. Control messages are for controlling thread creation, freeing resources (TID or XID), or issuing external memory references. The following Table 3 lists the asynchronous packet network 265 outbound message operations:

The asynchronous packet network 265 allows messages to be sent and received from tiles 210 in different synchronous domains. There are few situations where it makes sense for a synchronous domain to send a message to itself, such as when a synchronous domain's base tile 210 allocates a TID, and the TID is to be freed by that same synchronous domain.

Figure 22:
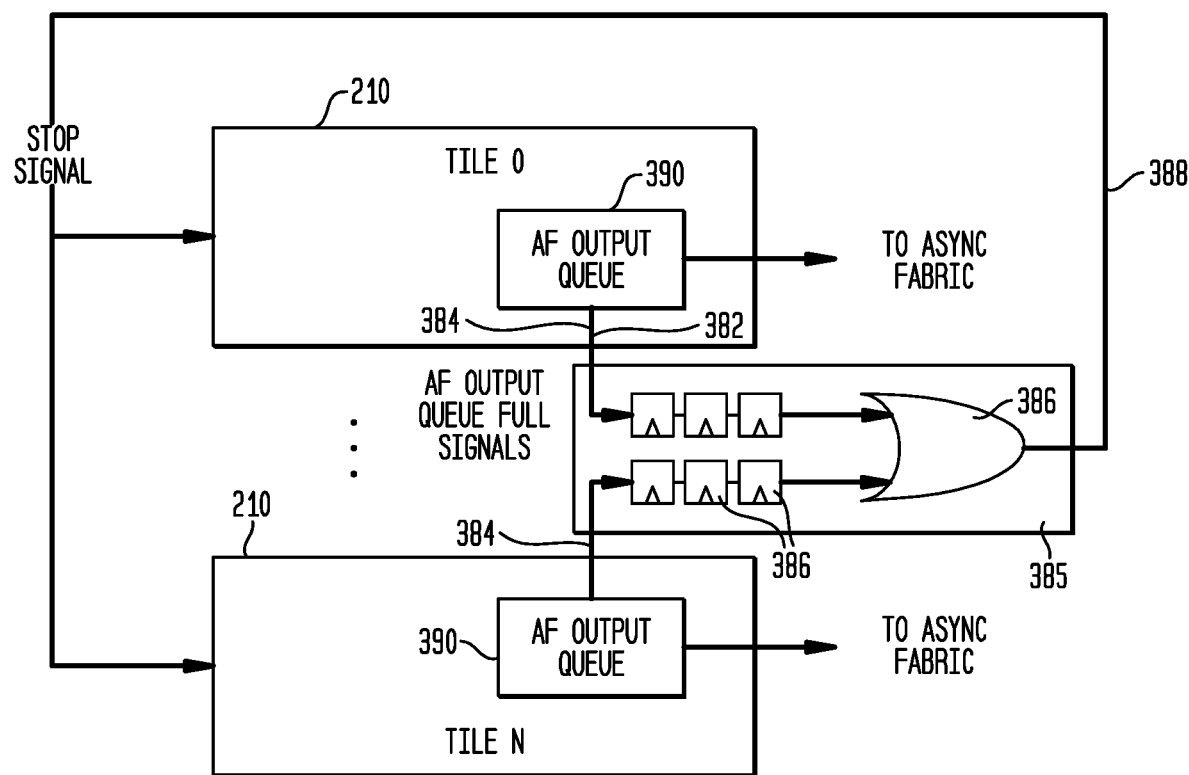
FIG. 22 is a block diagram of a representative flow control circuit.

The asynchronous packet network 265 can become congested if the synchronous domains of the various tiles 210 generate and send messages faster than they can be received, routed and processed by the asynchronous packet network 265 or receiving endpoints. In this situation, a backpressure mechanism is provided to alleviate any such congestion. FIG. 22 is a block diagram of a representative flow control circuit 385. Generally, there is at least one flow control circuit 385 per HTF circuit cluster 205. The tile 210 asynchronous fabric output queues 390 will hold messages as they wait to be sent on the asynchronous packet network

TABLE 3

| Operation Name | Operation Description |
| --- | --- |
| FREE_XID | A message sent to the base tile 210 of a synchronous domain to free an XID_RD. |
| FREE_TID | A message sent to the base tile 210 of a synchronous domain to free a TID. |
| CONT_X | A first type of continuation message sent to the base tile 210 of a synchronous domain to indicate that a thread should be initiated after a specified number of completion messages have been received. |
| CONT_T | A second type of continuation message sent to the base tile 210 of a synchronous domain to indicate that a thread should be initiated after a specified number of completion messages have been received. |
| INNER_LOOP | A message sent to initiate an inner loop of a strip mined loop construct. The message specifies the number of loop iterations to perform. A work thread is initiated for each iteration. The iteration index is available within the base tile 210 as an input to the data path source multiplexer 365 (ITER_IDX). |
| OUTER_LOOP | A message sent to initiate an outer loop of a strip mined loop construct. The message specifies the number of loop iterations to perform. A work thread is initiated for each iteration. The iteration index is available within the base tile 210 as an input to the data path source multiplexer 365 (ITER_IDX). |
| COMP | A completion message is sent to indicate a synchronous domain work thread has completed. A base tile 210 counts the received completion messages in conjunction with receiving a call or continue message in order to allow a subsequent work thread to be initiated. The message sends the TID identifier as the pause table index, described below. |
| CALL | A call message is sent to continue a work thread on the same or another synchronous domain. A TID and/or an XID can optionally be allocated when the work thread is initiated. |
| CALL_DATA | A call data message is sent to continue a work thread on the same or another synchronous domain. A TID and/or an XID can optionally be allocated when the work thread is initiated. This message sends 128 bits (two 64-bit values) to be written to tile memory 325 within the base tile 210, along with a mask indicating which bytes of the 128 bit value to write. This is generally also the case for all asynchronous messages |
| DATA_R | A message is sent to write to tile memory 325 of the destination tile 210. The TID value is used to specify the write index for the destination tile's memory. A completion message is sent once the tile memory 325 is written to specified base tile 210. |
| DATA_X | A message is sent to write to tile memory 325 of the destination tile 210. The XID_WR value is used to specify the write index for the destination tile's memory 325. A completion message is sent once the tile memory 325 is written to specified base tile 210. |
| LD_ADDR_T | A message is sent to the Memory Interface 215 to specify the address for a memory load operation. The TID identifier is used as the write index for the destination tile's memory. |
| LD_ADDR_X | A message is sent to the Memory Interface 215 to specify the address for a memory load operation. The XID_WR identifier is used as the write index for the destination tile's memory. |
| LD_ADDR_Z | A message is sent to the Memory Interface 215 to specify the address for a memory load operation. Zero is used as the write index for the destination tile's memory. |
| ST_ADDR | A message is sent to the Memory Interface 215 to specify the address for a memory store operation. |
| ST_DATA | A message is sent to the Memory Interface 215 to specify the data for a memory store operation. |

265. A predetermined threshold is provided for the output queue 390 that, when reached, will cause an output queue 390 of a tile 210 to generate an indicator, such as setting a bit, which is asserted as a "stop" signal 382 on a communication line 384 provided to the flow control circuit 385. Each communication line 384 from a tile 210 in a HTF circuit cluster 205 is provided to the flow control circuit 385. The flow control circuit 385 has one or more OR gates 386, which will continue to assert the stop signal 382 on communication line 388 distributed to all tiles 210 within the affected HTF circuit cluster 205, for as long as any one of the tiles 210 is generating a stop signal 382.

The stop signal 382 may be distributed over a dedicated communication line 388 which is not part of either the synchronous mesh communication network 275 or the asynchronous packet network 265 as illustrated, or over the synchronous mesh communication network 275. In a representative embodiment, there is a single stop signal 382 that all tile output queues 390 within a HTF circuit cluster 205 can assert, and all tiles 210 within that HTF circuit cluster 205 are held (paused or stopped) when a stop signal 382 is asserted. This stop signal 382 continues to allow all AF input queues 360 to receive AF messages and packets, avoiding deadlock, but also causes all synchronous domain pipelines to be held or paused (which also prevents the generation of additional AF data packets). The stop signal 382 allows the asynchronous packet network 265 to drain the tile 210 output queues 390 to the point where the number of messages in the output queue 390 (of the triggering output queue(s) 390) has fallen below the threshold level. Once the size of the output queue 390 has fallen below the threshold level, then the signal over the communication line 384 is returned to zero (the stop signal 382 is no longer generated) for that tile 210. When that has happened for all of the tiles 210 in the HTF circuit cluster 205, the signal on communication line 388 also returns to zero, meaning the stop signal is no longer asserted, and ending the stop or pause on the tiles 210.

The first or "base" tile 210 of a synchronous domain has the responsibility to initiate threads of work through the multi-tile 210 synchronous pipeline. A new thread can be initiated on a predetermined cadence. The cadence interval referred to herein as the "spoke count", as mentioned above. For example, if the spoke count is three, then a new thread of work can be initiated on the base tile 210 every three clocks. If starting a new thread is skipped (e.g., no thread is ready to start), then the full spoke count must be waited before another thread can be started. A spoke count greater than one allows each physical tile 210 to be used multiple times within the synchronous pipeline. As an example, if a synchronous domain is executed on a single physical tile and the spoke count is one, then the synchronous domain can contain only a single tile time slice. If, for this example the spoke count is four, then the synchronous domain can contain four tile time slices. Typically, a synchronous domain is executed by multiple tiles 210 interconnected by the synchronous links of the synchronous mesh communication network 275. A synchronous domain is not restricted to a subset of tiles 210 within a cluster 205, i.e., multiple synchronous domains can share the tiles 210 of a cluster 205. A single tile 210 can participate in multiple synchronous domains, e.g., spoke 0, a tile 210 works on synchronous domain "A"; spoke 1, that tile 210 works on synchronous domain "B"; spoke 2, that tile 210 works on synchronous domain "A"; and spoke 3, that tile 210 works on synchronous domain "C". Thread control for a tile is described below with reference to FIG. 11.

Figure 11:
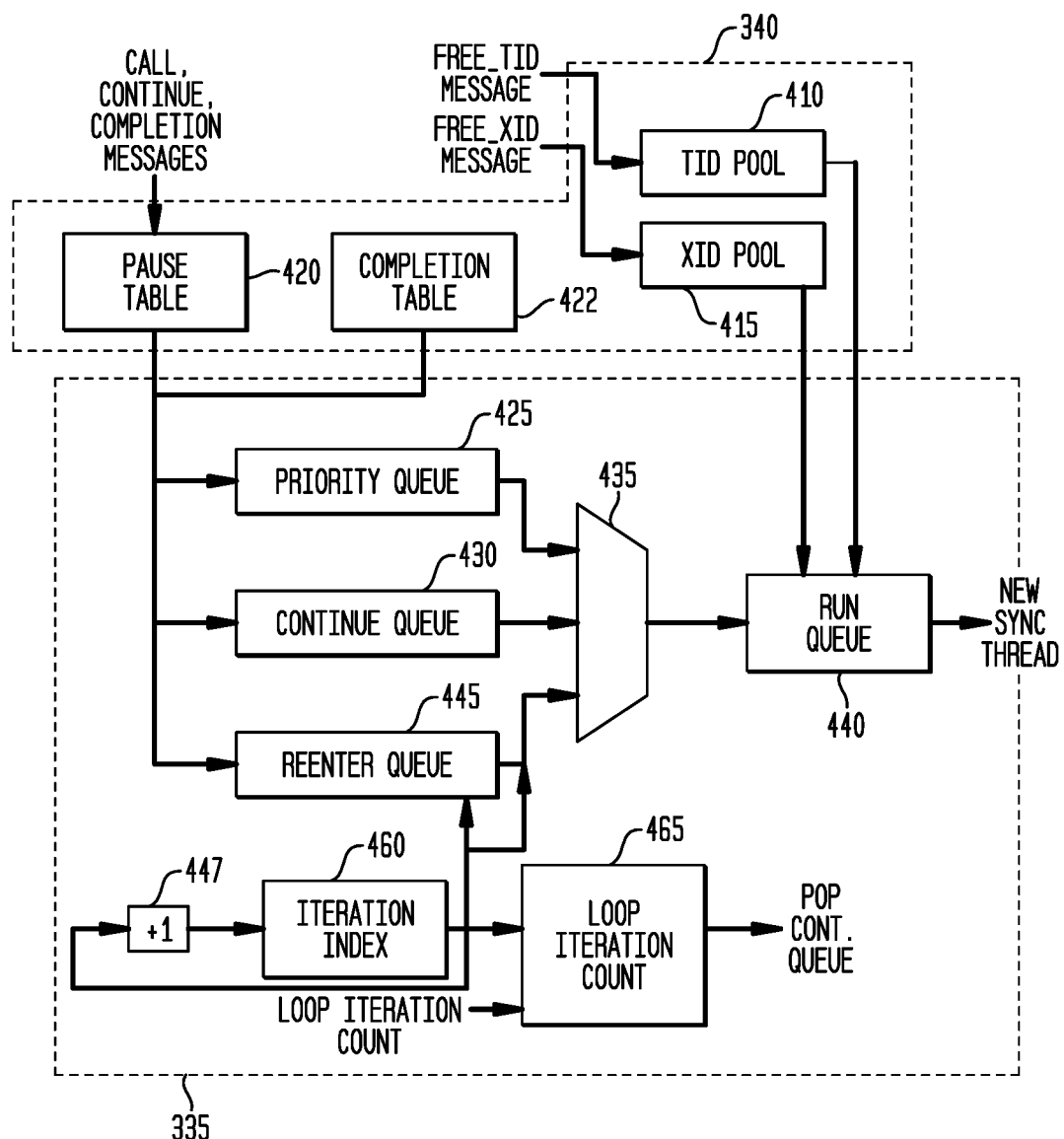
FIG. 11 is a detailed block diagram of a representative embodiment of a thread control circuit of a hybrid threading fabric configurable computing circuit (tile).

FIG. 11 is a detailed block diagram of a representative embodiment of a thread control circuit 335 (with associated control registers 340) of a hybrid threading fabric configurable computing circuit (tile) 210. Referring to FIG. 11, several registers are included within the control registers 340, namely, a TID pool register 410, an XID pool register 415, a pause table 420, and a completion table 422. In various embodiments, the data of the completion table 422 may be equivalently held in the pause table 420, and vice-versa. The thread control circuitry 335 includes a continue queue 430, a reenter queue 445, a thread control multiplexer 435, a run queue 440, an iteration increment 447, an iteration index 460, and a loop iteration count 465. Alternatively, the continue queue 430 and the run queue 440 may be equivalently embodied in the control registers 340.

Figure 12:
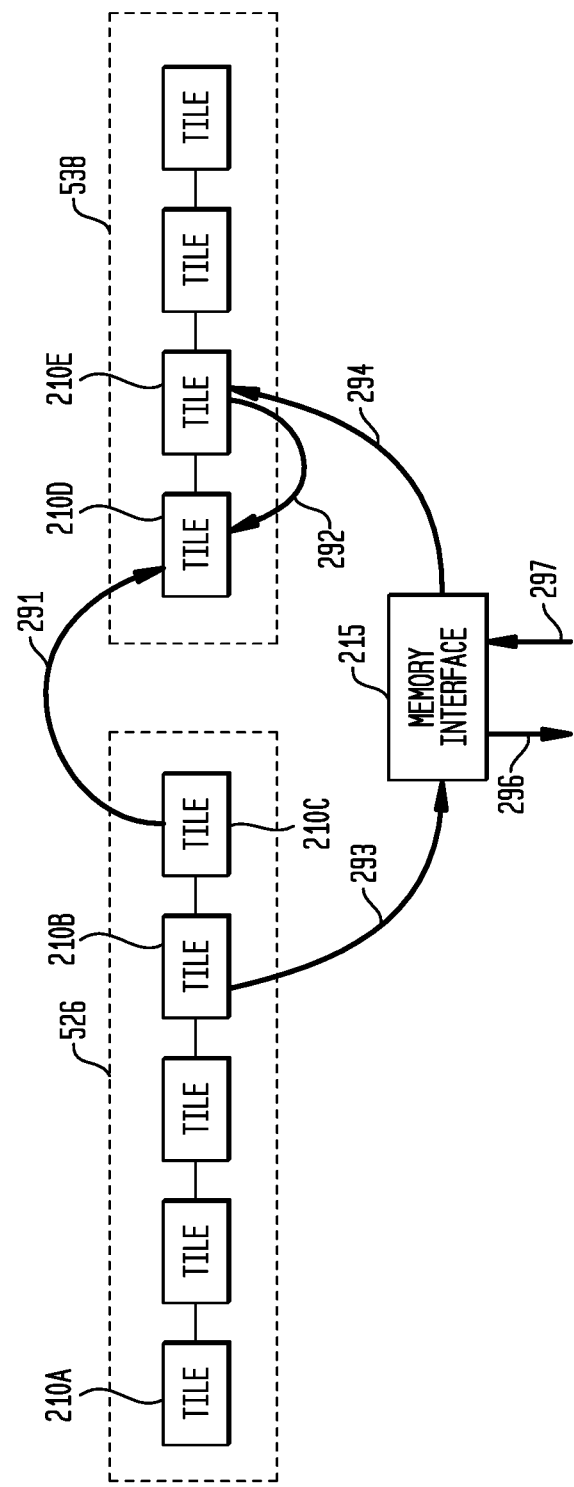
FIG. 12 is a diagram of representative hybrid threading fabric configurable computing circuits (tiles) forming synchronous domains and representative asynchronous packet network messaging.

FIG. 12 is a diagram of tiles 210 forming first and second synchronous domains 526, 538 and representative asynchronous packet network messaging. One difficulty with having an asynchronous packet network 265 is that required data may arrive at tiles 210 at different times, which can make it difficult to ensure that a started thread can run to completion with a fixed pipeline delay. In representative embodiments, the tiles 210 forming a synchronous domain do not execute a compute thread until all resources are ready, such as by having the required data available, any required variables, etc., all of which have been distributed to the tiles over the asynchronous packet network 265, and therefore may have arrived at the designated tile 210 at any of various times. In addition, data may have to be read from system memory 125 and transferred over the asynchronous packet network 265, and therefore also may have arrived at the designated tile 210 at any of various times.

To provide for a thread to run to completion with a fixed pipeline delay, the representative embodiments provide a completion table 422 (or pause table 420) indexed by a thread's TID at the base tile 210 of a synchronous domain. The completion table 422 (or pause table 420) maintains a count of dependency completions that must be received prior to initiating execution of the thread. The completion table 422 (or pause table 420) includes a field named the "completion count", which is initialized to zero at reset. Two types of AF messages are used to modify the count field. The first message type is a thread start or continue message, and increments the field by a count indicating the number of dependences that must be observed before a thread can be started in the synchronous domain. The second AF message type is a completion message and decrements the count field by one indicating that a completion message was received. Once a thread start message is received, and the completion count field reaches zero, then the thread is ready to be started.

As illustrated in FIG. 12, a tile 210B of a first synchronous domain 526 has transmitted an AF memory load message (293) to the memory interface 215 over the asynchronous packet network 265, which in turn will generate another message (296) to system memory 125 over the first interconnect network 150 to obtain the requested data (returned in message 297). That data, however, is to be utilized by and is transmitted (message 294) to a tile 201E in the second synchronous domain 538. As the first synchronous domain 526 has completed its portion of the pipeline, one of the tiles (210C) in the first synchronous domain 526 transmits an AF continue message (291) to the base tile 210D of the second synchronous domain 538. That AF continue message (291) includes the TID of the thread of the first synchronous domain 526 (e.g., TID=1, which was also included in the other messages of FIG. 12), and a completion count of 1, indicating that the base tile 210D of the second synchronous domain 538 will be waiting to start the thread on the second synchronous domain 538 until it has received one completion message.

Accordingly, when a tile 210 receives such data, such as tile 210E in FIG. 12, it acknowledges that receipt by sending a completion message (with the thread ID (TID)) back to the base tile 210, here, base tile 210D of the second synchronous domain 538. As part of the configuration provided to the base tile 210 (at initial configuration or as part of the continue message), and stored in the completion table 422 (or pause table 420) as a completion count, the base tile 210D knows how many such completion messages the base tile 210 must receive in order to commence execution by the tiles 210 of the synchronous domain, in this case, the second synchronous domain 538. As completion messages are received by the base tile 210, for the particular thread having that TID, the completion count of the pause table is decremented, and when it reaches zero for that thread, indicating all required completion messages have been received, the base tile 210 can commence execution of the thread. To commence execution, the TID of the thread is transferred to the continue queue 430, from which it is selected to run (at the appropriate spoke count for the appropriate time slice of the tile 210). It should be noted that completion messages are not required for data which is determined during execution of the thread and which may be transferred between tiles 210 of the synchronous domain over the synchronous mesh communication network 275.

There are several advantages to this type of thread control. This thread control waits for all dependencies to be completed prior to starting the thread, allowing the started thread to have a fixed synchronous execution time. The fixed execution time allows for the use of register stages throughout the pipeline instead of FIFOs. In addition, while one thread of a tile 210 may be waiting to execute, other threads may be executing on that tile 210, providing for a much higher overall throughput, and minimizing idle time and minimizing unused resources.

Similar control is provided when spanning synchronous domains, such as for performance of multiple threads (e.g., for related compute threads forming a compute fiber). For example, a first synchronous domain will inform the base tile 210 of the next synchronous domain, in a continuation message transmitted over the asynchronous packet network 265, how many completion messages it will need to receive in order for it to begin execution of the next thread. Also for example, for iterative looping spanning synchronous domains, a first synchronous domain will inform the base tile 210 of the next synchronous domain, in a loop message (having a loop count and the same TID) transmitted over the asynchronous packet network 265, how many completion messages it will need to receive in order for it to begin execution of the next thread.

It should also be mentioned that various delays may need to be implemented, such as when first data is available from a first tile 210, while second data is still being determined by a second tile 210, both of which will be needed in a next calculation by a third tile 210. For such cases, delay may be introduced either at the output registers 380 at the first tile 210 which created the first data, or in a tile memory 325 of the third tile 210. This delay mechanism is also applicable to data which may be transferred from a first tile 210, using a second tile 210 as a pass-through, to a third tile 210.

The pause table 420 is used to hold or pause the creation of a new synchronous thread in the tile 210 until all required completion messages have been received. A thread from a previous synchronous domain sends a message to a base tile 210 that contains the number of completion messages to expect for the new synchronous thread, and the action to take when all of the completion messages have been received. The actions include: call, continue, or loop. Many pause operations are typically active concurrently. All messages for a specific pause operation (i.e., a set of pause and completion messages) will have the same pause index within the respective messages. The pause index is the TID from the sending tile 210. Pause table 420 entries are initialized to be inactive with a completion delta count of zero. Receiving a pause message increments the delta count by the number of required completion counts, and sets the pause table 420 entry to active. Receiving a completion message decrements the delta count by one. It should be noted that a completion message may arrive prior to the associated pause message, resulting in the delta count being negative. When a pause table 420 entry is active with a delta count of zero then the associated activity (e.g., the new thread) is initiated (and the pause table 420 entry is de-activated).

The continuation (or call) queue 430 holds threads ready to be started on a synchronous domain. A thread is pushed into the continuation queue 430 when all completions for a call operation are received. It should be noted that threads in the continuation queue 430 may require a TID and/or XID to be allocated before the thread can be started on a synchronous domain, e.g., if all TIDs are in use, the threads in the continuation queue 430 can be started once a TID is freed and available i.e., the thread may be waiting until TID and/or XIDs are available.

The reenter queue 445 holds threads ready to be started on a synchronous domain, with execution of those threads having priority over those in the continuation queue 430. A thread is pushed into the reenter queue 445 when all completions for a continue operation are received, and the thread already has a TID. It should be noted that that threads in the reenter queue 445 cannot require allocation of a TID. Separate reenter and continue (or continuation) queues 445, 430 are provided to avoid a deadlock situation. A special type of continue operation is a loop. A loop message contains a loop iteration count. The count is used to specify how many times a thread is to be started once the pause operation completes.

An optional priority queue 425 may also be implemented, such that any thread having a thread identifier in the priority queue 425 is executed prior to execution of any thread having a thread identifier in the continuation queue 430 or in the reenter queue 445.

An iteration index 460 state is used when starting threads for a loop operation. The iteration index 460 is initialized to zero and incremented for each thread start. The iteration index 460 is pushed into the run queue 440 with the thread information from the continue queue 430. The iteration index 460 is available as a selection to the data path input multiplexer 365 within the first tile (base tile) 210 of the synchronous domain.

The loop iteration count 465 is received as part of a loop message, saved in the pause table 420, pushed into the continue queue 430, and then used to determine when the appropriate number of threads have been started for a loop operation.

The run queue 440 holds ready-to-run threads that have assigned TIDs and/or XIDs and can execute when the appropriate spoke count clocks have occurred. The TID pool 410 provides unique thread identifiers (TIDs) to threads as they are started on the synchronous domain. Only threads within the continuation queue 430 can acquire a TID. The XID pool 415 provides unique transfer identifiers (XIDs) to threads as they are started on the synchronous domain. Threads from the continue queue 430 can acquire an XID. An allocated XID becomes the XID_WR for the started thread.

For any given or selected program to be executed, the code or instructions for that program, written or generated in any appropriate or selected programming language, are compiled for and loaded into the system 100, including instructions for the HTP 300 and HTF circuits 200, and any which may be applicable to the host processor 110, to provide the selected configuration to the system 100. As result, various sets of instructions for one or more selected computations are loaded into the instruction RAMs 315 and the spoke RAMs 320 of each tile 210, and loaded into any of the various registers maintained in the memory interfaces 215 and dispatch interface 225 of each tile 210, providing the configurations for the HTF circuits 200, and depending upon the program, also loaded into the HTP 300.

A kernel is started with a work descriptor message that contains zero or more arguments, typically generated by the host processor 110 or the HTP 300, for performance by one or more HTF circuits 200, for example and without limitation. The arguments are sent within the work descriptor AF message to the dispatch interface 225. These arguments provide thread-specific input values. A host processor 110 or HTP 300, using its respective operating system ("OS") can send a "host" message to a kernel that initializes a tile memory 325 location, with such host messages providing non-thread specific values. A typical example is a host message that sends the base address for a data structure that is used by all kernel threads.

A host message that is sent to a kernel is sent to all HTF circuit clusters 205 where that kernel is loaded. Further, the order of sending host messages and sending kernel dispatches is maintained. Sending a host message essentially idles that kernel prior to sending the message. Completion messages ensure that the tile memory 325 writes have completed prior to starting new synchronous threads.

The control messaging over the asynchronous packet network 265 is as follows:

(1) The dispatch interface 225 receives the host message and sends an AF Data message to the destination tile 210. The destination tile 210 writes the selected memory with the data of the AF Data message.

(2) The destination tile 210 sends an AF Complete message to the dispatch interface 225 acknowledging that the tile write is complete.

(3) The dispatch interface 225 holds all new kernel thread starts until all message writes have been acknowledged. Once acknowledged, the dispatch interface 225 transmits an AF Call message to the base tile of the synchronous domain to start a thread.

The dispatch interface 225 is responsible for managing the HTF circuit cluster 205, including: (1) interactions with system 100 software to prepare the HTF circuit cluster 205 for usage by a process; (2) dispatching work to the tiles 210 of the HTF circuit cluster 205, including loading the HTF circuit cluster 205 with one or more kernel configurations; (3) saving and restoring contexts of the HTF circuit cluster 205 to memory 125 for breakpoints and exceptions. As mentioned above, the registers 475 of the dispatch interface 225 may include a wide variety of tables to track what has been dispatched to and received from any of the various tiles 210, such as tracking any of the messaging utilized in representative embodiments. The dispatch interface 225 primitive operations utilized to perform these operations are listed in Table 4.

TABLE 4

| Primitive Operation | Location | Initiated by | Operation Description |
|---|---|---|---|
| HTF Cluster Load Kernel Configuration | HTF Dispatch Interface | Application | A HTF circuit cluster 205 checks each received work descriptor to determine if the required kernel configuration matches the currently loaded configuration. If the work descriptor's kernel configuration does not match the currently loaded configuration, then the HTF circuit cluster 205 waits for all previous work to complete and loads the new kernel configuration. Each work descriptor has the virtual address for the required kernel configuration. |
| HTF Cluster Reset | HTF Dispatch Interface | OS | Reset all state within a HTF circuit cluster 205 to allow a new kernel configuration or kernel context to be loaded. |
| HTF Cluster Store Context | HTF Dispatch Interface | OS | An HTF circuit cluster 205 can pause execution due to an exception or breakpoint. The HTF circuit cluster 205 sends an interrupt to the OS to inform it of the event. The OS determines if process context must be stored to memory for debugger access. If process context is required, then the OS initiates the operation by interacting with the dispatch interface 225 of the HTF circuit cluster 205. |
| HTF Cluster Load Context | HTF Dispatch Interface | OS | The context for an HTF circuit cluster 205 can be loaded from memory in preparation to resume execution. The OS initiates the operation by interacting with the dispatch interface 225 of the HTF circuit cluster 205. |
| HTF Cluster Pause | HTF Dispatch Interface | OS | The OS may need to pause execution on running HTF circuit clusters 205 when the owning process needs to be stopped. The process may need to be stopped if an exception or breakpoint occurred by a processor or different HTF circuit cluster 205, |

TABLE 4-continued

| Primitive Operation | Location | Initiated by | Operation Description |
|---|---|---|---|
| | | | or the process received a Linux Signal. The OS initiates the pause by interacting with the dispatch interface 225. |
| HTF Cluster Resume | HTF Dispatch Interface | OS | Execution of a paused HTF circuit cluster 205 can be resumed by removal of the pause signal of the HTF circuit cluster 205. The OS initiates the resume by interacting with the dispatch interface 225 of the HTF circuit cluster 205. |
| HTF Cluster Is Idle | HTF Dispatch Interface | OS | The OS may need to determine when an HTF circuit cluster 205 is idle and ready to accept a new operation. The dispatch interface 225 has a number of state machines that perform various commands. These commands include context load, context store, pause, and configuration load. The OS must ensure that an HTF circuit cluster 205 is idle prior to issuing a command. |

Figure 17A:
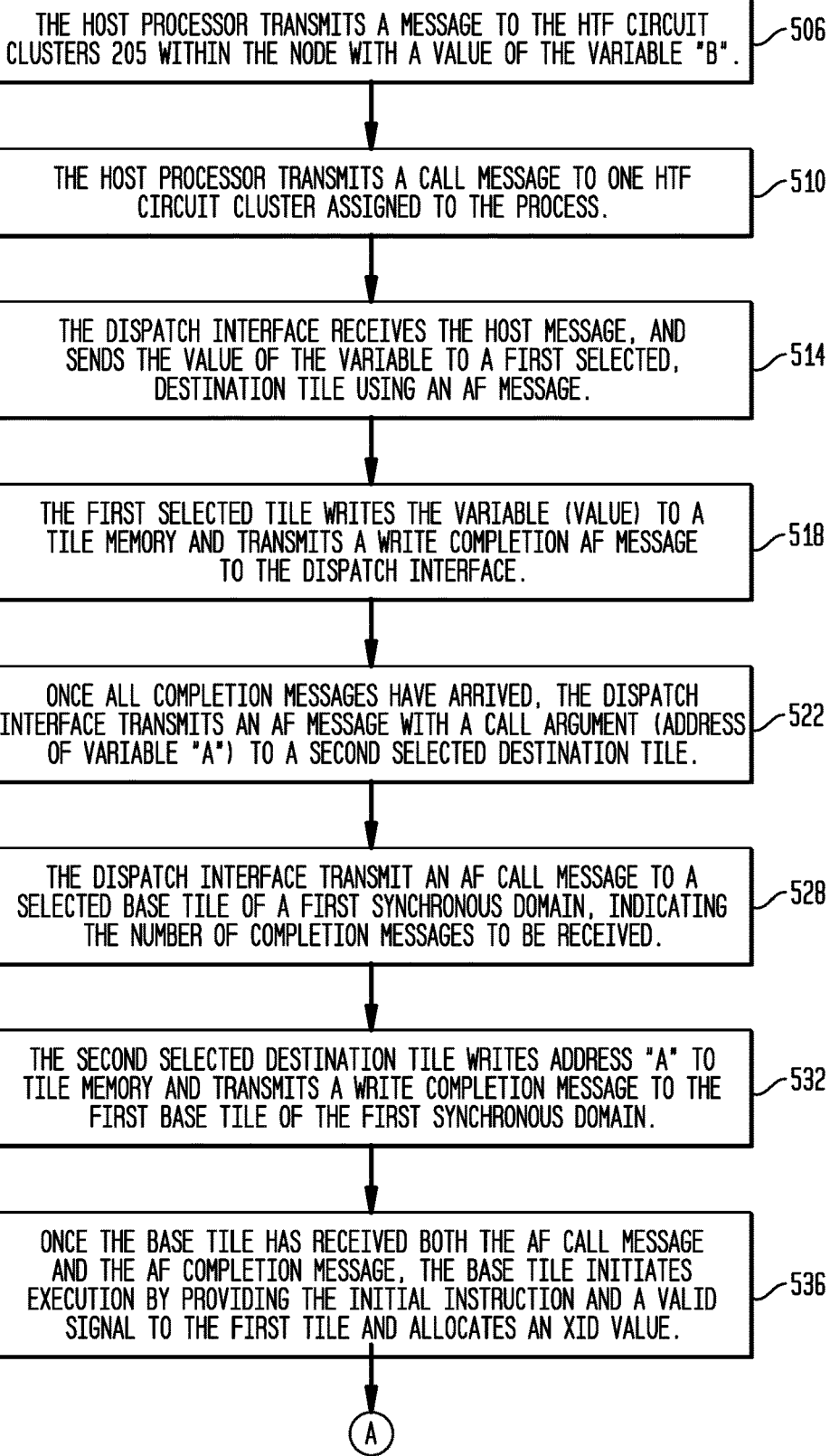
FIGS. 17A, 17B, and 17C (collectively FIG. 17) is a flow chart of representative asynchronous packet network messaging and execution by hybrid threading fabric configurable computing circuits (tiles) for performance of the computation of FIG. 16 by a hybrid threading fabric circuit cluster.
Figure 17B:
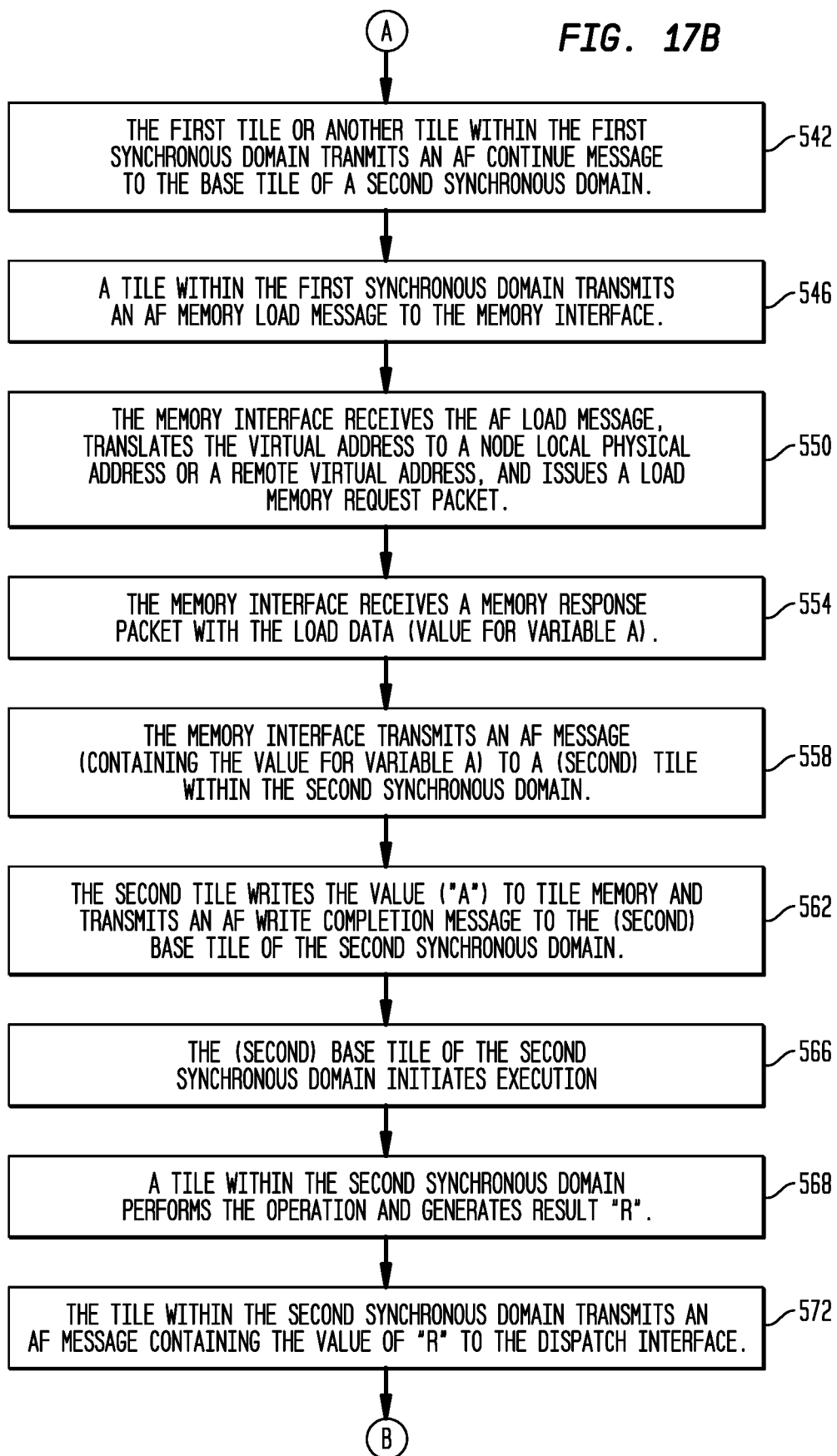
Figure 17C:
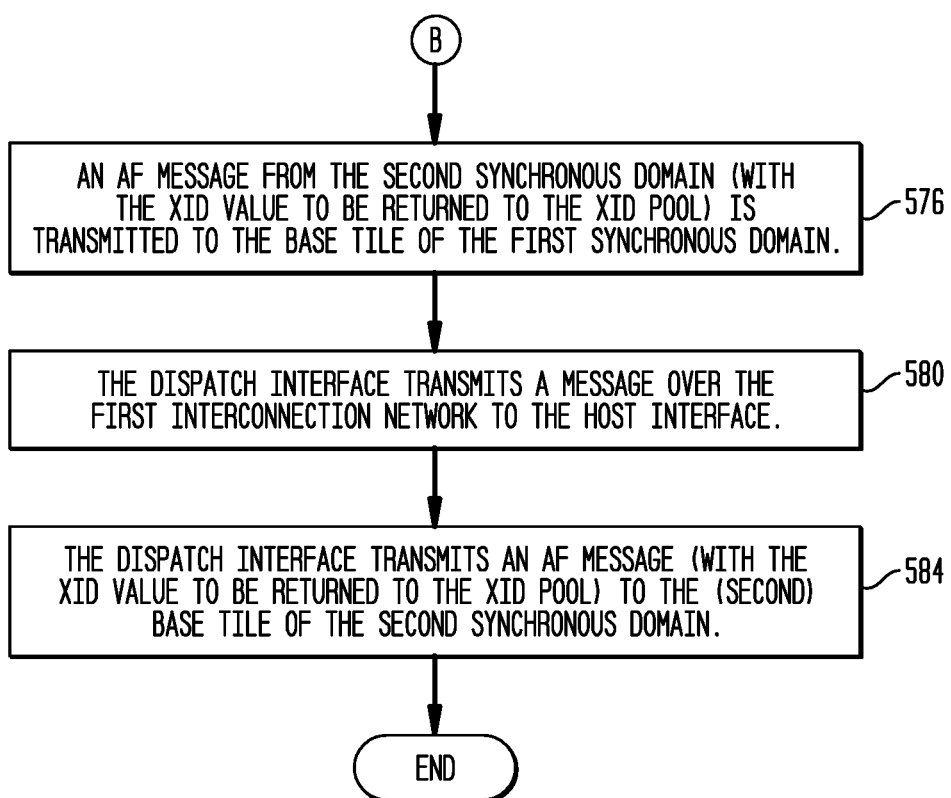

FIGS. 16 and 17 provide an example of messaging and thread control within a system 100, with an example computation provided to show how the synchronous mesh communication network 275 and asynchronous packet network 265 work together to execute a simple kernel, here, solving the simple expression R=*A+B. To show such messaging, the computation has been divided across two different synchronous domains 526 and 538. The variable B is passed as a host message to all HTF circuit clusters 205, and the address of A is passed as an argument to the call in the work descriptor packet. The result R is passed back in the return data packet over the first interconnection network 150. The example does almost no compute so the number of messages per compute performed is very high. The HTF circuits 200 have much higher performance when significant computation is performed within a loop such that the number of messages per compute is low.

FIG. 16 is a diagram of representative hybrid threading fabric configurable computing circuits (tiles) 210 forming synchronous domains and representative asynchronous packet network messaging for performance of a computation by a HTF circuit cluster 205. FIG. 17 is a flow chart of representative asynchronous packet network messaging and execution by hybrid threading fabric configurable computing circuits (tiles) for performance of the computation of FIG. 16 by a HTF circuit cluster 205. To begin, the host processor 110 sends a message (504) to the all HTF circuit clusters 205 within the node, step 506. The message is the value of the variable B. The message is contained in a single data packet, typically referred to as a work descriptor packet, that is written to a dispatch queue 105 of the HIF 115 (illustrated in FIGS. 1 and 2) associated with the process. The HIF 115 reads the message from the dispatch queue 105 and sends a copy of the packet to each HTF circuit cluster 205 assigned to the process. The dispatch interface 225 of the assigned HTF circuit cluster 205 receives the packet. It should also be noted that the HIF 115 performs various load balancing functions across all HTP 300 and HTF 200 resources.

The host processor 110 sends a call message (508) to one HTF circuit cluster 205 assigned to the process, step 510. The host processor 110 can either manually target a specific HTF circuit cluster 205 to execute the kernel, or allow the HTF circuit cluster 205 to be automatically selected. The host processor 110 writes the call parameters to the dispatch queue associated with the process. The call parameters include the kernel address, starting instruction, and the single argument (address of variable A). The host interface (HIF) 115 reads the queued message and forwards the message as data packet on the first interconnection network 150 to the assigned HTF circuit cluster 205, typically the HTF circuit cluster 205 with the least load.

The dispatch interface 225 receives the host message (value of variable B), waits until all previous calls to the HTF circuit cluster 205 have completed, and sends the value to a first selected, destination tile 210H using an AF message (512) over the asynchronous packet network 265, step 514. The dispatch interface 225 has a table of information, stored in registers 475, for each possible host message that indicates the destination tile 210H, tile memory 325 and memory region (in RAM 405) for that tile 210H. The tile 210H uses the message information to write the value to a memory 325 in the tile 210H, and once the value is written to tile memory, then a write completion AF message (516) is sent via the asynchronous packet network 265 back to the dispatch interface 225, step 518.

The dispatch interface 225 waits for all message completion messages to arrive (in this case just a single message). Once all completion messages have arrived, then the dispatch interface 225 sends the call argument (address of variable A) in an AF message (520) to a second selected destination tile 210B for the value to be written into tile memory 325, step 522. The dispatch interface 225 has a call arguments table stored in registers 475 that indicates the destination tile 210B, tile memory 325 and memory region (in RAM 405) for that tile 210B.

The dispatch interface 225 next sends an AF call message (524) to the base tile 210A of the first synchronous domain 526, step 528. The AF call message indicates that a single completion message should be received before the call can start execution through the synchronous tile 210 pipeline. The required completion message has not arrived so the call is paused.

Once the value is written to the tile memory 325 for that tile 210B, then a write completion message (530) is sent by the tile 210B via the asynchronous packet network 265 to the base tile 210A of the first synchronous domain 526, step 532.

The base tile 210A has received both the call message (524) and the required completion message (530), and is now ready to initiate execution on the synchronous domain 526 (tile pipeline). The base tile 210A initiates execution by providing the initial instruction and a valid signal (534) to the tile 210B, via the synchronous mesh communication network 275, step 536. The base tile 210A allocates an XID value from an XID pool 415 for use in the first synchronous domain 526. If the XID pool 415 is empty, then the base tile 210A must wait to start the synchronous pipeline until an XID is available.

As execution proceeds, the tile 210B or another tile 210E within the first synchronous domain 526 sends an AF continue message (540) to the base tile 210C of a second synchronous domain 538, step 542. The continue message contains the number of required completion messages that must arrive before the second synchronous domain 538 can initiate execution (in this case a single completion message). The continue message also includes the transfer ID (XID). The XID is used as a write index in one synchronous domain (526), and then as a read index in the next synchronous domain (538). The XID provides a common tile memory index from one synchronous domain to the next.

The tile 210B or another tile 210F within the first synchronous domain 526 sends an AF memory load message (544) to the memory interface 215 of the HTF circuit cluster 205, step 546. The message contains a request ID, a virtual address, and the XID to be used as the index for writing the load data to a destination tile (210G) memory 325.

The memory interface 215 receives the AF load message and translates the virtual address to a node local physical address or a remote virtual address. The memory interface 215 uses the AF message's request ID to index into a request table stored in registers 485 containing parameters for the memory request. The memory interface 215 issues a load memory request packet (548) for the first interconnection network 150 with the translated address and size information from the request table, step 550.

The memory interface 215 subsequently receives a memory response packet (552) over the first interconnection network 150 with the load data (value for variable A), step 554. The memory interface 215 sends an AF message (556) to a tile 210G within the second synchronous domain 538, step 558. The AF message contains the value for variable A and the value is written to tile memory using a parameter from the request table stored in registers 485.

Once the value is written to tile memory, then an AF write completion message (560) is sent via the asynchronous packet network 265 to the base tile 210C of the second synchronous domain 538, step 562.

The base tile 210C of the second synchronous domain 538 receives both the continue message (540) and the required completion message (560) and is ready to initiate execution on the second synchronous domain 538 (tile pipeline). The base tile 210C initiates execution by providing the initial instruction and a valid signal (564) to a tile 210 of the second synchronous domain 538, step 566, such as tile 210H. The base tile 210C also allocates an XID value from an XID pool for use in the second synchronous domain 538.

A tile 210H within the second synchronous domain performs the add operation of the B value passed in from a host message and the A value read from system memory 125, step 568. The resulting value is the R value of the expression.

A tile 210J within the second synchronous domain sends an AF message (570) containing the R value to the dispatch interface 225, step 572. The AF message contains the allocated XID value from the base tile 210A. The XID value is used as an index within the dispatch interface 225 for a table stored in registers 475 that hold return parameters until the values have been read and a return message generated for transmission over the first interconnection network 150.

An AF message (574) from the second synchronous domain (tile 210K) sends the XID value allocated in the first synchronous domain back to the base tile 210A to be returned to the XID pool, step 576. A first interconnection network 150 message (578) from the dispatch interface 225 is sent to the HIF 115, step 580. The HIF writes the return work descriptor to the dispatch return queue. Once the first interconnection network 150 has sent the return packet, the XID value is sent in an AF message (582) by the dispatch interface 225 to the base tile 210C of the second synchronous domain 538 to be returned to the XID pool, step 584.

It should be noted that in this example of FIGS. 16 and 17, many tiles 210 have been utilized in order to show a wide variety of AF messages which may be utilized for thread control. In practice, especially for such a simple computation, appreciably fewer tiles 210 can be utilized, such as to perform the computation completely within a single synchronous domain.

Figure 19A:
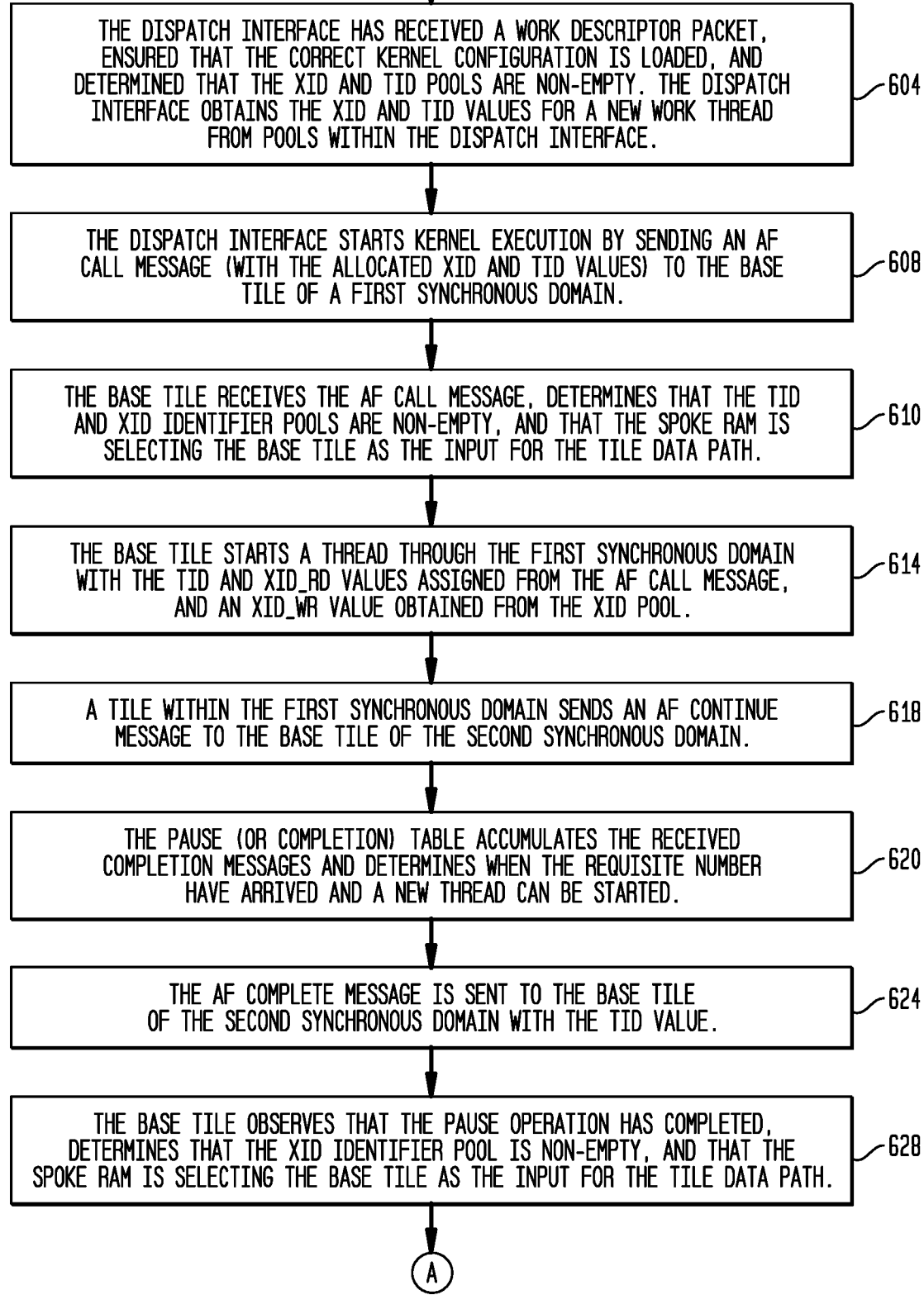
FIGS. 19A, and 19B (collectively FIG. 19) is a flow chart of representative asynchronous packet network messaging and execution by hybrid threading fabric configurable computing circuits (tiles) for performance of the computation of FIG. 18 by a hybrid threading fabric circuit cluster.
Figure 19B:
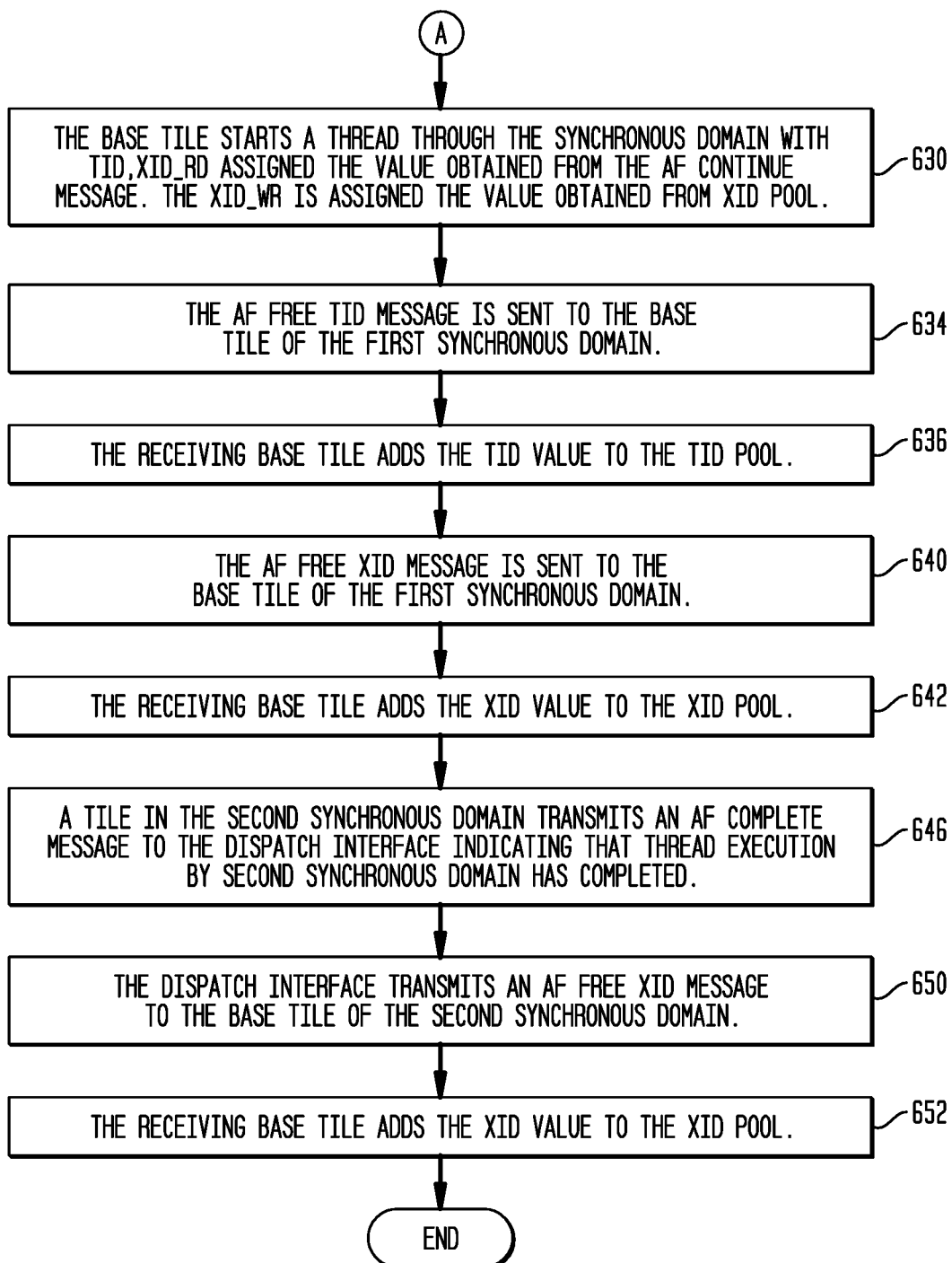

Another messaging example is provided for thread control across multiple synchronous domains in FIGS. 18 and 19, also using AF complete and continue messages on the asynchronous packet network 265. FIG. 18 is a diagram of representative hybrid threading fabric configurable computing circuits (tiles) forming synchronous domains and representative asynchronous packet network messaging for performance of a computation by a hybrid threading fabric circuit cluster. FIG. 19 is a flow chart of representative asynchronous packet network messaging and execution by hybrid threading fabric configurable computing circuits (tiles) for performance of the computation of FIG. 18 by a hybrid threading fabric circuit cluster.

For this example, the dispatch interface 225 sends a message to the base tile 210A of the first synchronous domain 526. The message starts a thread on the first synchronous domain 526. The thread sends a thread continue message to a second synchronous domain 538. The continue message indicates that a thread is to be started on the second synchronous domain 538 when the specified number of completion messages have been received. The first synchronous domain 526 sends a completion message to the second synchronous domain 538 causing the pause to complete and start the synchronous, second thread. The second thread sends a complete message back to the dispatch interface 225 indicating that the second synchronous thread completed, completing the dispatched kernel. Additional messages are shown in FIG. 18 that free TID and XID identifiers.

The dispatch interface 225 has received a work descriptor packet (602), has ensured that the correct kernel configuration is loaded, has determined that the XID and TID pools are non-empty, obtaining the XID and TID values for a new work thread from TID and XID pools stored in registers 475 within the dispatch interface 225, step 604. The dispatch interface 225 starts kernel execution by sending an AF Call message (606) (with the allocated XID and TID values, e.g., XID=3 and (first type) TID=11) to the base tile 210A of a first synchronous domain 526, step 608. The base tile 210A receives the AF Call message (606), determines that the TID and XID pools (410, 415) are non-empty, allocates TID and XID values (e.g., XID_WR=7 and (second type) TID=1), and that the Spoke Ram 320 is selecting the Base Tile as the input for the tile data path, step 610, so that it begins execution with a first designated instruction designated by the instruction index held in its Spoke Ram 320, rather than potentially executing an instruction from an instruction index which may have been provided by a previous tile 210 (e.g., as discussed in greater detail below regarding conditional execution).

The base tile 210A starts a first thread (612) through the first synchronous domain 526 with the assigned TID value (e.g., (second type) TID=1), XID_RD assigned the value from the AF Call message (606) (e.g., XID_RD=3), XID_WR assigned the value obtained from the XID pool (e.g., XID_WR=7), and TID from the AF Call message (606) (e.g., (first type) TID=11), step 614.

As the computation proceeds in the first synchronous domain 526, another tile 210B within the first synchronous domain 526 sends an AF Continue message (616) to the base tile 210D of the second synchronous domain 538, step 618. The AF Continue message (616) provides the information necessary to start a second thread on the second synchronous domain 538 when the appropriate number of completion messages have arrived. The AF Continue message (616) includes a completion count field having a value that specifies the number of required completion messages. One of the tiles (210C) in the first synchronous domain 526 also transmits a free XID (e.g., XID=3) message (641) to the dispatch interface 225.

The AF Continue message (616) can include either the TID or XID_WR value as the index into the pause table 420 on the destination base tile 210D. The pause table accumulates the received completion messages and determines when the requisite number have arrived and a new thread can be started, step 620. The tile 210B that sends the AF Continue message (616) sends the selected TID or XID_WR value as the PID (pause table index) and changes the synchronous domain's downstream TID value to the selected value (e.g., (first type) TID=11, (second type) TID=1). This new TID value is passed in all AF completion messages to be used as the index into the pause table 420 of the base tile 210D.

An AF Complete message (622) is sent to the base tile 210D of the second synchronous domain 538 with the TID value (e.g., (first type) TID=11), step 624. The AF Complete message (622) decrements the entry of a delta count field in the pause table 420 of the base tile 210D. The AF Complete message (622) and the AF Continue message (616) could arrive in any order. The last message to arrive will observe that the AF Continue message (616) has arrived and the delta count field in the pause table 420 has reached zero. This condition indicates that the pause has completed and a second synchronous thread (626) can be started. The base tile 210D also determines or observes that the pause operation has completed, determines that the XID identifier pool is non-empty and allocates an XID (e.g., XID=5), and that the Spoke Ram is selecting the Base Tile as the input for the tile data path, step 628.

The base tile 210D then starts the second synchronous thread (626) through the second synchronous domain 538, step 630, with TID and XID_RD assigned the value obtained from the AF Continue message (616) (e.g., (first type) TID=11, (second type) TID=1, XID_RD=7). The XID_WR is assigned the value obtained from the XID pool in step 628 (e.g., XID_WR=5).

When the computations of the second synchronous thread (626) have completed, several housekeeping messages are sent by the various tiles 210 of the second synchronous domain 538. An AF Free TID message (632) is sent to the base tile 210A of the first synchronous domain 526, step 634, and the receiving base tile 210A adds the TID value to the TID pool 410, step 636, so it is available once again for use. An AF Free XID message (638) is sent to the base tile 210A of the first synchronous domain 526, step 640, and the receiving base tile 210 adds the XID value to the XID pool 415, step 642, also so it is available once again for use. An AF Complete message (644) is sent to the dispatch interface 225 indicating that the second synchronous thread 626 has completed, step 646. The dispatch interface 225 has a count of expected completion messages. The AF Complete message (644) includes the XID_WR value and TID value ((first type) TID=11) of the second synchronous domain 538 to the dispatch interface. The dispatch interface 225 then sends an AF Free XID message (648) to the base tile 210D of the second synchronous domain 538, step 650. The receiving base tile 210D then adds the XID value to the XID pool 415, step 652, so it is available once again for use.

A data transfer operation is used to transfer data from one synchronous domain to the next. Typically, a data transfer is used in conjunction with a load operation obtaining data from memory 125. Calculated data from the first synchronous domain 526 is needed in the second synchronous domain 538 once the load data has arrived at the second synchronous domain 538. In this case, a single pause is sent from the first synchronous domain 526 to the second synchronous domain 538 that contains the total count of completion messages from all load and data transfer operations.

The data transfer operation between synchronous domains then utilizes a variation of step 624. Instead of sending an AF Complete message (622) in step 624, the first synchronous domain 526 sends an AF Data message to the second synchronous domain 538 with data. The destination tile 210 in the second synchronous domain 538 writes the data within the AF Data message to the selected tile memory 325. The tile 210 that receives the AF Data message then sends an AF Complete message to the base tile 210 of the second synchronous domain 538. The base tile 210 of the second synchronous domain 538 may then launch the second thread on the second synchronous domain 538 once the load data has arrived at the second synchronous domain 538.

Figure 21:
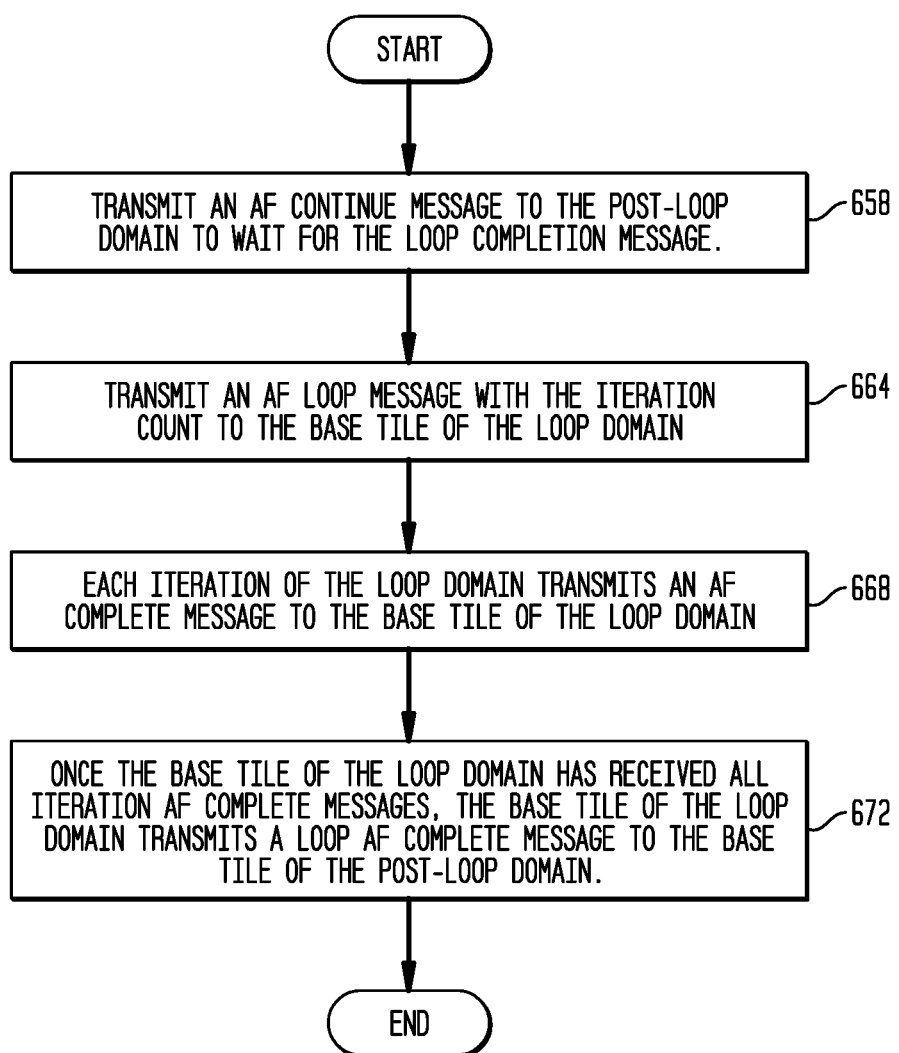
FIG. 21 is a flow chart of representative asynchronous packet network messaging and execution by hybrid threading fabric configurable computing circuits (tiles) for performance of the loop in a computation of FIG. 20 by a hybrid threading fabric circuit cluster.

Control over iterative thread looping across synchronous domains utilizes a similar control messaging schema. The loop message flow allows multiple synchronous domain starts from a single loop message. Each of the started synchronous threads is able to access its iteration index. FIG. 20 is a diagram of representative hybrid threading fabric configurable computing circuits (tiles) forming synchronous domains and representative asynchronous packet network messaging for performance of a loop in a computation by a hybrid threading fabric circuit cluster. FIG. 21 is a flow chart of representative asynchronous packet network messaging and execution by hybrid threading fabric configurable computing circuits (tiles) for performance of the loop in a computation of FIG. 20 by a hybrid threading fabric circuit cluster.

FIG. 20 shows three synchronous domains, first synchronous domain 526, second synchronous domain 538, and third synchronous domain 654. The first synchronous domain 526 is used for pre-loop setup, the second synchronous domain 538 is started with an iteration count (IterCnt) for the number of threads, and the final, third synchronous domain 654 is post-loop. It should be noted that loops can be nested, as well, using additional layers of indexing, discussed in greater detail below.

Referring again to FIG. 11, the control registers 340 include a completion table 422 (or pause table 420). For loops, two kinds of completion information are maintained in the completion table 422, a first completion count pertaining to the number of completion messages which should arrive before a thread may start, as discussed above, and a second, loop or iteration (completion) count, to track how many loop threads have been started and completed. A loop is started by sending an AF loop message containing a loop count (and various TIDs, discussed below) to the base tile 210 of a synchronous domain. The loop count is stored in the completion table 422 (or pause table 420), and is used to determine the number of times a new thread is started on the synchronous domain. In one embodiment, each thread is started with a new TID obtained from the TID pool 410. Each active thread has a unique TID allowing thread private variables, for example. The threads of nested loops are provided with access to the data or variables of its own TID, plus the TIDs of the outer loops. In a second embodiment discussed below, TIDs are re-used by successive threads of the loop.

TIDs are returned to the TID pool 410 by an AF message being sent from a tile within a synchronous domain when the thread is terminating, which may be either an AF Complete message, or for the second embodiment, an AF reenter message. This can also be accomplished by a Free TID message to the base tile 210. The AF message that returns the TID to the pool or re-uses the TID also is used by the loop base tile 210 to maintain a count of the number of active loop threads in the loop count of the completion table 422 (or pause table 420). When the number of active loop threads reaches zero, then the loop is complete. When the loop completion is detected by the loop count going to zero, then an AF Complete message is sent to the post-loop synchronous domain informing of the completion. This mechanism provides for minimal (if not zero) idle cycles for nested loops, resulting in better performance.

Referring to FIGS. 20 and 21, the first synchronous domain 526 (illustrated as tile 210B, although it can be from any other tile in the first synchronous domain 526) sends an AF Continue message (656) to the base tile 210D of the third, post-loop synchronous domain 654, step 658, to wait for the loop completion message (which will be from the second synchronous domain 538). One of the tiles in the first synchronous domain 526, illustrated as tile 210B, sends an AF Loop message (660) with the iteration (loop) count to the base tile 210C of the loop domain, which is the second synchronous domain 538, step 664. The base tile 210C starts the loop (IterCnt) threads (662, e.g., $662_0$, $662_1$, through $662_{N-1}$, where "N" is the iteration count (IterCnt)) on the second synchronous domain 538. Each thread 662 has the same TID and XID_RD identifiers. The XID_WR identifier is allocated by the loop base tile 210C if enabled. The iteration index (i.e., ordered from zero to IterCnt-1 (N−1)) is accessible as a data path multiplexer selection in the base tile 210C of the loop domain.

Each iteration of the loop domain then sends an AF Complete message (666) back to the base tile 210C of the second synchronous (loop) domain 538, step 668. It should be noted that the second synchronous domain 538 shown in FIG. 20 may actually be several synchronous domains. For the case in which multiple synchronous domains form the loop, the threads of the last synchronous domain of the loop should transmit the AF Complete messages (666), so that the post-loop third synchronous domain 654 properly waits for all loop operations to complete. Once the base tile 210C of the second synchronous (loop) domain 538 has received all iteration AF Complete messages (666), it then sends a loop AF Complete message (or an AF continuation message) (670) to the base tile 210D of the third (post-loop) synchronous domain 654.

For looping, including nested and doubly-nested looping, several additional and novel features are utilized, such as to minimize idle time, including a reenter queue 445 and additional sub-TIDs, such as a $TID_2$ for the outermost loop, a $TID_1$ for the middle or intermediate loop, and a $TID_0$ for the innermost loop, for example and without limitation. Each thread that is executing in the loop than also has a unique TID, such as $TID_2$s 0-49 for an outer loop which will have fifty iterations, which are also utilized in the corresponding completion messages when each iteration completes execution, also for example and without limitation.

Referring again to FIG. 11, several novel mechanisms are provided to support efficient looping, and to minimize idle time. For example, loops with data-dependent end conditions (e.g., "while" loops) require that the end condition to be calculated as the loop is executed. Also for control and execution of looping, a potential deadlock issue may arise if all TIDs are allocated from the TID pool 410, but the thread at the head of a queue for execution is a new loop, which cannot execute because of a lack of available TIDs, blocking other looping threads which cannot complete and free up their assigned TIDs. Accordingly, in representative embodiments, control registers 340 include two separate queues for ready-to-run threads, with a first queue for initiating new loops (the continuation queue 430, also utilized for non-looping threads), and a second, separate queue (the reenter queue 445) for loop continuation. The continuation queue 430 allocates a TID from the TID pool 410 to start a thread, as previously discussed. The reenter queue 445 uses the previously allocated TID, as each iteration of a loop thread executes and transmits an AF reenter message with the previously allocated TID. Any thread (TID) in the reenter queue 445 will be moved into the run queue 440 ahead of the threads (TIDs) which may be in the other queues (continuation queue 430). As a result, once a loop is launched, loop iteration occurs very rapidly, with each next thread of the loop being launched rapidly through use of the separate reenter queue 445, and further, without the potential for deadlock issues. In addition, the reenter queue 445 allows this rapid execution that is very significant for loops with data-dependent end conditions, which can now run effectively without interruption to the last iteration which produces the data-dependent end conditions.

Referring again to FIGS. 9 and 10, control registers 340 include a memory region RAM 405. The memory region RAM 405, in various embodiments, may also maintain a top of TID stack (with identifiers) through nested loops, described below. As mentioned above, each nested loop initiates threads with a new (or re-used) set of TIDs. Threads of a loop may need to have access to its TID plus the TIDs of the outer loop threads. Having access to the TIDs of each nested loop thread allows access to each thread's private variables, such as the different level or types of TIDs described above, $TID_0$, $TID_1$ and $TID_2$. The top of stack TID identifier indicates the TID for the active thread. The top of stack TID identifier is used to select which of the three TIDs ($TID_0$, $TID_1$ and $TID_2$) is used for various operations. These three TIDs and the top of stack TID identifier are included in synchronous fabric control information (or messages) transmitted on the synchronous mesh communication network 275, so are known to each thread. Because multiple TIDs are included within a synchronous fabric message and include a top of stack TID identifier, the multiple TIDs allow a thread in a nested loop to access variables from any level within the nested loop threads. The selected TID plus a tile memory region RAM 405 identifier is used to access a private thread variable.

Figure 23:
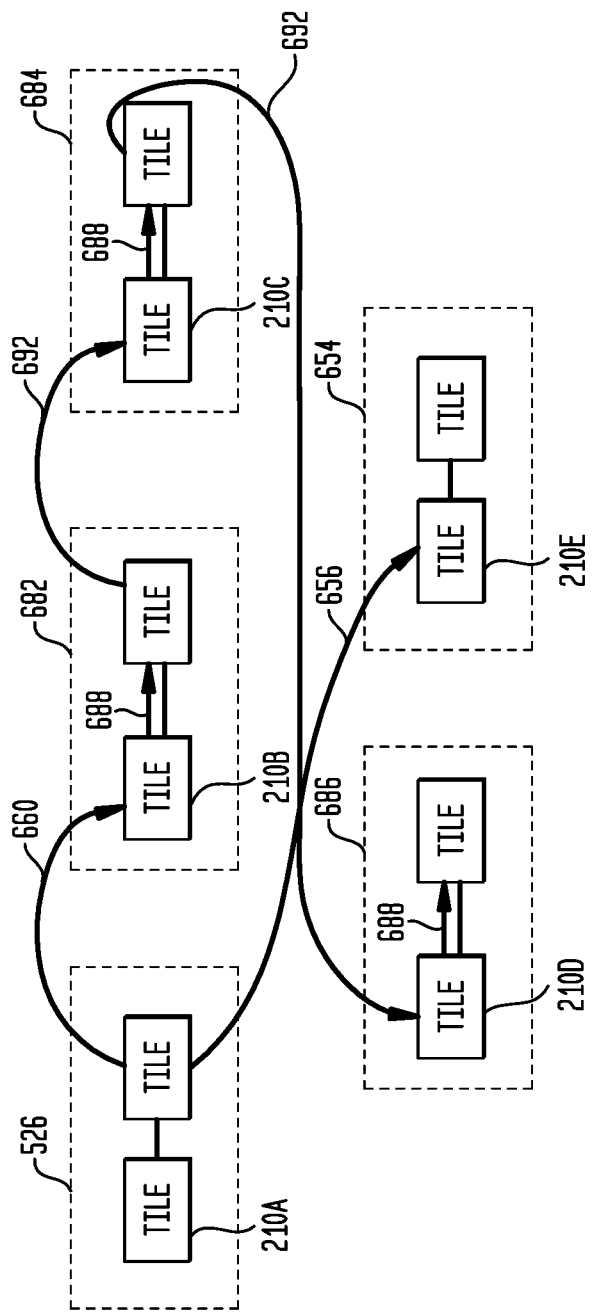
FIG. 23 is a diagram of representative hybrid threading fabric configurable computing circuits (tiles) forming synchronous domains and representative asynchronous packet network messaging and synchronous messaging for performance of a loop in a computation by a hybrid threading fabric circuit cluster.

Another novel feature of the present disclosure is the mechanism to order loop thread execution to handle loop iteration dependencies, which also accommodates any delays in completion messages and data received over the asynchronous packet network 265. FIG. 23 is a diagram of tiles 210 forming synchronous domains and representative asynchronous packet network messaging and synchronous messaging for performance of a loop in a computation by a hybrid threading fabric circuit cluster. As illustrated in FIG. 23, multiple synchronous domains 682, 684, and 686, are involved in performance of a loop computation, a second synchronous domain 682, a third synchronous domain 684, a fourth synchronous domain 686, in addition to the pre-loop first synchronous domain 526 and post-loop (fifth) synchronous domain 654. The loop computation may be any kind of loop, including nested loops, and in this case, there are data dependencies within the various loops. For example, these data dependencies may occur within a single iteration, such as when information is needed from memory 125, involving AF messaging over the asynchronous packet network 265. As a result, thread execution should proceed in a defined order, and not merely whenever any particular thread has a completion count of zero (meaning that thread is not waiting on any data, with all completion messages for that thread having arrived).

To provide ordered loop thread execution, in representative embodiments, additional messaging and additional fields are utilized in the completion table 422, for each loop iteration. The loop base tile 210B provides four pieces of information (for each loop iteration) that is passed in synchronous messages 688 through each synchronous domain 682, 684, 686 through the synchronous mesh communication network 275 (i.e., passed to every successive tile 210 in that given synchronous domain), and AF continue messages 692 to the base tiles 210 of successive synchronous domains via the asynchronous packet network 265 (which is then passed in synchronous messages to each successive tile 210 in that given synchronous domain). Those four fields of information are then stored and indexed in the completion table 422 and utilized for comparisons as the loop execution progresses. The four pieces of information are: a first flag indicating the first thread of a set of threads for a loop, a second flag indicating the last thread of a set of threads for a loop, the TID for the current thread, and the TID for the next thread. The TID for the current thread is obtained from a pool of TIDs, and the TID for the next thread is the TID from the pool that will be provided for the next thread. These four pieces of information are used by the base tile of each successive synchronous domain to order thread starts. A thread can be started if its dependency count has reached zero and the thread is the first thread for a loop, or the thread TID equals the next TID for the previously started thread.

Stated another way, the thread control circuitry 330 (which generally includes various state machines) checks the completion table 422, for each thread which has received all data completions (so would otherwise be ready-to-run), whether that thread is the next thread to run (having the next thread ID, e.g., TID=4), and if so, moves that thread (TID=4) into the run queue 440, and if not, does not start that thread (e.g., a thread whose data completion count went to zero but has a TID=5) but maintains the index of which TID is next to start. When the data completion for the thread having the next TID decrements to zero (TID=4 in this case), so all completion messages have arrived, that thread is queued for execution, and that thread (TID=4) which will be executing has a next TID as well, in this case, its next TID is TID=5. Accordingly, when the thread having TID=4 has completed, the thread control circuitry 330 checks the completion table 422 and now determines that the thread (TID=5) is the next thread ID, and queues that thread for execution. When the thread ID is then the last TID, following its execution, an AF completion message (656) can be transmitted to the post-loop base tile (in this case, 210E). It should be noted that this use of the additional fields in the completion table 422 may be extended to any situation in which a particular ordering of thread execution should be maintained.

Figure 24:
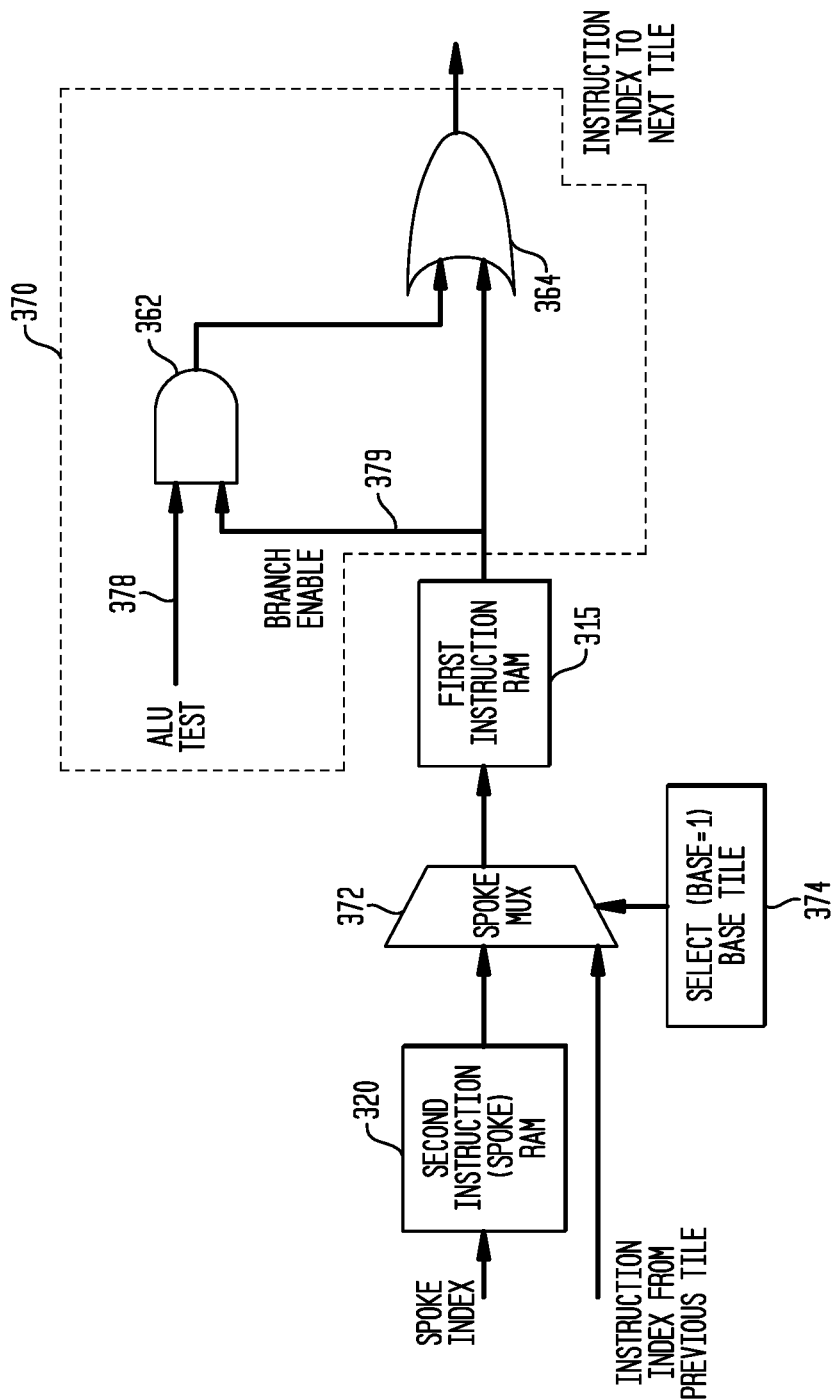
FIG. 24 is a block and circuit diagram of a representative embodiment of conditional branching circuitry.

FIG. 24 is a block and circuit diagram of a representative embodiment of conditional branching circuitry 370. A synchronous domain, such as the first, second and third synchronous domains mentioned above, is a set of interconnected tiles, connected in a sequence or series through the synchronous mesh communication network 275. Execution of a thread begins at the first tile 210 of the synchronous domain, referred to as a base tile 210, and progresses from there via the configured connections of the synchronous mesh communication network 275 to the other tiles 210 of the synchronous domain. As illustrated in FIG. 24, when a tile 210 has been configured as a base tile 210 of the synchronous domain (as those configurations have been loaded into the HTF circuit 200 in advance of run time), the selection 374 of a configuration memory multiplexer 372 is set equal to 1, which thereby selects the spoke RAM 320 to provide the instruction index for selection of instructions from the instruction RAM 315. For all other tiles 210 of the synchronous domain, the selection 374 of a configuration memory multiplexer 372 is set equal to 0, which thereby selects an instruction index provided by the previous tile 210 in the sequence of tiles 210 of the synchronous domain. As a result, the base tile 210 provides the instruction index (or the instruction) to be executed to the next, second tile of the domain, via designated fields (or portions) of the communication lines (or wires) 270B and 270A (which have been designated the master synchronous inputs, as mentioned above). By default, thereafter, this next tile 210, and each succeeding tile 210 of the synchronous domain, will provide the same instruction to each next tile 210 of the connected tiles 210 for execution, as a static configuration.

In representative embodiments, however, a mechanism is provided for dynamic self-configuration, using the spoke RAM 320, the instruction RAM 315, and the conditional branching circuitry 370. Referring to FIG. 24, for a current tile 210, the ALB Op 310 may be configured to generate an output which is the outcome of a test condition, such as whether one input is greater than a second input, for example. That test condition output is provided to the conditional branching circuitry 370, on communication lines (or wires) 378. When the conditional branching circuitry 370 is enabled (through one or more bits of an instruction provided on lines (or wires) 379), the test condition output is utilized to select the next instruction index (or instruction) which is provided to the next tile 210 of the synchronous domain, such as to select between "X" instruction or "Y" instruction for the next tile 210, providing conditional branching of the data path when the first or the second instruction is selected. Such conditional branching may also be cascaded, such as when the next tile 210 is also enabled to provide conditional branching. By selecting the next instruction for one or more of the next tiles 210, dynamic self-configuration and self-reconfiguration is enabled in each such HTF circuit cluster 205.

In a representative embodiment, the conditional branching circuitry 370 has been arranged to select or toggle between two different instructions, depending on the test condition result. The branch enable is provided in one of the fields of the current (or currently next) instruction, and is provided to an AND gate 362 of the conditional branching circuitry 370, where it is ANDed with the test condition output. Depending on the test condition output being a logical "0" or "1", AND gate 362 will generate a logical "0" or "1" as an output, which is provided as an input to OR gate 364. Another designated bit of a selected field of the currently next instruction index, typically the least significant bit ("LSB") of the next instruction index, is also provided to the OR gate 364, where it is ORed with the output of the AND gate 362. If the LSB of the next instruction index is a zero, and it is ORed with a logical "1" of the output of the AND gate 362, then the next instruction index which is output has been incremented by one, providing a different next instruction index to the next tile 210. If the LSB of the next instruction index is a zero, and it is ORed with a logical "0" of the output of the AND gate 362, then the next instruction index which is output has not been incremented by one, providing the same next instruction index to the next tile 210. As a result, the current tile 210 has conditionally specified an alternate instruction for connected tiles 210 to execute, enabling the performance of one or more case statements in the HTF circuit cluster 205. The alternate instruction is chosen by having the current tile's data path produce a Boolean conditional value, and using the Boolean value to choose between the current tile's instruction and the alternate instruction provided as the next instruction index to the next tile 210 in the synchronous domain. Also a result, the current tile 210 has dynamically configured the next tile 210, and so on, resulting in dynamic self-configuration and self-reconfiguration in each HTF circuit cluster 205.

Numerous advantages of the representative embodiments are readily apparent. The representative apparatus, system and methods provide for a computing architecture capable of providing high performance and energy efficient solutions for compute-intensive kernels, such as for computation of Fast Fourier Transforms (FFTs) and finite impulse response (FIR) filters used in sensing, communication, and analytic applications, such as synthetic aperture radar, 5G base stations, and graph analytic applications such as graph clustering using spectral techniques, machine learning, 5G networking algorithms, and large stencil codes, for example and without limitation.

As used herein, a "processor" 110, 300 may be any type of processor or controller, and may be embodied as one or more processor(s) 110, 300 configured, designed, programmed or otherwise adapted to perform the functionality discussed herein. As the term processor or controller is used herein, a processor 110, 300 may include use of a single integrated circuit ("IC"), or may include use of a plurality of integrated circuits or other components connected, arranged or grouped together, such as controllers, microprocessors, digital signal processors ("DSPs"), array processors, graphics or image processors, parallel processors, multiple core processors, custom ICs, application specific integrated circuits ("ASICs"), field programmable gate arrays ("FPGAs"), adaptive computing ICs, associated memory (such as RAM, DRAM and ROM), and other ICs and components, whether analog or digital. As a consequence, as used herein, the term processor or controller should be understood to equivalently mean and include a single IC, or arrangement of custom ICs, ASICs, processors, microprocessors, controllers, FPGAs, adaptive computing ICs, or some other grouping of integrated circuits which perform the functions discussed herein, with associated memory, such as microprocessor memory or additional RAM, DRAM, SDRAM, SRAM, MRAM, ROM, FLASH, EPROM or $E^2$PROM. A processor 110, 300, with associated memory, may be adapted or configured (via programming, FPGA interconnection, or hard-wiring) to perform the methodology of the invention, as discussed herein. For example, the methodology may be programmed and stored, in a processor 110, 300 with its associated memory (and/or memory 125) and other equivalent components, as a set of program instructions or other code (or equivalent configuration or other program) for subsequent execution when the processor 110, 300 is operative (i.e., powered on and functioning). Equivalently, when the processor 110, 300 may implemented in whole or part as FPGAs, custom ICs and/or ASICs, the FPGAs, custom ICs or ASICs also may be designed, configured and/or hard-wired to implement the methodology of the invention. For example, the processor 110, 300 may be implemented as an arrangement of analog and/or digital circuits, controllers, microprocessors, DSPs and/or ASICs, collectively referred to as a "processor" or "controller", which are respectively hard-wired, programmed, designed, adapted or configured to implement the methodology of the invention, including possibly in conjunction with a memory 125.

The memory 125, 325, which may include a data repository (or database), may be embodied in any number of forms, including within any computer or other machine-readable data storage medium, memory device or other storage or communication device for storage or communication of information, currently known or which becomes available in the future, including, but not limited to, a memory integrated circuit ("IC"), or memory portion of an integrated circuit (such as the resident memory within a processor 130 or processor IC), whether volatile or non-volatile, whether removable or non-removable, including without limitation RAM, FLASH, DRAM, SDRAM, SRAM, MRAM, FeRAM, ROM, EPROM or $E^2$PROM, or any other form of memory device, such as a magnetic hard drive, an optical drive, a magnetic disk or tape drive, a hard disk drive, other machine-readable storage or memory media such as a floppy disk, a CDROM, a CD-RW, digital versatile disk (DVD) or other optical memory, or any other type of memory, storage medium, or data storage apparatus or circuit, which is known or which becomes known, depending upon the selected embodiment. The memory 125, 325 may be adapted to store various look up tables, parameters, coefficients, other information and data, programs or instructions (of the software of the present invention), and other types of tables such as database tables.

As indicated above, the processor 110, 300 is hard-wired or programmed, using software and data structures of the invention, for example, to perform the methodology of the present invention. As a consequence, the system and related methods of the present invention, including the various instructions of the configuration memory 160, may be embodied as software which provides such programming or other instructions, such as a set of instructions and/or metadata embodied within a non-transitory computer readable medium, discussed above. In addition, metadata may also be utilized to define the various data structures of a look up table or a database. Such software may be in the form of source or object code, by way of example and without limitation. Source code further may be compiled into some form of instructions or object code (including assembly language instructions or configuration information). The software, source code or metadata of the present invention may be embodied as any type of code, such as C, C++, Matlab, SystemC, LISA, XML, Java, Brew, SQL and its variations (e.g., SQL 99 or proprietary versions of SQL), DB2, Oracle, or any other type of programming language which performs the functionality discussed herein, including various hardware definition or hardware modeling languages (e.g., Verilog, VHDL, RTL) and resulting database files (e.g., GDSII). As a consequence, a "construct", "program construct", "software construct" or "software", as used equivalently herein, means and refers to any programming language, of any kind, with any syntax or signatures, which provides or can be interpreted to provide the associated functionality or methodology specified (when instantiated or loaded into a processor or computer and executed, including the processor 110, 300, for example).

The software, metadata, or other source code of the present invention and any resulting bit file (object code, database, or look up table) may be embodied within any tangible, non-transitory storage medium, such as any of the computer or other machine-readable data storage media, as computer-readable instructions, data structures, program modules or other data, such as discussed above with respect to the memory 125, 325, e.g., a floppy disk, a CDROM, a CD-RW, a DVD, a magnetic hard drive, an optical drive, or any other type of data storage apparatus or medium, as mentioned above.

The communication interface(s) 130 are utilized for appropriate connection to a relevant channel, network or bus; for example, the communication interface(s) 130 may provide impedance matching, drivers and other functions for a wireline or wireless interface, may provide demodulation and analog to digital conversion for a wireless interface, and may provide a physical interface, respectively, for the processor 110, 300 and/or memory 125, with other devices. In general, the communication interface(s) 130 are used to receive and transmit data, depending upon the selected embodiment, such as program instructions, parameters, configuration information, control messages, data and other pertinent information.

The communication interface(s) 130 may be implemented as known or may become known in the art, to provide data communication between the HTF 200 and/or processor 110, 300 and any type of network or external device, such as wireless, optical, or wireline, and using any applicable standard (e.g., one of the various PCI, USB, RJ 45, Ethernet (Fast Ethernet, Gigabit Ethernet, 300ase-TX, 300ase-FX, etc.), IEEE 802.11, Bluetooth, WCDMA, WiFi, GSM, GPRS, EDGE, 3G and the other standards and systems mentioned above, for example and without limitation), and may include impedance matching capability, voltage translation for a low voltage processor to interface with a higher voltage control bus, wireline or wireless transceivers, and various switching mechanisms (e.g., transistors) to turn various lines or connectors on or off in response to signaling from processor 130. In addition, the communication interface(s) 130 may also be configured and/or adapted to receive and/or transmit signals externally to the system 100, such as through hard-wiring or RF or infrared signaling, for example, to receive information in real-time for output on a display, for example. The communication interface(s) 130 may provide connection to any type of bus or network structure or medium, using any selected architecture. By way of example and without limitation, such architectures include Industry Standard Architecture (ISA) bus, Enhanced ISA (EISA) bus, Micro Channel Architecture (MCA) bus, Peripheral Component Interconnect (PCI) bus, SAN bus, or any other communication or signaling medium, such as Ethernet, ISDN, T1, satellite, wireless, and so on.

The present disclosure is to be considered as an exemplification of the principles of the invention and is not intended to limit the invention to the specific embodiments illustrated. In this respect, it is to be understood that the invention is not limited in its application to the details of construction and to the arrangements of components set forth above and below, illustrated in the drawings, or as described in the examples. Systems, methods and apparatuses consistent with the present invention are capable of other embodiments and of being practiced and carried out in various ways.

Although the invention has been described with respect to specific embodiments thereof, these embodiments are merely illustrative and not restrictive of the invention. In the description herein, numerous specific details are provided, such as examples of electronic components, electronic and structural connections, materials, and structural variations, to provide a thorough understanding of embodiments of the present invention. One skilled in the relevant art will recognize, however, that an embodiment of the invention can be practiced without one or more of the specific details, or with other apparatus, systems, assemblies, components, materials, parts, etc. In other instances, well-known structures, materials, or operations are not specifically shown or described in detail to avoid obscuring aspects of embodiments of the present invention. In addition, the various Figures are not drawn to scale and should not be regarded as limiting.

Reference throughout this specification to "one embodiment", "an embodiment", or a specific "embodiment" means that a particular feature, structure, or characteristic described in connection with the embodiment is included in at least one embodiment of the present invention and not necessarily in all embodiments, and further, are not necessarily referring to the same embodiment. Furthermore, the particular features, structures, or characteristics of any specific embodiment of the present invention may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

For the recitation of numeric ranges herein, each intervening number there between with the same degree of precision is explicitly contemplated. For example, for the range of 6-9, the numbers 7 and 8 are contemplated in addition to 6 and 9, and for the range 6.0-7.0, the number 6.0, 6.1, 6.2, 6.3, 6.4, 6.5, 6.6, 6.7, 6.8, 6.9, and 7.0 are explicitly contemplated. In addition, every intervening sub-range within range is contemplated, in any combination, and is within the scope of the disclosure. For example, for the range of 5-10, the sub-ranges 5-6, 5-7, 5-8, 5-9, 6-7, 6-8, 6-9, 6-10, 7-8, 7-9, 7-10, 8-9, 8-10, and 9-10 are contemplated and within the scope of the disclosed range.

It will also be appreciated that one or more of the elements depicted in the Figures can also be implemented in a more separate or integrated manner, or even removed or rendered inoperable in certain cases, as may be useful in accordance with a particular application. Integrally formed combinations of components are also within the scope of the invention, particularly for embodiments in which a separation or combination of discrete components is unclear or indiscernible. In addition, use of the term "coupled" herein, including in its various forms such as "coupling" or "couplable", means and includes any direct or indirect electrical, structural or magnetic coupling, connection or attachment, or adaptation or capability for such a direct or indirect electrical, structural or magnetic coupling, connection or attachment, including integrally formed components and components which are coupled via or through another component.

With respect to signals, we refer herein to parameters that "represent" a given metric or are "representative" of a given metric, where a metric is a measure of a state of at least part of the regulator or its inputs or outputs. A parameter is considered to represent a metric if it is related to the metric directly enough that regulating the parameter will satisfactorily regulate the metric. A parameter may be considered to be an acceptable representation of a metric if it represents a multiple or fraction of the metric.

Furthermore, any signal arrows in the drawings/Figures should be considered only exemplary, and not limiting, unless otherwise specifically noted. Combinations of components of steps will also be considered within the scope of the present invention, particularly where the ability to separate or combine is unclear or foreseeable. The disjunctive term "or", as used herein and throughout the claims that follow, is generally intended to mean "and/or", having both conjunctive and disjunctive meanings (and is not confined to an "exclusive or" meaning), unless otherwise indicated. As used in the description herein and throughout the claims that follow, "a", "an", and "the" include plural references unless the context clearly dictates otherwise. Also as used in the description herein and throughout the claims that follow, the meaning of "in" includes "in" and "on" unless the context clearly dictates otherwise.

The foregoing description of illustrated embodiments of the present invention, including what is described in the summary or in the abstract, is not intended to be exhaustive or to limit the invention to the precise forms disclosed herein. From the foregoing, it will be observed that numerous variations, modifications and substitutions are intended and may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

It is claimed:

1. A configurable circuit, comprising:
    a configurable computation circuit;
    a plurality of synchronous network inputs coupled to the configurable computation circuit;
    a plurality of synchronous network outputs coupled to the configurable computation circuit; and
    a configuration memory circuit coupled to the configurable computation circuit, to the plurality of synchronous network inputs, and to the plurality of synchronous network outputs; and
    a control circuit coupled to the configurable computation circuit, the control circuit comprising:
    a plurality of control registers storing a completion table having a plurality of thread identifiers, having an identification of a first iteration, having an identification of a last iteration and for each thread identifier of the plurality of thread identifiers, having a corresponding data completion count and further having a next thread identifier identifying a next thread for execution or having the identification of the last iteration to provide ordered thread execution; and
    a thread control circuit adapted to self-schedule and queue a selected thread for execution when, for the thread identifier for the selected thread, the corresponding data completion count has decremented to zero to indicate completion of any data dependencies and the thread identifier for the selected thread is identified as the first iteration or identified as the next thread for execution.

2. The configurable circuit of claim 1, wherein the plurality of control registers further store, in the completion table, a loop count of an active number of loop threads.

3. The configurable circuit of claim 1, wherein the plurality of control registers further store, in the completion table, an iteration count.

4. The configurable circuit of claim 1, wherein the configuration memory circuit comprises:
    a first instruction memory storing a first plurality of data path configuration instructions to configure an internal data path of the configurable computation circuit; and
    a second instruction memory storing: a second plurality of configuration instructions or instruction indices for selection of a current data path configuration instruction of the first plurality of data path configuration instructions from the first instruction memory, for selection of a master synchronous network input of the plurality of synchronous network inputs for receipt of the current data path configuration instruction or instruction index from another, different configurable circuit, and for selection of a next data path configuration instruction or instruction index for output to the master synchronous network input of a next configurable circuit.

5. The configurable circuit of claim 4, wherein the configurable circuit further comprises:
    a conditional logic circuit coupled to the configurable computation circuit, wherein depending upon an output from the configurable computation circuit, the conditional logic circuit is adapted to provide conditional branching by modifying a first next data path configuration instruction or instruction index to form and output a different, second next data path configuration instruction or instruction index to the master synchronous input of the next configurable circuit.

6. The configurable circuit of claim 1, wherein the thread control circuit is adapted to self-schedule and queue a plurality of different threads for execution upon a predetermined cadence when, for the thread identifier of each selected thread of the plurality of different threads, of the plurality of thread identifiers, the corresponding data completion count indicates completion of any data dependencies.

7. The configurable circuit of claim 1, wherein the corresponding data completion count indicates a corresponding predetermined number of completion messages to be received, for each selected thread of the plurality of threads, prior to execution of the selected thread.

8. The configurable circuit of claim 1, wherein the plurality of control registers further store, in the completion table, a plurality of types of thread identifiers, with each type of thread identifier indicating a loop level for loop and nested loop execution.

9. The configurable circuit of claim 1, wherein the plurality of control registers further store, in the completion table, a loop count of an active number of loop threads, and wherein in response to receipt of an asynchronous fabric message returning a thread identifier to a thread identifier pool, the control circuit is further adapted to decrement the loop count and, when the loop count reaches zero, transmits an asynchronous fabric completion message.

10. The configurable circuit of claim 8, wherein the plurality of control registers further store a top of thread identifiers stack to allow each type of thread identifier access to private variables for a selected loop.

11. The configurable circuit of claim 1, wherein a first plurality of configurable circuits of an array of a plurality of configurable circuits are coupled in series in a first predetermined sequence through a synchronous network to form a first synchronous domain; and wherein a second plurality of configurable circuits of the array of a plurality of configurable circuits are coupled in series in a second predetermined sequence through the synchronous network to form a second synchronous domain.

12. The configurable circuit of claim 11, wherein the first synchronous domain is adapted to generate a continuation message to the second synchronous domain transmitted through an asynchronous packet network and wherein the second synchronous domain is adapted to generate a completion message to the first synchronous domain transmitted through the asynchronous packet network.

13. The configurable circuit of claim 1, wherein the thread control circuit further comprises:
  a run queue storing one or more thread identifiers for one or more threads which are ready to execute;
  a continuation queue storing one or more thread identifiers for threads having completion counts allowing execution or storing threads without an assigned thread identifier; and
  a reenter queue storing one or more thread identifiers for threads having completion counts allowing execution to provide for continuing execution of the threads in the reenter queue upon a predetermined cadence by moving the threads in the reenter queue into the run queue ahead of any threads in the continuation queue.

14. A plurality of configurable circuits arranged in an array, each configurable circuit, of the plurality of configurable circuits, comprising:
  a configurable computation circuit;
  a plurality of synchronous network inputs comprising a plurality of input registers;
  a plurality of synchronous network outputs comprising a plurality of output registers, the plurality of synchronous network outputs directly coupled through a synchronous network to the plurality of synchronous network inputs of adjacent configurable circuits of the array of the plurality of configurable circuits;
  a configuration memory circuit coupled to the configurable computation circuit, to the plurality of synchronous network inputs, and to the plurality of synchronous network outputs; and
  a control circuit coupled to the configurable computation circuit, the control circuit comprising:
  a plurality of control registers storing a completion table having an iteration count, having an identification of a first iteration, having an identification of a last iteration, having a plurality of thread identifiers and, for each thread identifier of the plurality of thread identifiers, having a corresponding data completion count and further having a next thread identifier identifying a next thread for execution or the identification of the last iteration; and
  a thread control circuit adapted to self-schedule and queue a selected thread for execution when, for the thread identifier for the selected thread, the corresponding data completion count has decremented to zero indicating completion of any data dependencies and the thread identifier for the selected thread is identified as the first iteration or identified as the next thread for execution.

15. The configurable circuit of claim 14, wherein the plurality of control registers further store, in the completion table, a plurality of types of thread identifiers, with each type of thread identifier indicating a loop level for loop and nested loop execution.

16. The configurable circuit of claim 14, wherein the plurality of control registers further store, in the completion table, a loop count of an active number of loop threads, and wherein in response to receipt of an asynchronous fabric message returning a thread identifier to a thread identifier pool, the control circuit is further adapted to decrement the loop count and, when the loop count reaches zero, to transmit an asynchronous fabric completion message.

17. The configurable circuit of claim 14, wherein the control circuit further comprises:
  a run queue storing one or more thread identifiers for one or more threads which are ready to execute;
  a continuation queue storing one or more thread identifiers for threads having completion counts allowing execution or storing threads without an assigned thread identifier; and
  a reenter queue storing one or more thread identifiers for computation threads having completion counts allowing execution to provide for continuing execution of the threads in the reenter queue by moving the threads in the reenter queue into the run queue ahead of any threads in the continuation queue.

18. A configurable circuit, comprising:
  a configurable computation circuit;
  a plurality of synchronous network inputs coupled to the configurable computation circuit;
  a plurality of synchronous network outputs coupled to the configurable computation circuit; and
  a configuration memory coupled to the configurable computation circuit, to the plurality of synchronous network inputs, and to the plurality of synchronous network outputs, the configuration memory comprising:
    a first instruction memory storing a first plurality of data path configuration instructions to configure a data path of the configurable computation circuit; and
    a second instruction memory storing a second plurality data path configuration instructions or instruction indices for selection of a master synchronous network input of the plurality of synchronous network inputs, for selection of a current data path configuration instruction from the first instruction memory for the configurable computation circuit, and for selection of a next data path configuration instruction or instruction index for a next configurable circuit; and
  a control circuit coupled to the configurable computation circuit, the control circuit comprising:
  a plurality of control registers storing a completion table having a plurality of thread identifiers, having an identification of a first iteration, having an identification of a last iteration, and for each thread identifier of the plurality of thread identifiers, having a corresponding data completion count and further having a next thread identifier identifying a next thread for execution or having an identification of a last iteration; and
  a thread control circuit adapted to self-schedule and queue a selected thread for execution when, for the thread identifier for the selected thread, the corresponding data completion count has decremented to zero indicating completion of any data dependencies and the thread identifier for the selected thread is identified as the first iteration or identified as the next thread for execution.

\* \* \* \* \*